(12) United States Patent
Mathieu et al.

(10) Patent No.: US 7,553,165 B2
(45) Date of Patent: Jun. 30, 2009

(54) SPRING INTERCONNECT STRUCTURES

(75) Inventors: Gaetan L. Mathieu, Livermore, CA (US); Benjamin N. Eldridge, Danville, CA (US); Gary W. Grube, Pleasanton, CA (US); Richard A. Larder, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/120,112

(22) Filed: May 13, 2008

(65) Prior Publication Data

US 2008/0254651 A1    Oct. 16, 2008

Related U.S. Application Data

(60) Division of application No. 10/750,355, filed on Dec. 29, 2003, now Pat. No. 7,371,072, which is a continuation of application No. 09/474,788, filed on Dec. 29, 1999, now Pat. No. 6,672,875, which is a continuation-in-part of application No. 09/205,023, filed on Dec. 2, 1998, now Pat. No. 6,255,126, and a continuation-in-part of application No. 09/205,022, filed on Dec. 2, 1998, now Pat. No. 6,268,015.

(51) Int. Cl.
*H01R 12/00* (2006.01)

(52) U.S. Cl. ........................................ 439/66
(58) Field of Classification Search ............... 439/66, 439/862, 81, 83, 515
See application file for complete search history.

(56) References Cited

U.S. PATENT DOCUMENTS

| 4,161,346 A | 7/1979 | Cherian et al. |
| 4,199,209 A | 4/1980 | Cherian |
| 4,312,117 A | 1/1982 | Robillard et al. |
| 4,362,353 A | 12/1982 | Cobaugh et al. |

(Continued)

FOREIGN PATENT DOCUMENTS

DE    19736674    11/1998

(Continued)

OTHER PUBLICATIONS

Kong et al., "Integrated Electrostatically Resonant Scan Tip For An Atomic Force Microscope," J. Vac. Sci. Technol. B 11(3), May/Jun. 1993.

(Continued)

*Primary Examiner*—Edwin A. Leon
(74) *Attorney, Agent, or Firm*—N. Kenneth Burraston

(57) ABSTRACT

An interconnection element of a spring (body) including a first resilient element with a first contact region and a second contact region and a first securing region and a second resilient element, with a third contact region and a second securing region. The second resilient element is coupled to the first resilient element through respective securing regions and positioned such that upon sufficient displacement of the first contact region toward the second resilient element, the second contact region will contact the third contact region. The interconnection, in one aspect, is of a size suitable for directly contacting a semiconductor device. A large substrate with a plurality of such interconnection elements can be used as a wafer-level contactor. The interconnection element, in another aspect, is of a size suitable for contacting a packaged semiconductor device, such as in an LGA package.

18 Claims, 35 Drawing Sheets

U.S. PATENT DOCUMENTS

| | | | |
|---|---|---|---|
| 4,548,451 | A | 10/1985 | Benarr et al. |
| 4,647,124 | A | 3/1987 | Kandybowski |
| 4,941,832 | A * | 7/1990 | Korsunsky et al. ............ 439/71 |
| 4,961,052 | A | 10/1990 | Tada |
| 5,017,738 | A | 5/1991 | Tsuji et al. |
| 5,032,896 | A | 7/1991 | Little et al. |
| 5,103,557 | A | 4/1992 | Leedy |
| 5,109,596 | A | 5/1992 | Driller et al. |
| 5,172,050 | A | 12/1992 | Swapp |
| 5,173,055 | A | 12/1992 | Grabbe |
| 5,177,438 | A | 1/1993 | Littlebury et al. |
| 5,210,939 | A | 5/1993 | Mallik et al. |
| 5,213,513 | A | 5/1993 | Brown et al. |
| 5,228,861 | A | 7/1993 | Grabbe |
| 5,286,208 | A | 2/1994 | Matsuoka |
| 5,308,252 | A | 5/1994 | Mroczkowski et al. |
| 5,308,443 | A | 5/1994 | Sugihara |
| 5,342,737 | A | 8/1994 | Georger, Jr. et al. |
| 5,354,712 | A | 10/1994 | Ho et al. |
| 5,366,380 | A | 11/1994 | Reymond |
| 5,437,556 | A | 8/1995 | Bargain et al. |
| 5,452,268 | A | 9/1995 | Bernstein |
| 5,462,440 | A | 10/1995 | Rothenberger |
| 5,465,611 | A | 11/1995 | Ruf et al. |
| 5,476,818 | A | 12/1995 | Yanof et al. |
| 5,513,430 | A | 5/1996 | Yanof et al. |
| 5,545,045 | A | 8/1996 | Wakamatsu |
| 5,573,435 | A | 11/1996 | Grabbe et al. |
| 5,599,194 | A | 2/1997 | Ozawa et al. |
| 5,606,128 | A | 2/1997 | Araki |
| 5,629,137 | A | 5/1997 | Leedy |
| 5,632,631 | A | 5/1997 | Fjelstad et al. |
| 5,666,190 | A | 9/1997 | Quate et al. |
| 5,723,894 | A | 3/1998 | Ueno et al. |
| 5,759,014 | A | 6/1998 | Van Lintel |
| 5,786,270 | A | 7/1998 | Gorrell et al. |
| 5,828,226 | A | 10/1998 | Higgins et al. |
| 5,829,128 | A | 11/1998 | Eldridge et al. |
| 5,966,587 | A | 10/1999 | Karavakis et al. |
| 6,001,663 | A | 12/1999 | Ling et al. |
| 6,007,349 | A | 12/1999 | Distefano et al. |
| 6,031,282 | A | 2/2000 | Jones et al. |
| 6,059,982 | A | 5/2000 | Palagonia et al. |
| 6,080,596 | A | 6/2000 | Vindasius et al. |
| 6,083,059 | A | 7/2000 | Kuan |
| 6,114,221 | A | 9/2000 | Tonti et al. |
| 6,117,694 | A | 9/2000 | Smith et al. |
| 6,174,744 | B1 | 1/2001 | Watanabe et al. |
| 6,184,053 | B1 | 2/2001 | Eldridge et al. |
| 6,190,193 | B1 | 2/2001 | Wagner |
| 6,255,126 | B1 | 7/2001 | Mathieu et al. |
| 6,264,477 | B1 | 7/2001 | Smith et al. |
| 6,268,015 | B1 | 7/2001 | Mathieu et al. |
| 6,491,968 | B1 | 12/2002 | Mathieu et al. |
| 6,520,778 | B1 | 2/2003 | Eldridge et al. |
| 6,616,966 | B2 | 9/2003 | Mathieu et al. |
| 6,672,875 | B1 | 1/2004 | Mathieu et al. |
| 6,791,176 | B2 | 9/2004 | Mathieu et al. |
| 6,807,734 | B2 | 10/2004 | Eldridge et al. |
| 7,287,322 | B2 | 10/2007 | Mathieu et al. |
| 7,371,072 | B2 | 5/2008 | Mathieu et al. |
| 2004/0072452 | A1 | 4/2004 | Eldridge et al. |
| 2008/0115353 | A1 | 5/2008 | Mathieu et al. |

FOREIGN PATENT DOCUMENTS

| | | |
|---|---|---|
| EP | 413042 | 2/1991 |
| FR | 2587549 | 3/1987 |
| GB | 1446196 | 8/1976 |
| JP | 60-025073 | 2/1985 |
| JP | 04-214650 | 8/1992 |
| JP | 05-218156 | 8/1993 |
| JP | 06-018555 | 1/1994 |
| JP | 07-333232 | 12/1995 |
| WO | WO 96/02068 | 1/1996 |
| WO | WO 96/37332 | 11/1996 |
| WO | WO 98/52224 | 11/1998 |

OTHER PUBLICATIONS

Leung et al., "Active Substrate Membrane Probe Card," Technical Digest of the International Electron Devices Meeting (IEDM) (Oct. 12, 1995), pp. 709-712.

* cited by examiner

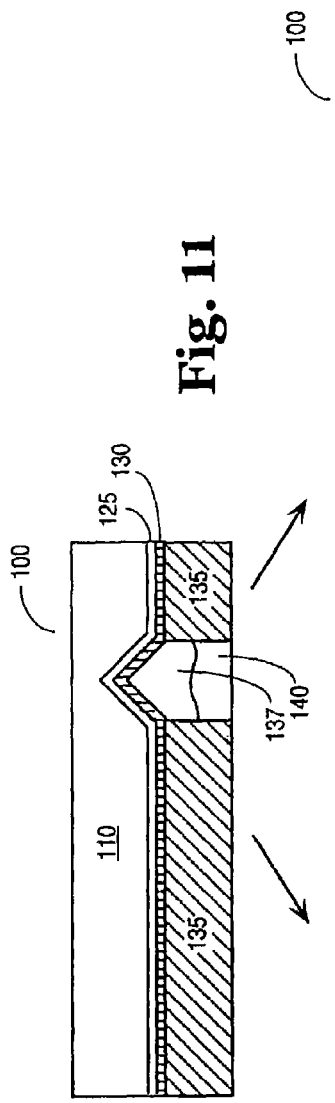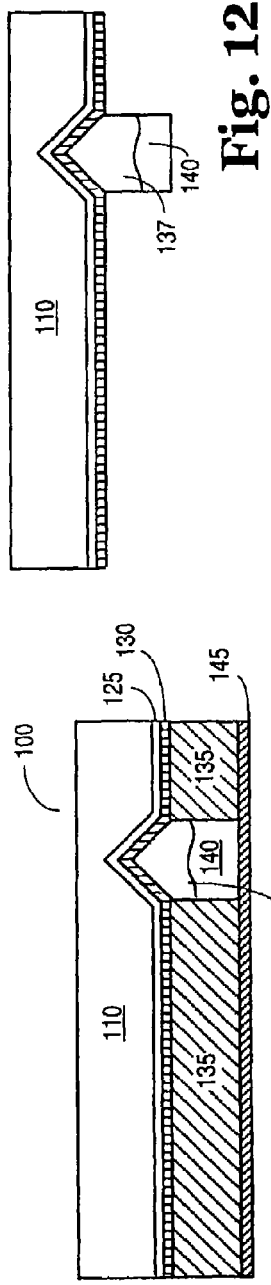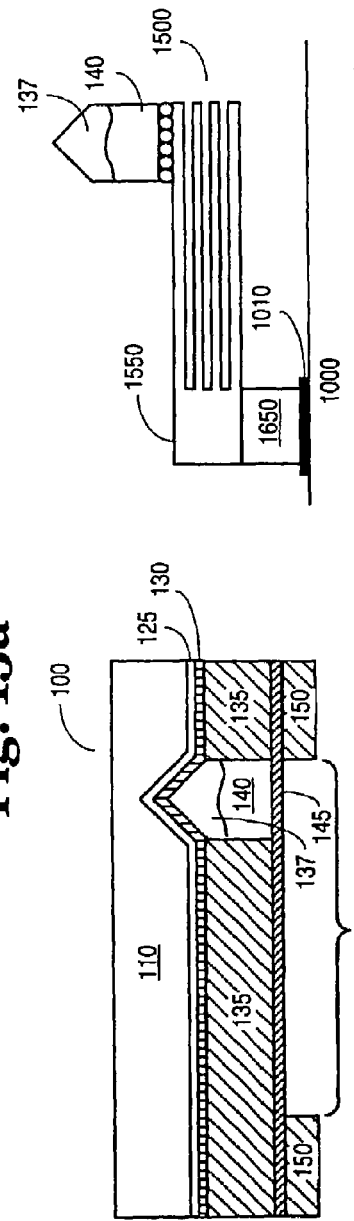

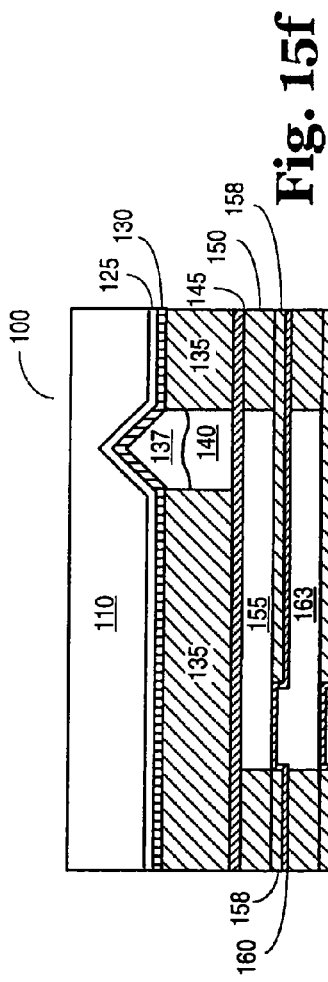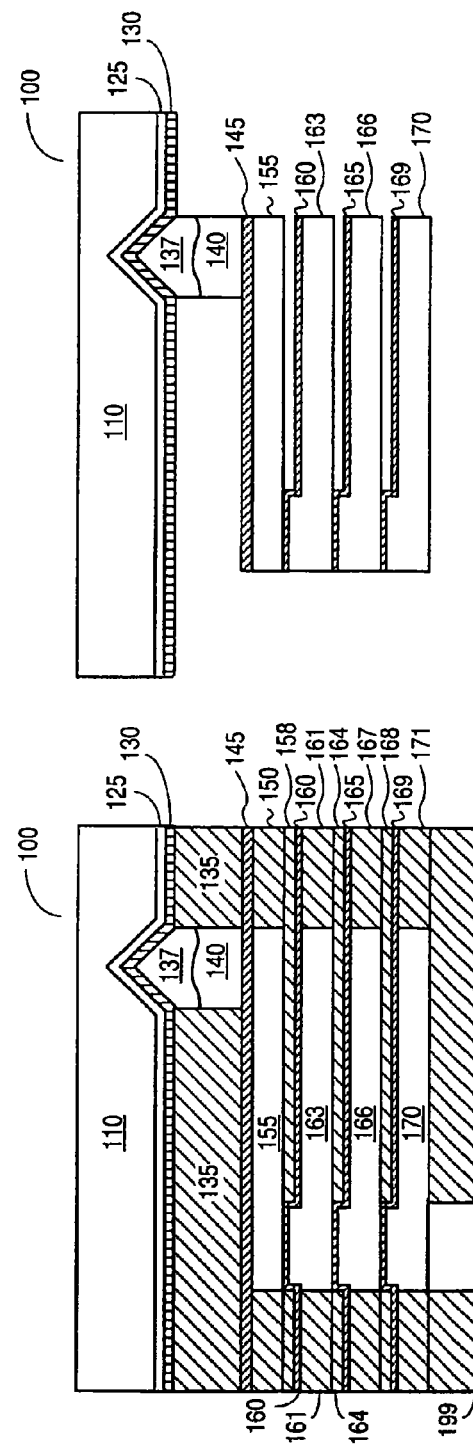

SPRING INTERCONNECT STRUCTURES

RELATED APPLICATIONS

This application is continuation-in-part of patent application Ser. No. 09/205,022 filed Dec. 2, 1998 entitled "Lithographic Contact Elements," and patent application Ser. No. 09/205,023 filed Dec. 2, 1998 entitled "Lithographic Contact Elements."

BACKGROUND OF THE INVENTION

1. Field of the Invention

The invention relates to an interconnection (contact) element suitable for effecting pressure connections between electronic components and is particularly useful for contacting semiconductor packages or for contacting a semiconductor directly.

2. Description of Related Art

Interconnection or contact elements may be used to connect devices of an electronic component or one electronic component to another electronic component. For example, an interconnection element may be used to connect two circuits of an integrated circuit chip or including an application specific integrated circuit (ASIC). Interconnection elements may also be used to connect the integrated circuit chip to a chip package suitable for mounting on a printed circuit board of a computer or other electronic device. Interconnection elements may further be used to connect the integrated circuit chip to a test device such as a probe card assembly or other printed circuit board (PCB) to test the chip.

Generally, interconnection or contact elements between electronic components can be classified into at least the two broad categories of "relatively permanent" and "readily demountable."

An example of a "relatively permanent" interconnection element is a wire bond. Once two electronic components are connected to one another by a bonding of an interconnection element to each electronic component, a process of unbending must be used to separate the components. A wire bond interconnection element, such as between an integrated circuit chip or die and inner leads of a chip or package (or inner ends of lead frame fingers) typically utilizes a "relatively permanent" interconnection element.

One example of a "readily demountable" interconnection element is the interconnection element between rigid pins of one electronic component received by resilient socket elements of another electronic component, for example, a spring-loaded LGA socket or a zero-insertion force socket. A second type of a "readily demountable" interconnection element is an interconnection element that itself is resilient or spring-like or mounted in or on a spring or resilient medium. An example of such an interconnection element is a tungsten needle of a probe card component. The interconnection element of a probe card component is typically intended to effect a temporary pressure connection between an electronic component to which the interconnection element is mounted and terminals of a second electronic component, such as a semiconductor device under test.

With regard to spring interconnection elements, generally, a minimum contact force is desired to effect reliable pressure contact to an electronic component (e.g., to terminals of an electronic component). For example, a contact (load) force of approximately 15 grams (including as little as 2 grams or less and as much as 150 grams or more, per terminal) may be desired to effect a reliable electrical pressure connection to a terminal of an electronic component.

A second factor of interest with regard to spring interconnection elements is the shape and metallurgy of the portion of the interconnection element making pressure connection to the terminal of the electronic component. With respect to the tungsten needle as a spring interconnection element, for example, the contact end is limited by the metallurgy of the element (i.e., tungsten) and, as the tungsten needle becomes smaller in diameter, it becomes commensurately more difficult to control or establish a desired shape at the contact end.

In certain instances, spring interconnection elements themselves are not resilient, but rather are supported by a resilient membrane. Membrane probes exemplify this situation, where a plurality of microbumps are disposed on a resilient membrane. Again, the technology required to manufacture such interconnection elements limits the design choices for the shape and metallurgy of the contact portion of the interconnection elements.

Commonly-owned U.S. patent application Ser. No. 08/152,812 filed Nov. 16, 1993 (now U.S. Pat. No. 5,476,211, issued Dec. 19, 1995), and its counterpart commonly-owned co-pending "divisional" U.S. patent application Ser. No. 08/457,479 filed Jun. 1, 1995, U.S. patent application Ser. No. 08/570,230 and U.S. patent application Ser. No. 09/245,499, filed Feb. 5, 1999, by Khandros, disclose methods for making spring interconnection elements. In a preferred embodiment, these spring interconnection elements, which are particularly useful for micro-electronic applications, involve mounting an end of a flexible elongate element (e.g., wire "stem" or "skeleton") to a terminal on an electronic component, coating the flexible element and adjacent surface of the terminal with a "shell" of one or more materials. One of skill in the art can select a combination of thickness, yield strength, and elastic modulus of the flexible element and shell materials to provide satisfactory force-to-deflection characteristics of the resulting spring interconnection elements. Exemplary materials for the core element include gold. Exemplary materials for the coating include nickel and its alloys. The resulting spring interconnection element is suitably used to effect pressure, or demountable, interconnections between two or more electronic components, including semiconductor devices.

Commonly-owned, co-pending U.S. patent application Ser. No. 08/340,144, filed Nov. 15, 1994 and its corresponding PCT Patent Application No. PCT/US94/13373, filed Nov. 16, 1994 (WO95/14314, published May 16, 1995), both by Khandros and Mathieu, disclose a number of applications for the aforementioned spring interconnection elements, and also disclose techniques for fabricating tip structures at the ends of the interconnection elements. For example, a plurality of negative projections or holes, which may be in the form of inverted pyramids ending in apexes, are formed in the surface of a sacrificial layer (substrate). These holes are then filled with a contact structure comprising layers of material such as gold or rhodium and nickel. A flexible elongate element is mounted to the resulting tip structure and can be overcoated in the manner described hereinabove. In a final step, the sacrificial substrate is removed. The resulting spring interconnection element has a tip structure having controlled geometry (e.g., a sharp point) at its free end.

Commonly-owned, co-pending U.S. patent application Ser. No. 08/452,255, filed May 26, 1995 and its corresponding PCT Patent Application No. PCT/US95/14909, filed Nov. 13, 1995 (WO96/17278, published Jun. 6, 1996), both by Eldridge, Grube, Khandros and Mathieu, disclose additional techniques and metallurgies for fabricating tip structures on sacrificial substrates, as well as techniques for transferring a plurality of interconnection elements mounted thereto, en masse, to terminals of an electronic component.

Commonly-owned, co-pending U.S. patent application Ser. No. 08/788,740, filed Jan. 24, 1997 and its corresponding PCT Patent Application No. PCT/US96/08107, filed May 24, 1996 (WO96/37332, published Nov. 28, 1996), both by Eldridge, Khandros and Mathieu, disclose techniques whereby a plurality of tip structures are joined to a corresponding plurality of elongate interconnection elements that are already mounted to an electronic component. Also disclosed are techniques for fabricating "elongate" tip structures in the form of cantilevers. The cantilever tip structures can be tapered, between one end thereof and an opposite end thereof. The cantilever tip structures are suitable for mounting to already-existing (i.e., previously fabricated) raised interconnection elements extending (e.g., free-standing) from corresponding terminals of an electronic component.

Commonly-owned, co-pending U.S. patent application Ser. No. 08/819,464, filed Mar. 17, 1997, by Eldridge, Khandros and Mathieu, representatively discloses a technique whereby a plurality of elongate interconnection elements having different lengths than one another can be arranged so that their outer ends are disposed at a greater pitch than their inner ends. The inner, "contact" ends may be collinear with one another, for effecting connections to electronic components having terminals disposed along a line, such as a center line of the component.

As electronic components get increasingly smaller and the spacing between terminals on the electronic components get increasingly tighter or the pitch gets increasingly finer, it becomes increasingly more difficult to fabricate interconnections including spring interconnection elements suitable for making electrical connection to terminals of an electronic component. Co-pending and commonly-owned U.S. patent application Ser. No. 08/802,054, titled "Microelectronic Contact Structure, and Method of Making Same," discloses a method of making spring interconnection elements through lithographic techniques. In one embodiment, that application discloses forming a spring interconnection element (including a spring interconnection element that is a cantilever beam) on a sacrificial substrate and then transferring and mounting the interconnection element to a terminal on an electronic component. In that disclosure, the spring interconnection element is formed in the substrate itself through etching techniques. In co-pending, commonly-owned U.S. patent application Ser. No. 08/852,152, titled "Microelectronic Spring Contact Elements," spring interconnection elements are formed on a substrate, including a substrate that is an electronic component, by depositing and patterning a plurality of masking layers to form an opening corresponding to a shape embodied for the spring interconnection element, depositing conductive material in the opening made by the patterned masking layers, and removing the masking layer to form the free-standing spring interconnection element.

Co-pending and commonly-owned U.S. patent application Ser. No. 09/023,859, titled "Microelectronic Contact Structures and Methods of Making Same," describes an interconnection element having a base end portion (post component), a body portion (beam component) and a contact end portion (tip component) and methods separately forming each portion and joining the post portion together as desired on an electronic component.

Co-pending and commonly-owned U.S. patent application Ser. No. 09/107,924 and its parent, U.S. Pat. No. 5,772,451 issued Jun. 30, 1998, both entitled "Sockets for Electronic Components and Methods of Connecting to Electronic Components," show a socketing device for mating to a packaged semiconductor.

What is needed is a method of fabricating interconnection elements suitable for present fine-pitch electrical connections that is scalable for future technologies. Also needed are improved methods of making interconnection elements, particularly methods that are repeatable, consistent, and inexpensive.

SUMMARY OF THE INVENTION

An interconnection element is disclosed. In one embodiment, the interconnection element comprises a spring (body) comprising a first resilient element with a first contact region and a second contact region and a first securing region, and a second resilient element with a third contact region and a second securing region. The second resilient element is coupled to the first resilient element through respective securing regions. The second resilient element is positioned such that upon sufficient displacement of the first contact region toward the second resilient element, the second contact region will contact the third contact region.

The interconnection element of the invention is suitable for making either temporary or permanent electrical connection between terminals of an electronic component such as a PCB and a semiconductor chip. For making temporary connection, the electronic component interconnection element of the invention may be coupled to a substrate such as an electronic component and the electronic component may be brought together with another electronic component so that the one end of the interconnection element is in pressure contact with contact pad or a terminal of the other electronic component. The interconnection element reacts resiliently to maintain contact pressure and an electrical connection between the two components. For making a permanent connection, the electronic component upon which the interconnection element is coupled may be brought together with another electronic component and an attachment element of the interconnection element is joined or bonded, such as by soldering, welding, or brazing or with a conductive adhesive, to a terminal of the other electronic component. In one embodiment, the interconnection element is compliant and may accommodate differential thermal expansion between the two electronic components.

By fabricating a body of the interconnection element with a plurality of resilient elements, the mechanical properties of the interconnection element are improved over single beam spring interconnection elements, particularly in fine pitch spacing ranges of current and future technologies of contacts or terminals of an integrated circuit. This is useful for mating to a packaged semiconductor as in a socket for an LGA or BGA packaged device. This also is useful for mating directly to a semiconductor as in a chip-scale packaging application. In addition, this is useful for other chip-scale contacts such as probing a semiconductor device on a wafer. For example, the multiple resilient element (e.g., multiple-leaf) body of the interconnection element of the invention offers improved mechanical properties such as a higher spring constant, improved compliance, and lower material stress over similarly sized single beam spring interconnection elements in sub-micron applications.

An electronic component is also disclosed. In one aspect, the electronic component comprises a plurality of interconnection elements, coupled to a substrate and configured in a relation to contact an array of contact pads of a chip-scale device, each interconnection element comprising a first resilient element and second resilient element. The first resilient element includes a first and second contact region and a securing region. The second resilient element includes a third contact region and is coupled to the first resilient element through respective securing regions. The second resilient element is positioned such that upon sufficient displacement of the first contact region towards the second resilient element, the second contact region will contact the third contact region. The plurality of interconnection elements are arranged, for example, in an array to accommodate the connection or coupling of the interconnection elements with, for example, corresponding contact pads or terminals of a second electronic component.

An electronic component according to the invention is particularly suitable for making temporary or permanent electrical connection with a second electronic component having "fine-pitch" contact pads or terminals, for example, spacing of at least less than 5 mils (130 µm), such as 2.5 mils (65 µm). As will be evident from the description that follows, minimized pitch between interconnection elements of an electronic component of the invention is achieved in part by modifying the thickness of the body or spring portion of the interconnection element of the electronic component. Instead of a single beam body, the interconnection elements of the electronic component are comprised of a plurality of resilient elements to improve the mechanical properties of each interconnection element. A desired spring constant of multiple, coordinated springs reinforce and support the primary spring and interconnection element (e.g., tip). A leaf portion body also improves the compliance of the body at a reduced material stress. Applications to larger scale devices, including, for example, devices with contact pitches of about 50-100 mil (1.3-2.6 mm) and even larger are feasible as well.

Other embodiments, features, and advantages of the invention will become apparent in light of the following description thereof.

BRIEF DESCRIPTION OF THE DRAWINGS

The features, aspects, and advantages of the invention will become more thoroughly apparent from the following detailed description, appended claims, and accompanying drawings in which:

FIG. 11 shows the structure of FIG. 7 after planarizing the first masking material layer and the second tip material.

FIG. 12(a) shows the structure of FIG. 7 after removing the first masking material layer in accordance with one aspect of an embodiment of the invention.

FIG. 12(b) shows the tip portion of FIG. 12(a) after affixing the fabricated tip structure to a spring of a separately fabricated interconnection element in accordance with one aspect of an embodiment of the invention.

FIG. 13(a) shows the structure of FIG. 7 after depositing an adhesion/seed material over a portion of the planarized surface in accordance with a second aspect of an embodiment of the invention.

FIG. 13(b) shows the structure of FIG. 7 after patterning a second masking material layer over the substrate having an opening aligned to the tip, the opening extending laterally and/or transversely over the substrate from the tip in accordance with a second aspect of an embodiment of the invention.

FIG. 15(f) shows the structure of FIG. 7 after depositing and patterning additional masking material layers, seed materials, and conductive materials to form two additional leaf portions in accordance with a fourth aspect of an embodiment of the invention.

FIG. 16(a) shows the structure of FIG. 7 after removing the masking material layers to form an interconnection element including a spring having four leaf portions and a tip structure in accordance with a fifth aspect of an embodiment of the invention.

FIG. 17(a) shows the structure of FIG. 7 after depositing a post masking material layer over the surface of the substrate and forming an opening to the seed material in accordance with a sixth aspect of an embodiment of the invention.

DETAILED DESCRIPTION OF THE INVENTION

Figure 1:
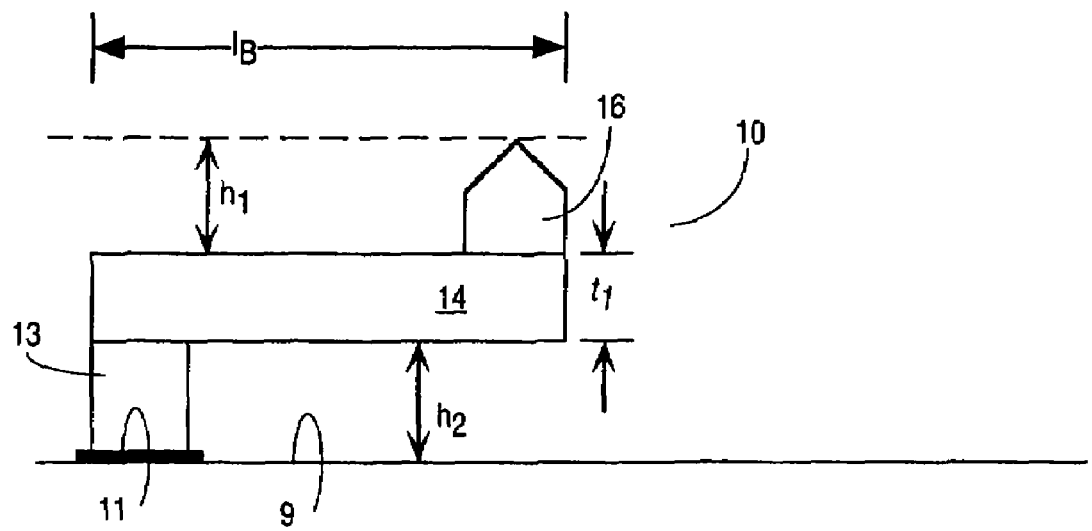
FIG. 1 is a cross-sectional side view of an example of an interconnection element having a single beam spring coupled to an electronic component.

The invention relates to interconnection elements, including contact elements. According to one aspect of the invention, the invention contemplates a method of forming an interconnection element having a body including a plurality of resilient or flexural elements, e.g., leaf portions. The invention also relates to a method of bringing together two substrates, such as an electronic component having a plurality of interconnection elements with a second electronic component having an array of contact pads or terminals.

Suitable electronic components include, but are not limited to, an active semiconductor device, a memory chip, a portion of a semiconductor wafer, a ceramic substrate, an organic substrate, a PCB, an organic membrane, a polyimide sheet, a space transformer, a probe card, a chip carrier, and a socket. The electronic component may be an active device or a passive device that supports one or more electronic connections. In general, suitable electronic components include, but are not limited to, devices comprising an integrated circuit having at least two contacts or terminals providing electrical access to the circuit. Such a device is representatively demonstrated by an integrated circuit chip (or microchip) having a plurality of exposed contacts or terminals providing access to the integrated circuit of the device.

The interconnection element or elements of the invention may be fabricated on or independent of the electronic component to which it is or they are joined. In the case of independent fabrication, the invention contemplates that the interconnection element or elements can be fabricated with a shape, size, and metallurgy that are not limited by the materials and layout considerations associated with the manufacture of the electronic component. Independent fabrication also avoids the exposure of the electronic component to the process conditions associated with forming the interconnection element.

Disposed on an electronic component such as a space transformer of a probe card assembly, the interconnection elements of the invention are designed to accommodate contact pads or terminals of electronic components having very small pitch or spacing tolerances. In one embodiment, the interconnection elements adopt alternating orientation (e.g., left-right-left-right) so as to achieve a greater pitch between their post portion than at the tip portion. In another embodiment, the interconnection elements adopt alternating lengths (e.g., short-long-short-long) so as to achieve a greater pitch between the post portion than at the tip portion of adjacent interconnection elements. Similarly, alternating interconnection elements can be fabricated to have a greater pitch at their tip portions than their post portions. In summary, the interconnection elements, whether fabricated on or independent of the electronic component to which they are joined may adopt a variety of orientations to accommodate various configurations associated with the electronic components which they connect.

Figure 2:
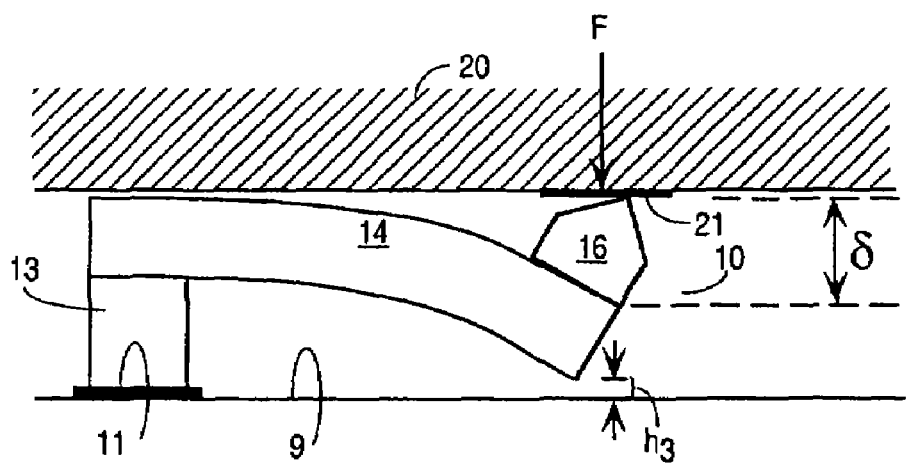
FIG. 2 shows the interconnection element of FIG. 1 in contact with a second electronic component.

FIG. 1 and FIG. 2 illustrate one embodiment of a spring interconnection element. Methods of formation of such a spring interconnection element are described in detail in application Ser. No. 09/205,023 entitled "Lithographic Contact Elements." FIG. 1 shows interconnection element 10 comprising post 13, beam or body 14, and tip structure 16. Post 13 is disposed on terminal 11 of electronic component 9. Post 13 has a height, $h_2$. Body 14 is coupled at one end to post 13. For consistency, in the discussion that follows the end of an elongate beam body that is coupled to the post will be referred to as the proximal end. Of course, one of skill in the art will recognize that when discussing a body structure that is a beam or a plurality of beams or leaf portions, elements need not be positioned at ends of the beam.

In one embodiment shown in FIG. 1, body 14 is a single beam having a thickness equivalent to a height, $t_1$, and length, $l_B$. At the other end of body 14 (e.g., the distal end) and coupled to a side opposite post 13 is contact or tip structure 16. Tip structure 16 has a height, $h_1$, from the surface of body 14.

FIG. 2 shows interconnection element 10 under load such as when accommodating a substrate under test. In this case, substrate 20 having terminal 21 is brought into contact with interconnection element 10 and an inferiorly-directed (e.g., downward) force, F, is applied at tip structure 16 of interconnection element 10 to deflect interconnection element 10 at its distal end towards electronic component 9. FIG. 2 shows deflected interconnection element 10 separated from electronic component 9 at its distal end by a height, $h_3$.

Under load, such as when contacting substrate 20, body 14 of interconnection element 10 deflects by an amount represented in FIG. 2 by δ. A spring constant, k, may be calculated for this deflection as follows:

$k=F/\delta.$

Controlling the spring constant for each interconnection element of an electronic component, such as in a probe card assembly, allows a consistent contact force to be applied to each terminal, such as terminal 21 of a substrate under test (such as substrate 20). Hundreds to thousands of interconnection elements may be utilized in a probing operation and many tens of thousands in a wafer-scale contactor. Thus, consistent spring force is particularly significant.

Decreasing device sizes allows a corresponding increase in contact or terminal density. In order for interconnection elements on a second electronic component to accommodate the increased array density by a corresponding interconnection element array on the second electronic component, the interconnection element array must correspondingly become more dense. One way to increase the density of an interconnection element array on an electronic component is to reduce the size of the individual interconnection elements. Thus, an interconnection element, such as interconnection element 10 of FIG. 1, may be reduced in its length, $l_B$, and its width (not shown) to permit a greater density (e.g., smaller pitch) array on an electronic component (e.g., increase the number of interconnection elements that occupy a given space).

Reduction in the length and width of a particular interconnection element (e.g., reduction in the surface area of the interconnection element) affects the mechanical properties of the interconnection element. For example, the spring constant of a resilient interconnection element, k, is directly related to the geometry (e.g., length, width, and thickness) of the interconnection element. Thus, reduction in thickness for a given length and width beam, correspondingly reduces the spring constant of the interconnection element (k ∝ thickness$^3$). A reduction of the spring constant generally reduces the amount of load or force that may be applied to interconnection elements for a given deflection. Similarly, a reduction in the width of an interconnection element for a given length and thickness, correspondingly reduces the spring constant of the interconnection element (k ∝ width), as does a reduction in length for a given width and thickness (k ∝ length$^{-3}$).

In certain situations, it may be desirous to reduce the size of an interconnection element without reducing the amount of load or force desired to be applied to the interconnection element. In order to accommodate an acceptable force, for example, on an interconnection element having a substantially rectangular beam in a high density interconnection element array, the thickness of the body of an interconnection element may be increased. In FIG. 1, for example, the thickness of body 14, $t_1$, may be increased to account for a decreased length, $l_B$, and width. However, increasing the thickness of the body generally increases the stress of the body. Increasing the stress of a body decreases the longevity or number of compression cycles to failure of the interconnection element.

The stress of a particular body material is generally a measurement of the deformation of the material under a force or load. In general, a material may withstand a certain amount of stress in which the deformation is reversible. Beyond this point, the deformation reversibility decreases to a point of "permanent set" corresponding to the yield stress of the material. The yield stress is material dependent. In general, in spring applications such as representatively described for the interconnection element of the invention, the maximum stress on an interconnection element material is designed to be less than about one-half the 0.2 percent offset yield stress of the material for maximum longevity of operation.

The interconnection element of the invention addresses an objective of increasing the density of interconnection elements on an electronic component by adjusting the thickness of each interconnection element, assuming that the length and width are set to a predetermined maximum permitted by the geometry. In this manner, an increase in the density of interconnection elements on an electronic component may be achieved without a corresponding reduction in spring constant or a reduction in the acceptable load or force applied to the interconnection elements. The increased thickness of the portion of the interconnection element of the invention may also be achieved without a reduction in the allowable maximum stress on the material.

Figure 3:
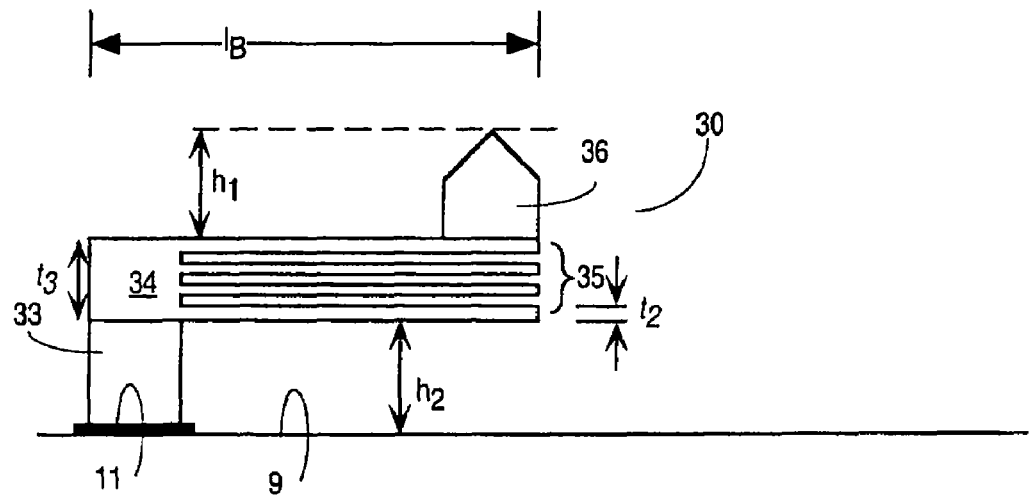
FIG. 3 is a cross-sectional side view of an example of an interconnection element having a spring of multiple leaf portions coupled to an electronic component.
Figure 4:
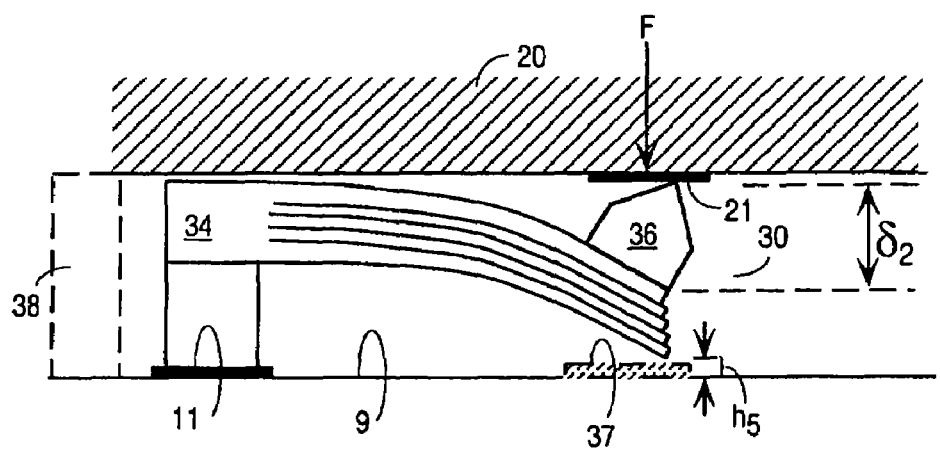
FIG. 4 shows the interconnection element of FIG. 3 in contact with a second electronic component.

FIG. 3 and FIG. 4 illustrate one embodiment of an interconnection element of the invention. FIG. 3 shows interconnection element 30 comprising post 33, body 34, and contact or tip structure 36. Post 33 is disposed as a first attachment element on terminal 11 of electronic component 9. Post 33 has a height, $h_2$, over substrate 9. Body 34 is coupled at one end of post 33. Body 34 includes a plurality (in this case, four) flexural elements or leaf portions 35 each having a thickness or height, $t_2$, that collectively define a width (not shown), a thickness or height, $t_3$ and length, $l_B$. The superiorly-located leaf portion 35 defines a superior surface for body 34 to which tip structure 36, as a second attachment element, is coupled. Tip structure 36 has a height, $h_1$, from the superior surface of spring 34. In this embodiment, tip structure 36 is coupled to body 14 at an end opposite post 13. Again, it is to be appreciated that this configuration is only illustrative.

FIG. 4 shows interconnection element 30 under load such as when accommodating a substrate under test. In this case, substrate 20 having terminal 21 is brought into contact with interconnection element 30 through an inferiorly-directed force, F, applied at tip structure 36 of interconnection element 30 to deflect interconnection element 30. The deflection, $\delta_2$, of interconnection element 30 causes tip structure 36 to "wipe" contact pad or terminal 21 in a lateral direction as the interconnection element deflects. This wiping action serves, in one sense, to improve the connection between tip structure 36 and contact pad or terminal 21 by cutting through debris or build-up on the contact or terminal.

In one embodiment, the height of the post, $h_2$, is greater than the height of the tip structure, $h_1$, so that post 33 determines the over-travel or deflection distance of body 34. A suitable over-travel or deflection distance according to current technologies is 2-8 mils (50-200 microns). As shown in FIG. 4, electronic component 20 "bottoms-out" on the superior surface of body 34. In this configuration, the superior surface of body 34 may be coated with an insulative layer to limit possible errant currents.

Other alternatives for limiting the over-travel or deflection distance of the interconnection element of the invention are also suitable. For example, the height of tip structure, $h_1$, can be greater than the height of the post, $h_2$. In this situation, electronic component 20 will not bottom-out on the superior surface of body 34. To protect the distal end of the inferiorly-located leaf portion of body 34 from contacting the surface of electronic component 9, travel stop 37 (indicated in dotted lines) may be added. Alternatively, post stop 38 (also indicated in dotted lines) may be fabricated to a predetermined height adjacent interconnection element 30 to limit the superiorly-directed advancement of electronic component 20. Alternative travel stop 37 and post stop 38, respectively, are, in one aspect, comprised of an insulating material.

Figure 5:
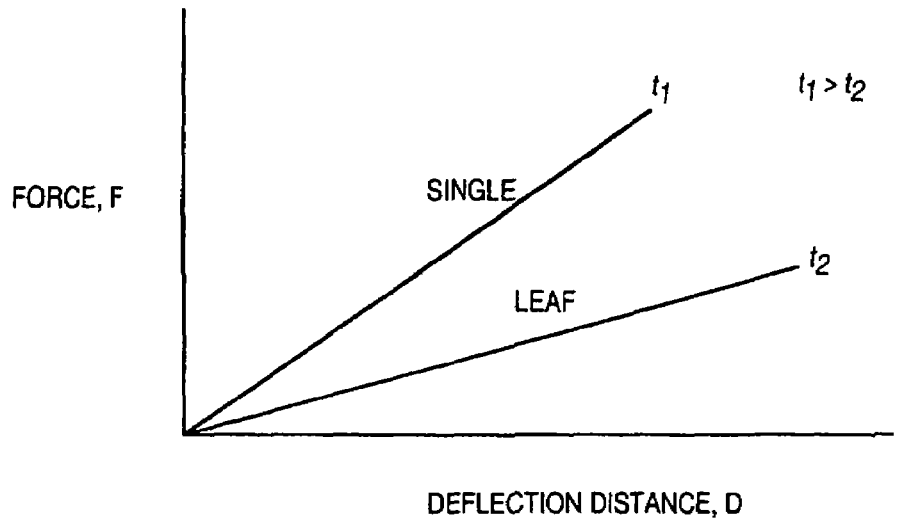
FIG. 5 is a graphical representation of the force applied to a single-beam interconnection element and a leaf-portioned interconnection element, respectively, versus deflection distance of the interconnection element.
Figure 6:
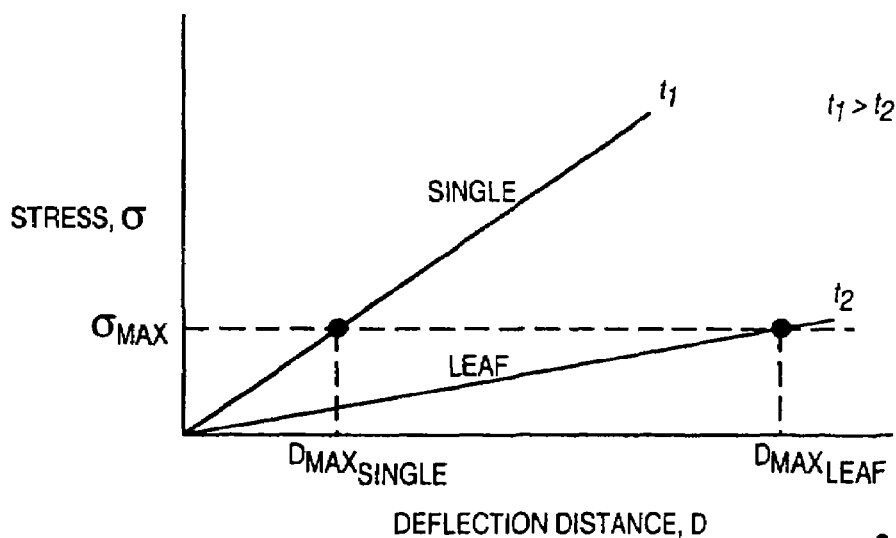
FIG. 6 shows the material stress for a single-beamed interconnection element and a leaf-portioned interconnection element, respectively, versus deflection distance of the interconnection element.

FIG. 5 and FIG. 6 graphically compare the force and stress of a single beam body and a leaf portion body interconnection element according to the invention. FIG. 5 shows that the amount of force to deflect a body is greater for a single beam structure having a thickness $t_1$ such as shown in FIG. 1 as compared to a single leaf portion having a thickness $t_2$ shown, for example, in FIG. 3 provided the thicknesses are set as shown.

FIG. 6 shows a graphical representation of the stress of a material for a single beam body and a leaf portion of, for example, a multiple-leaf body of an interconnection element according to the invention. FIG. 6 shows that for a given deflection distance, corresponding, for example, to a contact force shown in FIG. 5, the stress on a body material, $\sigma$, is greater for a single beam of thickness, $t_1$, than a leaf portion of thickness, $t_2$, of a multiple-leaf body. In order to remain below the maximum stress, $\sigma_{max}$, the deflection distance of the single beam body must be limited. Increasing the thickness of the single beam further limits the deflection distance even more.

In general, in the example of an interconnection element having a rectangular body or spring such as shown in FIG. 1 (single beam) and FIG. 3 (multiple leaf), the spring constant of an interconnection element is directly related to the thickness of the interconnection element. Thus, reducing the thickness of a body portion of an interconnection element reduces the spring constant ($k_{leaf} < k_{beam}$) which correspondingly reduces the contact force required to deflect the interconnection element a predetermined distance. In order to achieve a desired spring constant of, for example, the spring constant of the beam, $k_{beam}$, multiple (n) leaf portions each having a thickness, $t_2$, are combined such that $n \cdot k_{leaf} \approx k_{beam}$. It is to be appreciated that the spring constant of an interconnection element, including a multiple leaf interconnection element described in the invention will vary with the application (e.g., the length of the beam spring, interconnection material, the desired deflection distance, etc.).

As shown in FIG. 6, the stress on a single leaf portion of, for example, a multiple-leaf body (the multiple-leaf body collectively having a similar material thickness to a single beam) is much less for a given deflection distance (e.g., a given amount of force) as compared to the single beam body. Accordingly, a single leaf portion may have a much greater compliance and be subjected to a much greater deflection than a single beam body of equivalent spring constant and remain below the maximum stress of the material. Thus, in designing an interconnection element according to the invention, the thickness of each leaf portion, $t_2$ (see FIG. 3) may be determined to be below the maximum stress and the number of leaf portions may be selected to achieve a desired spring constant.

The following example compares a single beam body (spring) interconnection element such as interconnection element 10 with a leaf-portioned body (spring) interconnection element such as interconnection element 30. In this example, each interconnection element is limited to a body length, $l_B$, of 10 mils (250 µm) and a maximum stress, $\sigma_{MAX}$, of $1 \times 10^5$ pounds per square inch (psi) or 7000 kilograms-force per square centimeter (kg/cm$^2$). The body of each interconnection element is comprised of a nickel-cobalt (NiCo) alloy with a Young's modulus of $30 \times 10^6$ psi ($2.1 \times 10^6$ kg/cm$^2$).

In the case of a single beam body having a thickness, $t_1$, of 0.001 inches (25.4 µm) and a constant width of 0.0055 inches (139.7 µm), the maximum spring deflection is $2.2 \times 10^{-4}$ inches (5.6 µm) and the force is 4.1 gram-force (gmf). The spring constant is 18.7 gmf/mil (0.74 gmf/µm).

In the case of a two-leaf structure with equivalent spring rate, the spring constant for each leaf portion ($k_{1/2}$) is approximately 9.3 gmf/mil (0.36 gmf/µm) for a thickness, $t_2$, of 0.00079 inches (2.0 µm). Such a configuration allows a deflection distance of $2.8 \times 10^{-4}$ inches (7.1 µm) to develop 100 ksi stress. By combining two leaf portions, a spring constant of 18.6 gmf/mil (0.73 gmf/µm) is produced, approximately the spring constant of the single beam described above. The multi-leaf body, however, is capable of a deflection of $2.8 \times 10^{-4}$ inches (7.1 µm) as compared to $2.2 \times 10^{-4}$ inches (5.6 µm) for the single beam body, an improvement of 127 percent in allowed deflection. For a three leaf-portioned body, the improvement in allowed deflection is 145 percent; for a four leaf-portioned body, 162 percent.

It is to be appreciated that the above example representatively compares a single beam interconnection element with a multiple leaf portion interconnection element. Accordingly, the dimensions of the interconnection element bodies and values of spring constant and deflection distance are similarly representative and not intended to confine the invention. For example, multiple leaf structures having individual spring constants on the order of 0.05 to 0.3 gmf/mil (0.002 to 0.02 gmf/µm) or greater are useful in interconnection elements employing multiple leaf portions (e.g., two or more) according to current state of the art applications.

As contact pad or terminal densities on electronic components increase, the area of corresponding interconnection elements of a corresponding electronic component configured to connect to or probe the contact pads or terminals will be reduced. Thus, for example, the length and width of individual interconnection elements on an electronic component will be determined by the array of the corresponding contact pad or terminal array of the electronic component to be contacted. The invention offers the ability to achieve a desired spring constant, contact force, and deflection distance and meet the increased contact pad or terminal density requirements of current and future technologies.

A. Fabrication of a Multi-Leaf or Multi-Tier Spring Interconnect Element

FIGS. 7-17(e) illustrate one method of making an interconnection element in accordance with one embodiment of the invention. In one aspect, an interconnection element that is a cantilever including a post, a body comprising a plurality of leaf portions, and a tip structure will be fabricated in this embodiment. It is to be appreciated that at a given time, a number of interconnection elements can be formed on a substrate. The method described below focuses on the formation of a single interconnection element. The discussion, however, applies also to the fabrication of a number of interconnection elements on a substrate, such as a sacrificial substrate or an electronic component, at a given time. Typically, each of the interconnection elements fabricated on a substrate will have substantially similar characteristics (e.g., dimensions, shape, etc.). It is also appreciated, however, that the characteristics of the interconnection elements of a substrate can be individually controlled and determined for given application requirements.

Figure 7:
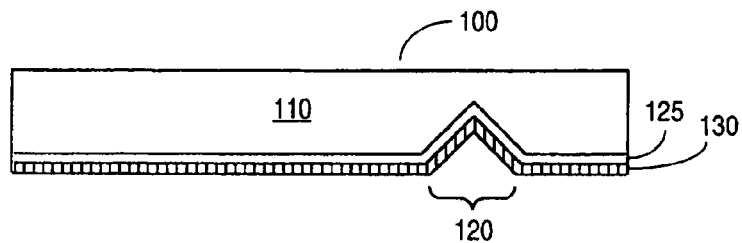
FIG. 7 is a cross-sectional side view of a structure having a triangularly-shaped feature formed in a surface of a substrate with conductive layers overlying a surface of the substrate and the triangularly-shaped feature in accordance with an embodiment of forming an interconnection element of the invention on a sacrificial substrate.

FIG. 7 shows structure 100 including substrate 110 that is a sacrificial substrate such as, for example, a semiconductor (e.g., silicon) substrate. For illustration purposes, substrate 110 is oriented to show a finished interconnection element. The orientation during manufacturing may be quite different. The method of making an interconnection element will be described according to current processing methodologies including device scale. It is to be appreciated that the principles of the invention may be adapted to future methodologies and that the techniques described are scalable.

Formed in a surface of substrate 110 is a pyramidally-shaped feature. Methods for forming a pyramidally-shaped feature are described in detail in commonly-owned pending PCT Application No. PCT/US97/08606, published Nov. 20, 1997 as WO97/43653. In PCT Application No. PCT/US97/08606, a method is described whereby a pyramidally-shaped feature is formed by the patterning of a masking material having a preferably square opening measuring, according to current technologies, approximately 1-4 mils (25-100 μm) on a side over a semiconductor substrate. Next, the substrate is etched to form the pyramidally-shaped depression. In the case of certain silicon semiconductor substrates, silicon will tend to be self-limiting as the etching proceeds along the crystal plane, such as at approximately 54.74° for silicon. In other words, the depression will extend to a depth that is dictated by the size of the mask opening and the nature of the substrate. For example, with square openings of 2.5 mils (63.5 μm) per side, the depth of the depression will be approximately 2 mils (50.8 μm) in wafer-grade silicon.

Other methods of forming pyramidally-shaped features are described in commonly-owned U.S. Pat. No. 5,809,128 and co-pending and commonly-owned U.S. patent application Ser. No. 08/802,054, titled "Microelectronic Contact Structure, and Method of Making Same."

Overlying the surface of substrate 110 is release layer 125. Release layer 125 is, for example, a metal such as aluminum or titanium-tungsten, deposited to a thickness of approximately 5000 angstroms (Å) using conventional deposition techniques. Overlying release layer 125 on the surface of substrate 110 is seed layer 130. Seed layer 130 is, for example, copper, palladium, or titanium-tungsten that facilitates a further deposition technique such as an electroplating process such as by establishing an appropriate potential for an electrolytic process. In one embodiment, seed layer 130 of titanium-tungsten is introduced over the surface of substrate 110 to a thickness of approximately 5000 Å using conventional (e.g., sputter) deposition techniques. Alternatively, a bilayer of two materials may be introduced as seed layer 130. In one embodiment, a layer of gold or palladium is introduced at a thickness of, for example, a few thousand angstroms followed by the introduction of a second material such as titanium-tungsten. Seed layer 130 may be introduced as a blanket layer over substrate 110 or as multiple, non-contiguous regions.

Figure 8:
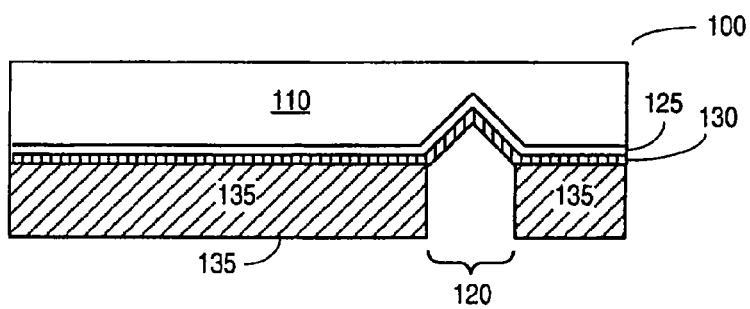
FIG. 8 shows the structure of FIG. 7 after depositing a first masking material layer over a surface of the substrate and exposing the triangularly-shaped feature through an opening in the first masking material layer.

FIG. 8 shows structure 100 after the introduction and patterning of first masking material layer 135 over substrate 110. First masking material layer 135 is, for example, a photopolymer (e.g., a positive or negative photoresist) that is spin-coated onto the surface of substrate 110 to a thickness of the desired height of a tip structure of an interconnection element taking into consideration the possibility of planarizing a portion of first masking material layer 135 with tip structure material. Approximately 1-4 mils (25-100 μm) is a useful height range for many applications. First masking material layer 135 is patterned to have an opening over feature 120.

Figure 9:
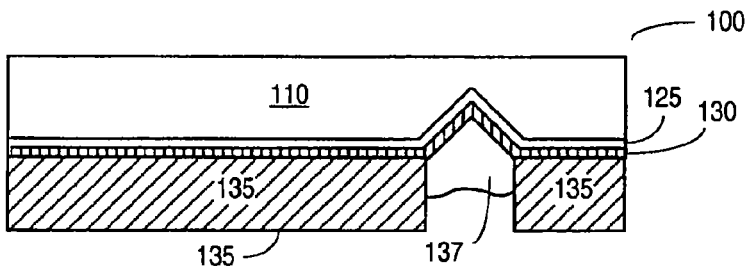
FIG. 9 shows the structure of FIG. 7 after depositing a first tip material in the opening in the first masking material layer.

Next, as shown in FIG. 9, first tip material 137 is introduced in the opening in first masking material layer 135. Suitable materials for first tip material 137 include, but are not limited to, palladium (Pd), gold (Au), and rhodium (Rh) and their alloys, including nickel (Ni) and cobalt (Co) alloys. First tip material 137 is introduced, in one example, to a thickness of about 1 to 5 μm but more can be used—even tens of microns or more. Suitable introduction techniques include, but are not limited to, electroplating, chemical vapor deposition, sputter deposition, and electroless plating. In this example, first tip material 137 serves as an outer contact layer in the finished product.

Figure 10:
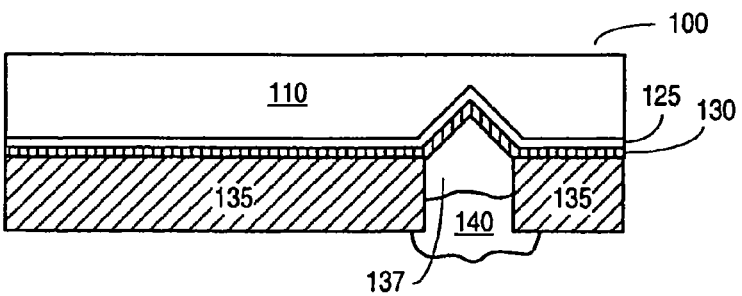
FIG. 10 shows the structure of FIG. 7 after depositing a second tip material in the opening in the first masking material layer.

FIG. 10 shows a process of forming an interconnection element according to an embodiment of the invention where second tip material 140 is introduced to a suitable thickness. This may be at least the height of first masking material layer 135 (the height of opening 120) or greater than such height. Suitable introduction techniques include, but are not limited to, electroplating, chemical vapor deposition, sputter deposition, and electroless plating. In one embodiment, second tip material 140 is an alloy of nickel and cobalt (NiCo) introduced by an electroplating process to a height greater than the height of first masking material layer 135 (i.e., overplating). A suitable total height is about 1-4 mils (25.4-101.6 μm), particularly about 3 mils (76.2 μm).

FIG. 11 shows structure 100 after planarizing second tip material 140 and first masking layer 135 in accordance with an embodiment of the invention. The planarization is accomplished, for example, by a mechanical polish or a chemical-mechanical polish with a suitable slurry. Suitable mechanical polishes include diamond-based materials and silicon carbide. Suitable slurries for a chemical-mechanical polish of the materials described above include silicon dioxide, aluminum oxide, and cesium oxide in a pH-adjusted slurry. The planarization described in FIG. 11 defines the height of the tip structure of an interconnection element.

In a first aspect of an embodiment of the invention, the tip structure of first tip material 137 and second tip material 140 may be removed and separately affixed to an interconnection element, such as for example, an interconnection element containing a post and a body formed on an electronic component. FIG. 12(a) shows structure 100 after removing first masking material layer 135. In the example where first masking material layer 135 is a photoresist, first masking material layer 135 may be removed by an etch (e.g., oxygen ashing), reactive ion etching, laser ablation, or wet etching. The removal of first masking material layer 135 may also remove seed layer 130. Alternatively, an additional procedure (e.g., etch) may be performed to remove seed layer 130 and expose release layer 125. Once first masking material layer 135 and seed layer 140 are removed, the tip structure of first tip material 137 and second tip material 140 may be separated from substrate 110 at release layer 125. In the example where release layer 125 is aluminum, the tip structure may be removed from substrate 110 by dissolving release layer 125 using a sodium hydroxide (NaOH) solution as known in the art. Other methods of separation including but not limited to chemical etching and heat are also suitable, as known in the art. In the example where seed layer 130 is a bilayer of gold followed by titanium-tungsten, a portion of seed layer 130 that may remain on the tip structure may serve as appropriate contact material.

Before the tip structure is separated from substrate 110, the tip structure may be combined with a post and a body as shown in FIG. 12(b) by, for example, brazing, soldering, or welding. FIG. 12(b) shows an example of interconnection element 1500 coupled to electronic component 1000. Interconnection element 1500 includes post 1650, coupled to terminal 1010 of electronic component 1000 and body 1550. Body 1550 includes multiple (e.g., four shown) cantilever leaf portions. A method of forming the leaf portions of a body will be discussed below with respect to a further aspect of an embodiment of the invention. For present purposes, FIG. 12(b) shows the tip structure of first tip material 137 and second tip material 140 secured to a superior surface of body 1550 at an end opposite post 1650 in this example.

FIG. 13(a) shows a second aspect of an embodiment of the invention. Starting from structure 100 as shown in FIG. 11, FIG. 13(a) shows structure 100 after rendering a portion of first masking material layer 135 conductive to define an electrode area for a body of the interconnection element that is to be formed by an electroplating process. In one embodiment, a portion of an area over first masking material layer 135 is covered with a thin adhesion/seed layer. Typical adhesion materials include, but are not limited to, titanium, tungsten, molybdenum, chrome, and copper, alone or as an alloy. Typical seed materials include, but are not limited to, gold, copper, silver, platinum and palladium. Another example of an adhesion/seed layer is an adhesion layer of palladium-tin chloride and a seed layer of electroless palladium. Seed layer 145 may be introduced via a blanket deposition, such as a sputter deposition. For an electroplated nickel-cobalt layer, for example, a seed layer having a thickness according to current technologies of about between 1500 to 6000 Å, may be suitably introduced by, for example, a blanket sputter deposition process over the surface of first masking material 135. Alternatively, seed layer 145 may be introduced as a plurality of "traces," each trace corresponding to an area over a first masking material layer 135 where the body of the interconnection element is to be formed to serve, in one manner, as an electroform whereupon the body can be fabricated.

In yet another embodiment, a stencil (shadow mask) may be introduced over the surface of first masking material layer 135. A stencil may be used, for example, to introduce a discontinuous adhesion/seed layer. The stencil typically will have a plurality of openings extending laterally from an area above the corresponding tip structure (indicated by first tip material 137 and second tip material 140) to define areas for the body of the interconnection elements. The stencil may suitably be a thin (e.g., about 2 mils (50.8 μm) thick for current technologies) foil of stainless steel, tungsten, or molybdenum that may be punched or etched to have openings. The stencil can be any suitable material having any suitable thickness that will permit seed layer 145 to be deposited onto first masking material layer 135 in a pattern of conductive traces corresponding to the shape of the opening in the stencil. With the stencil in place (typically, slightly above the surface of substrate 110), seed layer 145 is deposited, such as by sputtering, onto the exposed surface of first masking layer 135. The stencil may then be removed.

Consideration should be given, in certain instances, to the selection of the material for the masking material layer and the process for deposition of the seed layer. In general, the masking material should be stable in the environment of the deposition method. Compatibility considerations are within the level of ordinary skill in the art.

Next, as shown in FIG. 13(b), an area over substrate 110 is covered by second masking material layer 150, again such as a photopolymer (e.g., photoresist) bearing in mind the consideration of using multiple masking materials in the presence of conductive layers, including seed layers. Second masking material layer 150 is patterned to define opening 151 over structure 100.

Figure 20A:
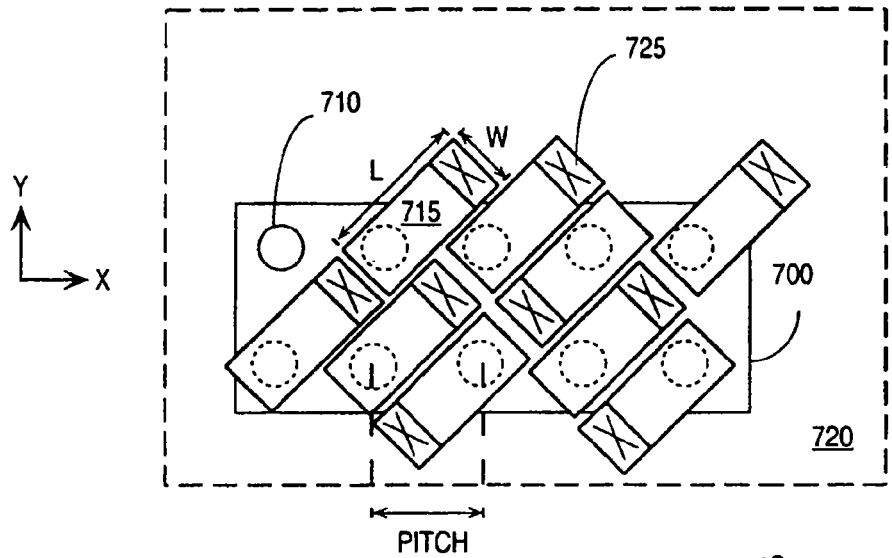
FIG. 20(a) shows a top view illustration of a first application for an embodiment of the interconnection element of the invention wherein a plurality of interconnection elements are affixed to an electronic component in a diagonal array and contact a plurality of contact pads or terminals on a second electronic component.

Second masking material layer 150 defines an area over structure 100 for a first leaf portion (e.g., a cantilever leaf portion) of a body in accordance with one embodiment of the invention. The area corresponding to opening 151 in second masking material layer 150 will be determined, in this embodiment, based, in part, on the desired area for the leaf. The desired area of opening 151 will depend, to a large extent in one embodiment, on the density and disposition (distribution) of a contact pad or terminal array that an electronic component of a plurality of interconnection elements will be probing or contacting. For example, for an electronic component having a pitch of approximately 6 mils (152 μm) or less between contacts or terminals, the length and width of an interconnection element in an array must be sized so that it can contact one contact pad or terminal and allow, for example, an adjacent interconnection element of the array to contact an adjacent contact pad or terminal. One way this is achieved is shown by the illustration shown in FIG. 20(a) and FIG. 20(b). In FIG. 20(a), for example, contacts or terminals 710 are disposed on an electronic component having a pitch of, for example, 6 mils (152 μm). Interconnection elements 715 are disposed diagonally on electronic component 720 (shown in dashed lines). Interconnection elements 725 are cantilever interconnection elements having a rectangular body of a plurality of leaf portions (not shown in FIG. 20(a)). Each interconnection element has a length of approximately 12 mils (304.8 μm) and a width of 3 mils (76.2 μm) or a total area of 24 mil$^2$ (2.3×10$^4$ μm$^2$). Such an area will correspond, in one embodiment, to the area of each leaf portion of a cantilever spring of an interconnection element such as illustrated in the process of FIGS. 7-17(e).

The thickness of second masking material layer 150 will determine in part the thickness of a leaf portion of the body of the interconnection element formed by the process in this embodiment. Thus, second masking material layer 150 is introduced to a desired thickness of a leaf portion of a body of the interconnection element bearing in mind a subsequent planarization step. A suitable thickness of a leaf portion will be determined based in part on considerations of the desired spring constant, the deflection distance of the body, and the stress property of the material chosen for the leaf portion of a body. In one embodiment, for a nickel-cobalt body (having a Young's modulus of 30×10$^6$ psi (2.1×10$^6$ kg/cm$^2$) and maximum stress, $\sigma_m$ of 1×10$^5$ psi (7000 kg/cm$^2$), a leaf portion having a length of 21 mils (533 μm) and a thickness of about 0.5 mil (12.7 μm) will support about 1 mil (25.4 μm) of compliance.

Figure 13C:
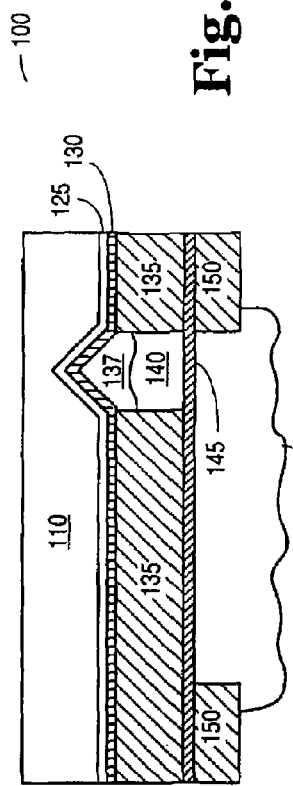
FIG. 13(c) shows the structure of FIG. 7 after depositing a second conductive material in the opening of the second masking material layer in accordance with a second aspect of an embodiment of the invention.

FIG. 13(c) shows structure 100 after introducing first body material 155 over the surface of substrate 110. In one embodiment, first body material 155 is conductive material introduced by an electroplating process with an electroplate alloy such as nickel-cobalt. In FIG. 13(c), first body material 155 is introduced to a thickness greater than the thickness of second masking material layer 150. As noted, it is to be appreciated that the amount introduced and the thickness of first body material 155 will depend, in part, on the desired thickness of the particular leaf portion of the body.

Figure 13D:
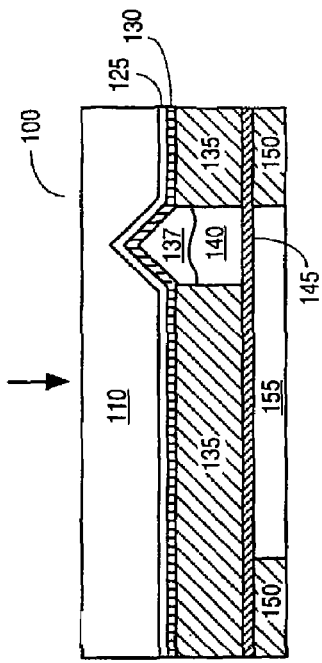
FIG. 13(d) shows the structure of FIG. 7 after planarizing the second masking material and the second conductive material in accordance with a second aspect of an embodiment of the invention.

As shown in FIG. 13(d), after the introduction of first body material 155 over substrate 110, first body material 155 and second masking material 150 are planarized by way of, for example, a grinding process or a chemical-mechanical polish such as described above to form a leaf portion of the interconnection element on substrate 110. Planarization of first body material 155 and second masking material 150 controls the final thickness of the leaf portion of the body (i.e., controls the thickness of first body material 155) thus allowing a determinable and consistent leaf portion to be fabricated.

Figure 14A:
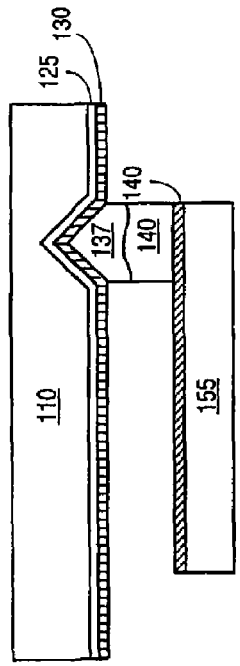
FIG. 14(a) shows the structure of FIG. 7 after removing the masking material layers to form an interconnection element including a spring having a single leaf portion and a tip structure in accordance with a third aspect of an embodiment of the invention.

In a third aspect of an embodiment of the invention, the tip structure of first tip material 137 and second tip material 140 and a leaf portion of first body material 155 may be removed and separately affixed to an interconnection element, such as for example, an interconnection element containing a post and, optionally, a body of one or more leaf portions formed on an electronic component. FIG. 14(a) shows structure 100 after the further processing step of removing first masking material layer 135 and second masking material layer 150. In the example where first masking material layer 135 and second masking material layer 150 is a photoresist, the layers may be removed by an etch (e.g., oxygen ashing), reactive ion etching, laser ablation, or wet etching. Once the masking material layers are removed, the tip structure and leaf portion body may be removed from substrate 110 by, for example, dissolving release layer 125 using a sodium hydroxide (NaOH) solution as known in the art.

Figure 14B:
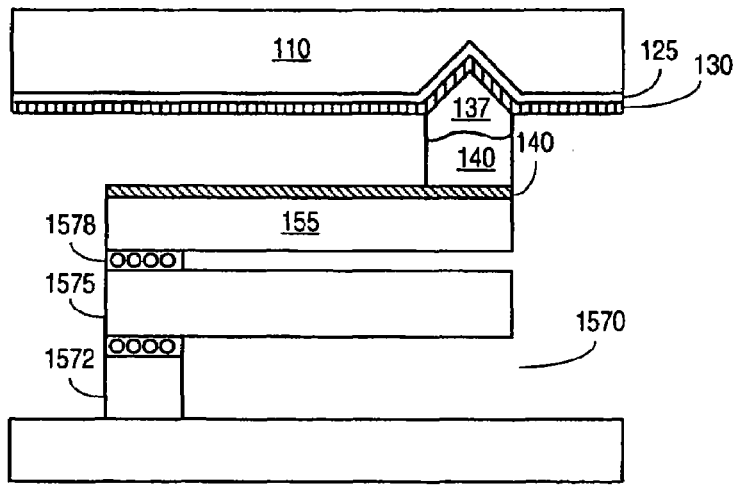
FIG. 14(b) shows the structure of FIG. 14(a) after affixing the tip structure and spring to a separately fabricated post and spring (in this example consisting of one leaf portion) in accordance with a third aspect of an embodiment of the invention.
Figure 14C:
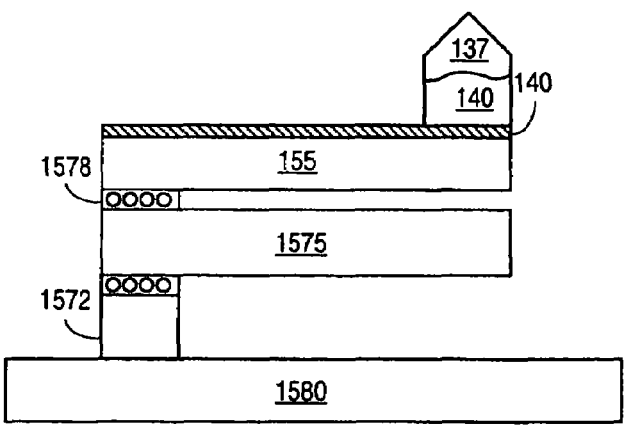
FIG. 14(c) shows the structure of FIG. 14(b) after separating the tip structure from its substrate to form a free-standing interconnection element on a substrate in accordance with a third aspect of an embodiment of the invention.

Before the tip structure and leaf portion body are separated from substrate 110, the leaf portion may be combined with a post and, optionally, one or more leaf portions as shown in FIG. 14(b) by, for example, brazing, soldering, or welding. FIG. 14(b) shows an example of interconnection element 1550 coupled to electronic component 1580. Interconnection element 1550 includes post 1572 and leaf portion 1575. The affixing of the leaf portion of first body material 155 to leaf portion 1575 provides a spacer between the leaf portions. The amount of connecting material can be varied to adjust this spacing. FIG. 14(c) shows a free-standing interconnection element after the separation of substrate 110 from the tip structure.

Figure 15A:
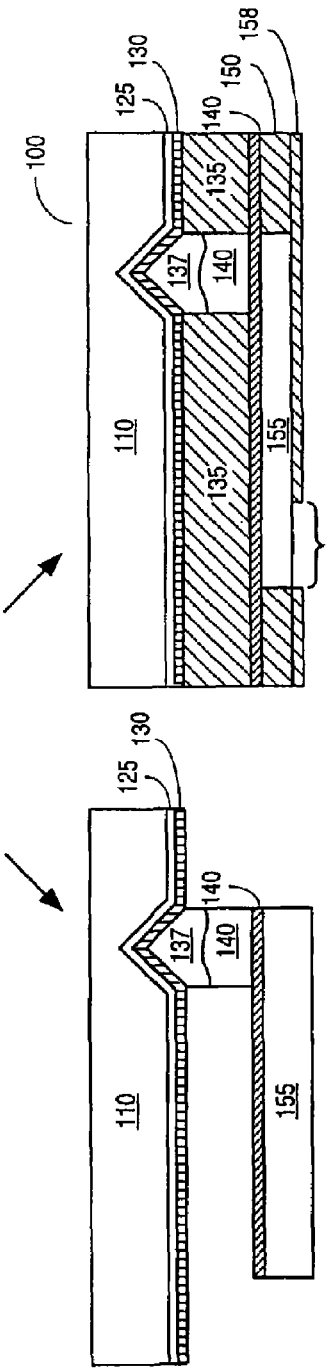
FIG. 15(a) shows the structure of FIG. 7 after depositing a third masking material layer over a portion of the planarized surface in accordance with a fourth aspect of an embodiment of the invention.

FIG. 15(a) shows a fourth aspect of an embodiment of the invention. Starting from structure 100 as shown in FIG. 13(d), FIG. 15(a) shows depositing of third masking material layer 158 over a surface of structure 100. In this embodiment, third masking material layer 158 is, for example, a photoresist similar to the previous masking material layers. Third masking material layer 158 may also be a metal layer (e.g., copper), conductive polymer, or other layer preferred for later removal by etching (wet or dry) or solvent removal. The thickness of third masking material layer 158 defines, in part, the thickness of a gap between adjacent leaf portions of a spring of the interconnection element. Third masking material layer 158 also defines a portion of first body material 155 to which a subsequent leaf portion of a body of the interconnection element may be coupled. Stated alternatively, third masking material layer 158 serves, in this embodiment, to provide an area less than the entire surface area of first body material 155 to connect a second leaf portion and inhibit the plating together of adjacent leaf portions. Opening 159 provides access to first body material 155 to allow plating to a portion of first body material 155.

In one embodiment, third masking material layer 158 is a layer of photoresist similar to the previous masking material layers. Third masking material layer 158 may be, for example, on the order of 0.1 to 5 µm.

In the discussion that follows, the masking material layers, including third masking material layer 158 will be removed leaving a free standing inverted interconnection element on substrate 110 and an air gap between adjacent leaf portions of the body of the interconnection element. As an alternative to introducing a removable masking material layer to be removed to form an air gap between adjacent leaf portions, a thin layer of an "interleaf" material may be introduced that inhibits the complete plating of adjacent leaf portions and will not inhibit the deflection of individual leaf portions. Suitable interleaf material includes, but is not limited to, TEFLON® polymers (commercially available from E.I. duPont de Nemours & Co. of Wilmington, Del.) diamond, brass, or a PARALENE® polymer (commercially available from E.I. duPont de Nemours). Opening 159 is patterned with the interleaf material to first body material 155 to allow plating of a subsequent leaf portion to the leaf portion that is first body material 155.

Figure 15B:
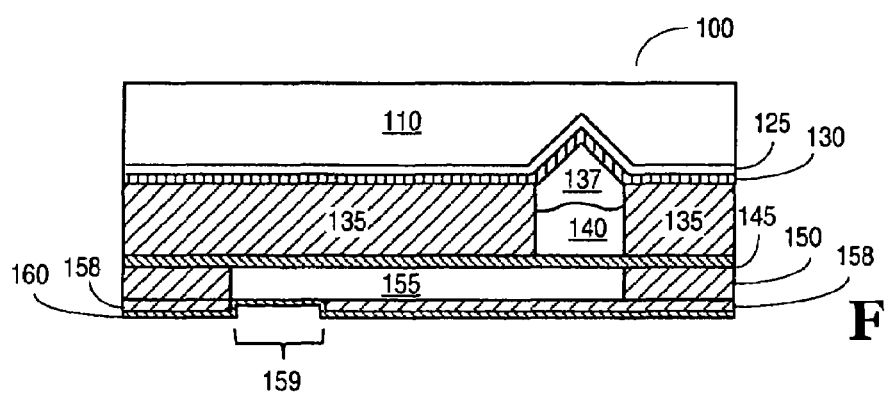
FIG. 15(b) shows the structure of FIG. 7 after depositing a seed material over a portion of the substrate in accordance with a fourth aspect of an embodiment of the invention.

FIG. 15(b) shows the introduction of another adhesion/seed layer. Adhesion/seed layer 160 may be, in one embodiment, similar to adhesion/seed layer 145 and may be introduced via a blanket deposition. For an electroplated nickel-cobalt, for example, an adhesion/seed layer of gold or copper having a thickness of 3000-5000 Å may be suitably introduced over the surface of third masking material layer 158.

Figure 15C:
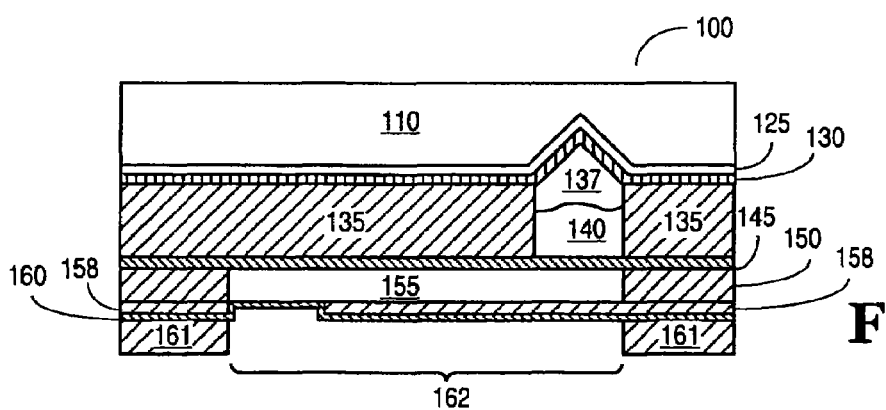
FIG. 15(c) shows the structure of FIG. 7 after depositing a fourth masking material layer over a portion of the substrate defining an opening over the second conductive material in accordance with a fourth aspect of an embodiment of the invention.
Figure 24A:
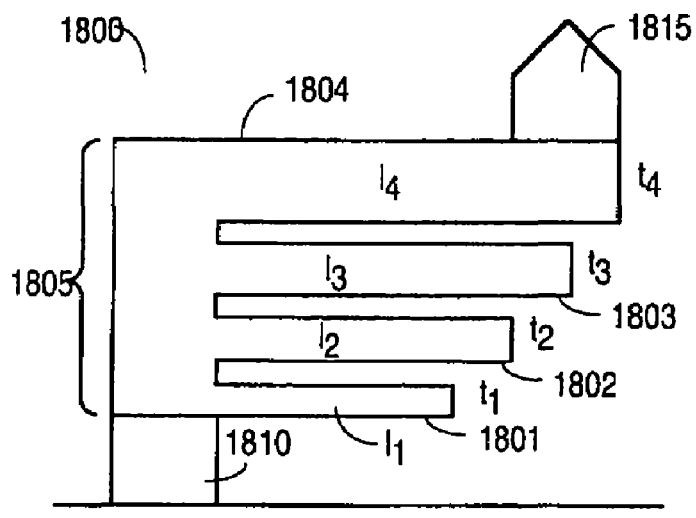
FIG. 24(a) shows an embodiment of an interconnection element of the invention having a plurality of leaf portions of different dimensions.
Figure 24B:
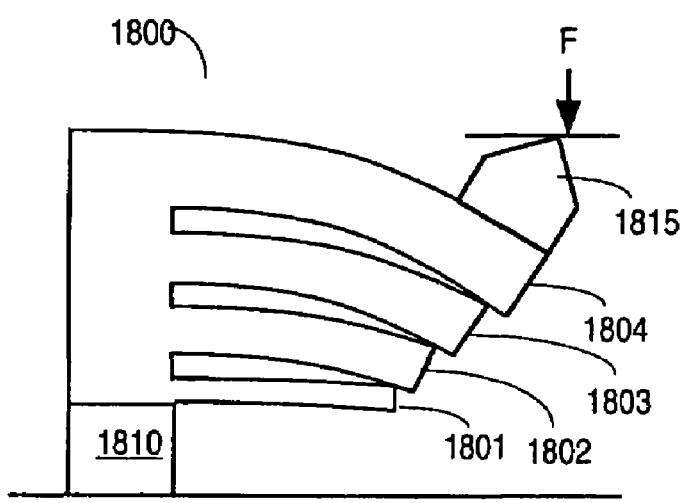
FIG. 24(b) shows the interconnection element of FIG. 24(a) subjected to a force at its tip.

As shown in FIG. 15(c), an area of structure 100 is covered with fourth masking material layer 161, again such as a photoresist similar to the previous masking material layers bearing in mind considerations of using multiple masking material layers in the presence of conductive layers. Fourth masking material layer 161 is patterned to define opening 162 that defines an area for a second leaf portion of the body of the interconnection element. In one embodiment, the patterning of fourth masking material layer 161 defines an area (e.g., a length and width for a cantilever leaf portion) similar to second masking material layer 150. The considerations of the thickness of fourth masking material layer 161 are similar to the considerations discussed above with reference to second masking material layer 150. In other embodiments, leaf portions of a spring may have different areas. Leaf portions may be dissimilar not only in length (as illustrated in FIGS. 24(a) and 24(b)), but even profile. The configuration of the individual leaf portions can be selected by the designer for optimal performance in a particular environment. The invention provides a mechanism for individually configuring leaf portions to suit a designer's needs.

Figure 15D:
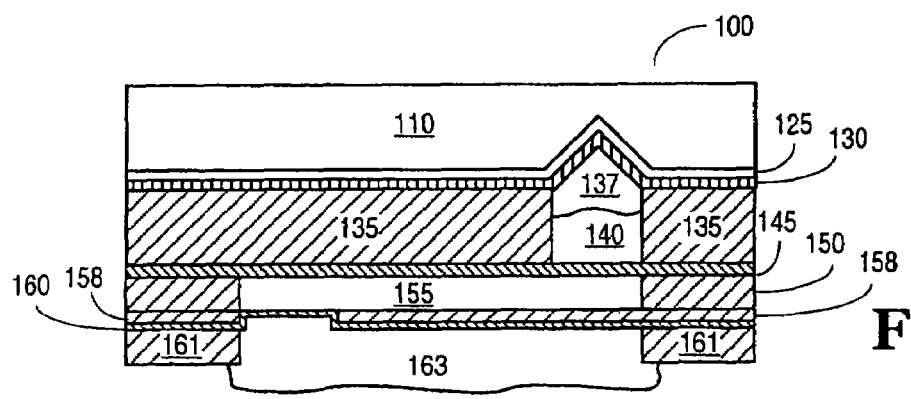
FIG. 15(d) shows the structure of FIG. 7 after depositing a third conductive material in the opening of the fourth masking material layer in accordance with a fourth aspect of an embodiment of the invention.

Next, as shown in FIG. 15(d), second body material 163 is introduced over substrate 110. In one embodiment, second body material is a conductive material introduced through an electroplating process with an electroplated alloy such as nickel-cobalt. Second body material 163 is introduced to a thickness greater than the thickness of fourth masking material layer 161 of a second leaf portion of the body of the interconnection element.

Figure 15E:
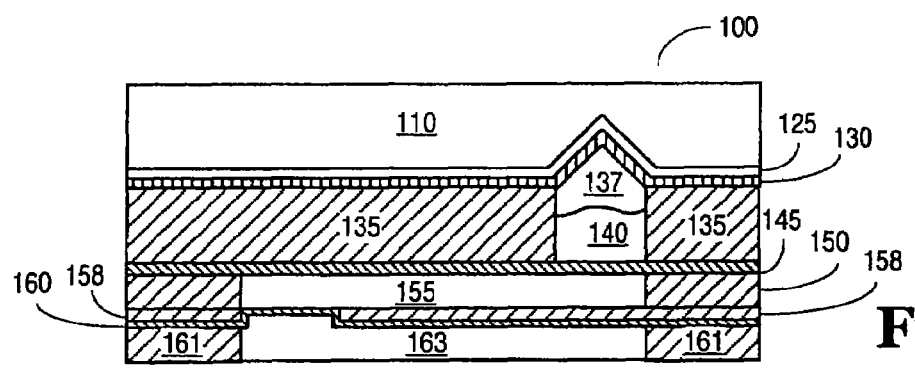
FIG. 15(e) shows the structure of FIG. 7 after planarizing the third masking material layer and the third conductive material in accordance with a fourth aspect of an embodiment of the invention.

As shown in FIG. 15(e), after the introduction of second body material 163 over substrate 110, second body material 163 and fourth masking material layer 161 are planarized by way of, for example, a grinding process or a chemical-mechanical polish to form a second leaf portion of a body of the interconnection element. As noted above, in the case of a cantilever leaf portion of a body, the thickness will depend to a large extent on the desired spring constant, the deflection distance, and the material stress. In one embodiment, the thickness of second body material 163 will be similar to the thickness of first body material 155. In other embodiments, such as those illustrated below, leaf portions of a body may have different thicknesses and different profiles to modify the properties of the interconnection element.

The above-described process and patterning of masking material layers, introducing a seed layer, introducing a conductive material, and planarizing a masking material layer and the body material may be repeated numerous times to form additional leaf portions of a body of an interconnection element. The number of leaf portions will depend, primarily, on the desired spring constant for a predetermined deflection distance and material stress for the material of the interconnection element of the invention. FIG. 15(*f*) shows structure 100 after the subsequent introduction, patterning, and planarizing steps of forming two additional leaf portions of a body of the interconnection element. In total, an interconnection element shown in FIG. 15(*f*) has a body of four leaf portions.

FIG. 16(*a*) and FIG. 16(*b*) show a fifth aspect of one embodiment of the invention. In this aspect, the fabrication of the component for the interconnection element formed by the lithographic techniques described is substantially complete with the formation of a spring interconnection element having a tip structure of first tip portion 137 and second tip portion 140 and a body of multiple (e.g., four) leaf portions denoted principally by body material 155, 163, 166, and 170. FIG. 16(*a*) shows structure 100 after removing the masking material layers (e.g., masking material layers 135, 150, 158, 161, 164, 167, 168, and 169). In the example where each of the masking material layers are a photoresist, the step of removing the masking material layers may be accomplished with an etch (e.g., oxygen ashing), reactive ion etching, laser ablation, or wet etching. An additional etch may be required to remove excess or undesired portions of the various seed layers. However, because the seed layers are typically thin (e.g., about 5000 Å according to current technologies), any excess or undesired seed layer material is typically removed with the removal of the masking material layer(s). In this manner, FIG. 16(*a*) shows an interconnection element affixed at its tip to substrate 110 and a body of four laterally and/or transversely extending leaf portions.

The sacrificial substrate of FIG. 16(*a*) including a tip structure and body of an interconnection element may be affixed to a separately-fabricated post to form an interconnection element on an electronic component as shown in FIG. 16(*b*). In this manner, sacrificial substrate 110 is aligned with post 1650 so that the inferiorly located leaf portion of the body (relative to the tip structure) may be affixed to post portion 1650 at a proximal end of the leaf portion (an end opposite the tip structure end of the leaf portion) to create a cantilever body as shown in FIG. 16(*b*). The body may be affixed to post 1650 by, for example, soldering, welding, or brazing. Separately fabricated post 1650 is coupled to electronic component 1010 at a contact pad or terminal of electronic component 1010. Post 1650 may be formed directly on an electronic component or transferred from a sacrificial substrate.

Once the body of the interconnection element is affixed to post 1650, the tip structure is separated from sacrificial substrate 110 at release layer 125. In the example where release layer 125 is aluminum, one method of separating the tip from sacrificial substrate 110 is by reacting release layer 125 with a sodium hydroxide (NaOH) solution. FIG. 16(*b*) shows the final interconnection element coupled to electronic component 1010. Any remaining unwanted seed material 130 adjacent first tip material 137 may be removed with a subsequent etch or retained as contact material.

Instead of separating the interconnection element containing a tip structure and a body from sacrificial substrate 110, a sixth aspect of an embodiment of the invention contemplates the forming of a post for the interconnection element on the sacrificial substrate. FIGS. 17(*a*)-17(*e*) illustrate this process.

FIG. 17(*a*) shows structure 100 of FIG. 15(*f*) after the patterning of post masking material layer 199 over structure 100 including an opening to the inferiorly located leaf portion (leaf portion defined by conductive material 170) at the proximal end of conductive material 170 (i.e., proximal relative to the location of the tip structure of the interconnection element on the end of the leaf portion defined principally by reference numeral 155). Post masking material 199 is, for example, photoresist material similar to other masking material layers. Prior to patterning post masking material layer 199, an adhesion/seed layer may be patterned over leaf portion 170 similar, in one embodiment, to adhesion/seed layer 145 described above. As noted above, the described adhesion/seed layers facilitate, in one aspect, an electrolytic process of introducing interconnection material. It is to be appreciated that such adhesion/seed layers may not be necessary, particularly where the masking material that is used to fabricate the interconnection element is conductive material. One example of such a process is described with reference to FIGS. 34-52 and the accompanying text.

Post masking material layer 199 is, for example, photoresist material similar to other masking material layers (e.g., first masking material layer 135, second masking material layer 150, third masking material layer 158, fourth masking material layer 161, fifth masking material layer 164, sixth masking material layer 167, seventh masking material layer 168, and eighth masking material layer 171). Post masking material layer 199 is patterned to a suitable height for a post of an interconnection element including consideration for a subsequent planarization step to define the height of the post. The thickness of post masking material layer 199 will primarily determine the distance that the main body portion (i.e., spring and tip) of the interconnection element is spaced away from the surface of an electronic component. In an example where resiliency is desired, the dimension of the post, the body, and the tip structure may be coordinated to maximize the contact force of the tip structure with, for example, a terminal of an electronic component, and minimize the potential "bottoming out" of the deflected body. For current technologies according to the method described, a suitable height of post masking material 199 is approximately 1-30 mils (25-750 μm), and preferably 3-8 mils (75-200 μm).

FIG. 17(*b*) shows structure 100 after introducing post material 205 in the opening and post masking material layer 199 via, for example, an electroplating process. In one example, post material 205 is nickel-cobalt similar to the body of the interconnection element (e.g., first body material 155, second body material 163, third body material 166, and fourth body material 170). Post material 205 is preferably introduced to a thickness of at least the thickness of post masking material layer 199, and generally greater than the thickness of post masking material layer 199 (e.g., overplating).

FIG. 17(*c*) shows structure 100 after planarizing post material 205 and post masking material layer 199 to define a desired thickness for the post of the interconnection element. The planarization may be accomplished in a manner similar to the planarization procedures described above.

Figure 17B:
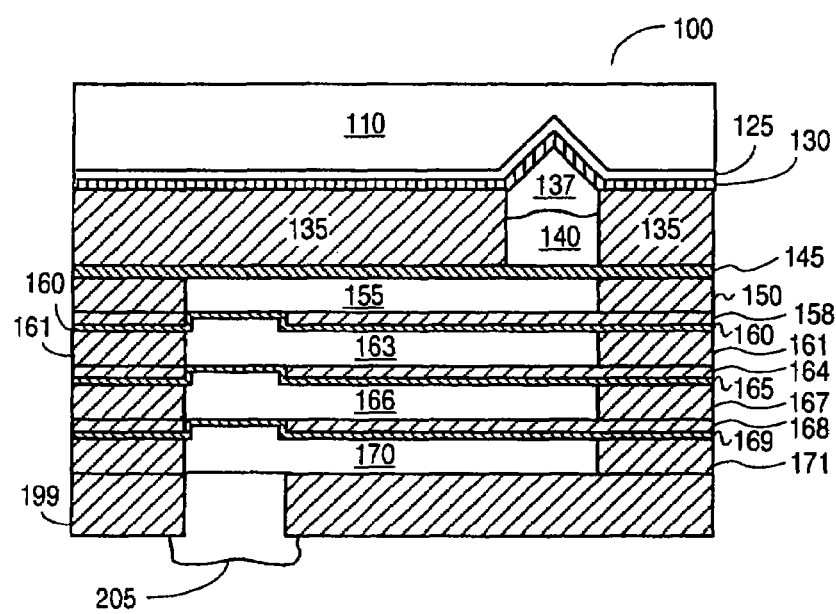
FIG. 17(b) shows the structure of FIG. 7 after depositing a post material in the opening to the seed material in accordance with a sixth aspect of an embodiment of the invention.
Figure 17C:
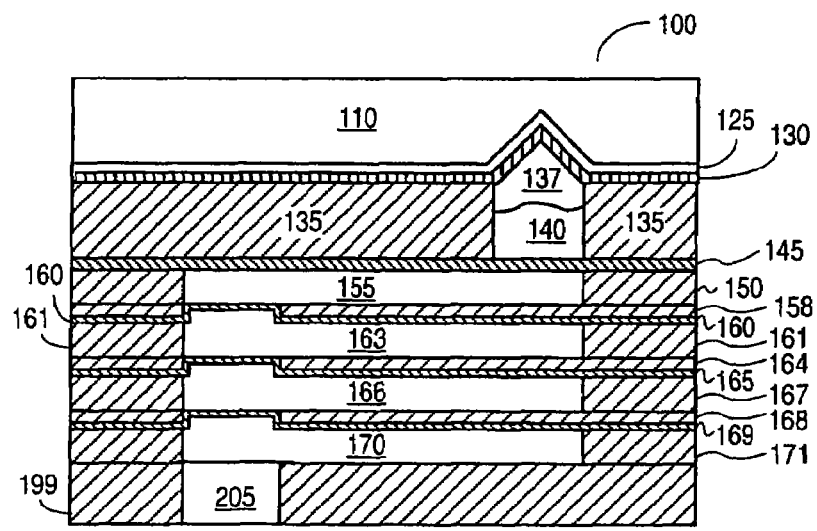
FIG. 17(c) shows the structure of FIG. 7 after planarizing the post masking material layer and the post material in accordance with a sixth aspect of an embodiment of the invention.
Figure 17D:
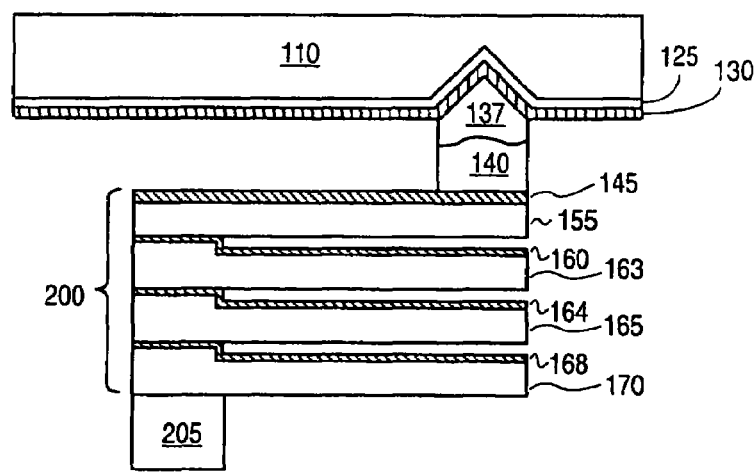
FIG. 17(d) shows the structure of FIG. 7 after removing the masking material layers in accordance with a sixth aspect of an embodiment of the invention.

FIG. 17(d) shows structure 100 after removing the masking material layers. In the example where the various masking material layers (e.g., first masking material layer 135, second masking material 150, third masking material 158, fourth masking material layer 161, fifth masking material layer 165, sixth masking material layer 167, seventh masking material layer 168, eighth masking material layer 171 and post masking material layer 199 illustrated together in FIG. 17(c)) are photoresist, an oxygen ashing, reactive ion etching, laser ablation or wet chemical etch step may be used to remove the masking material layers. The removal of the masking material layers leaves the interconnection element affixed at its tip structure to sacrificial substrate 110 as shown in FIG. 17(d).

One technique for mounting the interconnection element shown in FIG. 17(d) to an electronic component is by retaining the interconnection element on the sacrificial substrate as shown in FIG. 17(d) and aligning post 205 with a corresponding terminal on an electronic component, whereupon post 205 may be suitably soldered, brazed, welded, etc., to a contact pad or terminal. It is to be appreciated that any suitable technique and/or material for affixing the post of the interconnection element to a contact pad or terminal of an electronic component may be employed. Once the interconnection element is affixed to an electronic component, sacrificial substrate 110 may be removed in a suitable manner, such as the dissolution of release layer 125 by sodium hydroxide (NaOH), chemical etching, heating, etc. Any remaining unwanted seed material layer 130 adjacent first tip material 130 may be removed with a subsequent etch or retained as contact material.

Figure 17E:
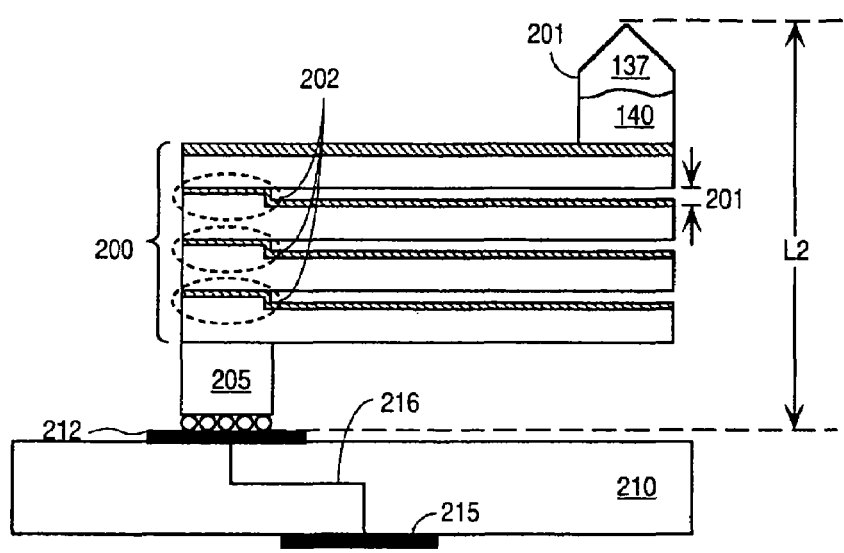
FIG. 17(e) shows the structure of FIG. 7 after affixing the interconnection element formed in accordance with a sixth aspect of an embodiment of the invention to an electronic component.

FIG. 17(e) shows the interconnection element having tip structure 201 of first tip portion 137 and second tip portion 140, body 200, and post 205 coupled to contact pad or terminal 212 of electronic component 210. Electronic component 210 is, for example, a space transformer of a probe card assembly or another integrated circuit. Electronic component 210 is, for example, a semiconductor- or ceramic-based substrate having contact pads or terminals on opposing surfaces. In the case of a commercially available ceramic-based electronic component 210, for example, the electronic component includes terminals 212 and 215 on opposing surfaces of the electronic component. Terminals 212 and 215 are connected, for example, to conductive circuits 216 running through the electronic component such as, for example, a molybdenum or tungsten or molybdenum/tungsten circuit. Terminals 212 and 215 on electronic component 210 are, for example, copper, nickel, and gold terminals that may be suitable for connecting to an interconnection element by, for example, soldering. In one example, the copper facilitates the electroplating process and is the upper layer. The nickel acts a barrier between the gold and the copper.

FIG. 17(e) shows an interconnection element having body 200 of four leaf portions. Adjacent leaf portions are coupled to one another at their proximal ends to form a cantilever spring. The area at which the leaf portions are coupled is represented by supports 202. In the embodiment described supports 202 comprise a portion of adhesion/seed layer and a portion of body material selected to comprise a sufficient thickness to resist bending forces and maintain structural integrity. Spacing is provided by gaps 201 where masking material was originally deposited, as described above. It is to be appreciated that, according to this embodiment, supports 202 may be fabricated as discrete structures apart from the fabrication of a subsequent leaf portion such as, for example, by introducing and seeding an opening of a masking material and depositing a conductive material for supports 202. Planarization of the masking material and the conductive material may also be desirous. The thickness of supports 202 may also be varied.

Figure 16B:
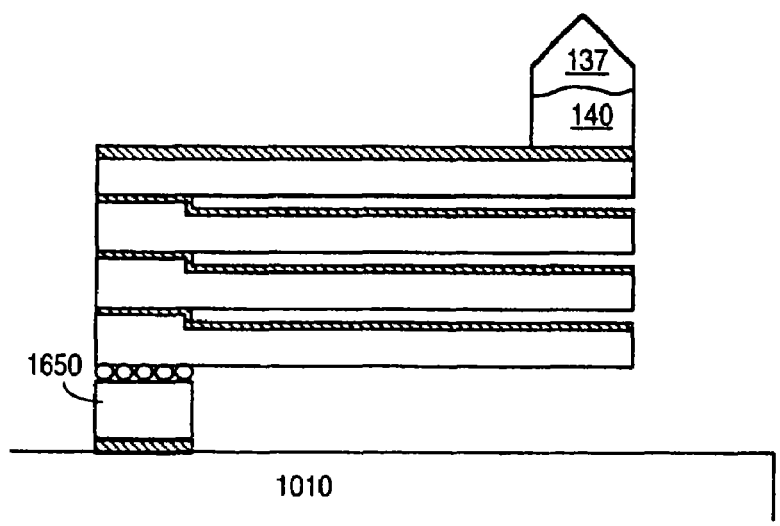
FIG. 16(b) shows the structure of FIG. 16(a) after affixing the tip structure and spring to a separately fabricated post to form a free-standing interconnection element on a substrate in accordance with a fifth aspect of an embodiment of the invention.

As is evident in FIG. 17(e) (and FIGS. 14(c) and 16(b)), a plurality of elongate or cantilever interconnection elements such as described can be affixed to an electronic component having a plurality of contacts or terminals on the surface thereof. In this embodiment, each interconnection element has a post, a body, and a tip structure opposite the post. Each interconnection element is affixed at its post to a corresponding contact pad or terminal of an electronic component. The tip structure of each interconnection element extends above the surface of the electronic component to a position that is laterally and/or transversely offset from the post forming a free standing, cantilever structure. When affixed to an electronic component, the interconnection element of the invention has a height of "L2," this being the distance between the highest portion of the tip structure and the inward-most portion where the post is affixed to electronic component 210. A representative height, L2, for an interconnection element according to current technologies is, for example, 10-20 mils and will depend, in part, on considerations of contact pad or terminal spacing on an electronic component to be contacted or probed by an array of interconnection elements, deflection distance of the interconnection element, and the spring constant of the interconnection element.

In FIG. 17(e), the distance between the underside of the inferiorly-located leaf portion of body 200 and the surface of electronic component 210 represents the distance that the interconnection element can deflect (absent any stops) in response to a compressive force applied at the tip structure. The height of post 205 and contact pad or terminal 212 (and any bonding material thickness) primarily determines this distance. A similar relationship applies between the superiorly-located leaf portion of body 200 and the end of tip 201. Reference is made to FIG. 4 and the accompanying text that describe the travel of the interconnection element.

The above embodiments described an interconnection element coupled to a substrate that is or is part of an electronic component and the interconnection element serves as a conductive path from a contact pad or terminal. It is to be appreciated that the interconnection element of the invention need not be coupled to a contact pad or terminal and need not serve as a conductive path. Instead, an interconnection element that is, for example, a mechanical spring is also contemplated.

The lithographic technique of forming an interconnection element on a sacrificial substrate is representative of one technique of forming the interconnection elements of the invention. A second technique where the interconnection element is formed directly on an electronic component is also contemplated. Reference is made to patent application Ser. No. 09/205,022 filed Dec. 2, 1998 entitled "Lithographic Contact Elements," and patent application Ser. No. 09/205,023 filed Dec. 2, 1998 entitled "Lithographic Contact Elements," co-owned by the assignee of the invention described herein, which describe such a technique and which are incorporated by reference. It is to be appreciated that the techniques described herein of forming interconnection elements having a body with a plurality of leaf portions can be incorporated into the discussions of forming interconnection elements on an electronic component described in these other applications.

B. Exemplary Applications of Spring Interconnect Structures

Figure 18:
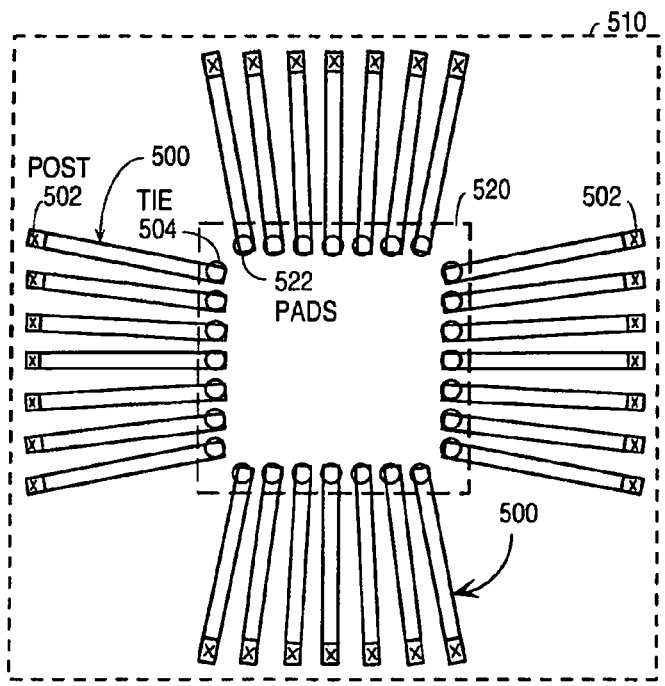
FIG. 18 shows a top view illustration of an application for an embodiment of the interconnection element of the invention wherein a plurality of interconnection elements are affixed to an electronic component and contact a plurality of contact pads or terminals arranged along the edge of a second electronic component.

FIG. 18 illustrates an application wherein a plurality of interconnection elements 500 such as those described hereinabove are arranged on a substrate such as a space transformer of a probe card assembly and affixed thereto in the manner described hereinabove, so that their tip structure ends are disposed in a manner suitable for making contact with the bond pad of a semiconductor device having its contact pads or terminals arranged along its periphery. This application is similar to the application described in co-pending, commonly-owned U.S. patent application Ser. No. 08/802,054, titled "Microelectronic Contact Structure, and Method of Making Same." In FIG. 18, each interconnection element 500 includes post 502 (denoted by "x") and tip structure 504 and is mounted to an electronic component such as a space transformer (schematically illustrated by the dashed line 510) of a probe card assembly. Tip structures 504 are arranged in a pattern, mirroring the pattern of contact pads or terminals 522 (illustrated schematically by circles) of an electronic component (schematically illustrated by dashed line 520) such as a semiconductor device. Interconnection elements 500 "fan-out" from their tip structures 504, so that each of their posts 502 is disposed at a greater pitch (spacing from one another) than their tip structures 504.

Figure 19:
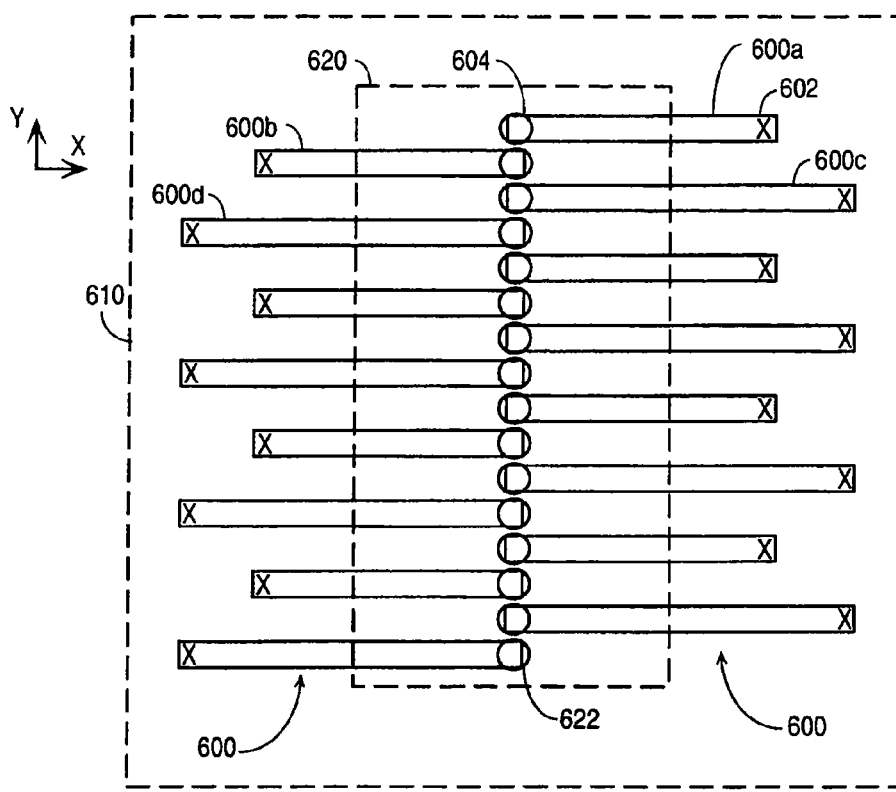
FIG. 19 shows a top view illustration of a second application for an embodiment of the interconnection element of the invention wherein a plurality of interconnection elements are affixed on an electronic component and contact a plurality of contact pads or terminals arranged in a row on a second electronic component.

FIG. 19 illustrates another application (also similarly described in co-pending, commonly-owned U.S. patent application Ser. No. 08/802,054) wherein a plurality of interconnection elements 600 such as those described hereinabove are arranged on a substrate such as a space transformer of a probe card assembly and affixed thereto in the manner described hereinabove, so that their tip structures are disposed in a manner suitable for making contact with the contact pads or terminals of a semiconductor device having its contact pads or terminals arranged in a row along a center line thereof. In FIG. 19, each interconnection element, generally denoted by reference numeral 600, includes post 602 (denoted by "x") and tip structure 604, and are mounted to an electronic component such as a space transformer of a probe card assembly (schematically illustrated by dashed line 610). Tip structures 604 are arranged, in a pattern mirroring that of contact pads or terminals 622 (illustrated schematically by circles) of an electronic component (schematically illustrated by dashed line 620) such as a semiconductor device. In this example, the pitch of contact pads or terminals 622 in an xy-direction is 2 mils (50.8 μm) by 1.414 mils (35.9 μm), respectively. Interconnection elements 600 are arranged in the following sequence. First interconnection element 600a is relatively short (e.g., has the length in an x-direction of, in this embodiment, approximately 60 mils (1524 μm)), and is disposed to extend towards one side (right, as used) of electronic component 620. Second interconnection element 600b is adjacent first interconnection element 600a and is also relatively short (e.g., a length in an x-direction of, in this embodiment, approximately 60 mils (1524 μm)), and is disposed to extend towards an opposite side (left, as used) of electronic component 620. Third interconnection element 600c is adjacent second interconnection element 600b and is relatively long (e.g., has a length in an x-direction of, in this embodiment, approximately 80 mils (2032 μm)), and is disposed to extend towards the one side (right, as used) of electronic component 620. Finally, fourth interconnection element 600d is adjacent third interconnection element 600c and is also relatively long (e.g., has a length in an x-direction of, in this embodiment, approximately 80 mils (2032 μm)), and is disposed to extend towards the opposite side (left, as used) of electronic component 620. In this manner, tip structures 604 are disposed at a fine pitch commensurate with that of contact pads or terminals 622, and posts 602 are disposed at a significantly greater pitch from one another.

FIG. 20(a) shows a third application wherein a plurality of interconnection elements 715 such as those described hereinabove are arranged on a substrate such as electronic component 720 (shown in dashed lines) and affixed thereto in the manner described hereinabove, to accommodate the contacting of a densely packed array of contact pads or terminals 710 on electronic component 700. In this embodiment, interconnection elements 715 are arranged in a diagonal array in an x-y plane over contact pads or terminals 710 to accommodate a pitch between contact pads or terminals 710 that is not suitable for a longitudinally or laterally extending array of interconnection elements. Interconnection elements 715 are arranged over contact pads or terminals 710 such that the tip structures of interconnection elements 715 contact the contact pads or terminals 710. Posts 725 are located at the proximal end of the rectangular body of interconnection elements 715. As illustrated in FIG. 20(a), in one embodiment, interconnection elements 715 are arranged in a non-aligned relation relative to their contacting of contact pads or terminals 710 in the same row of electronic component 700.

Figure 20B:
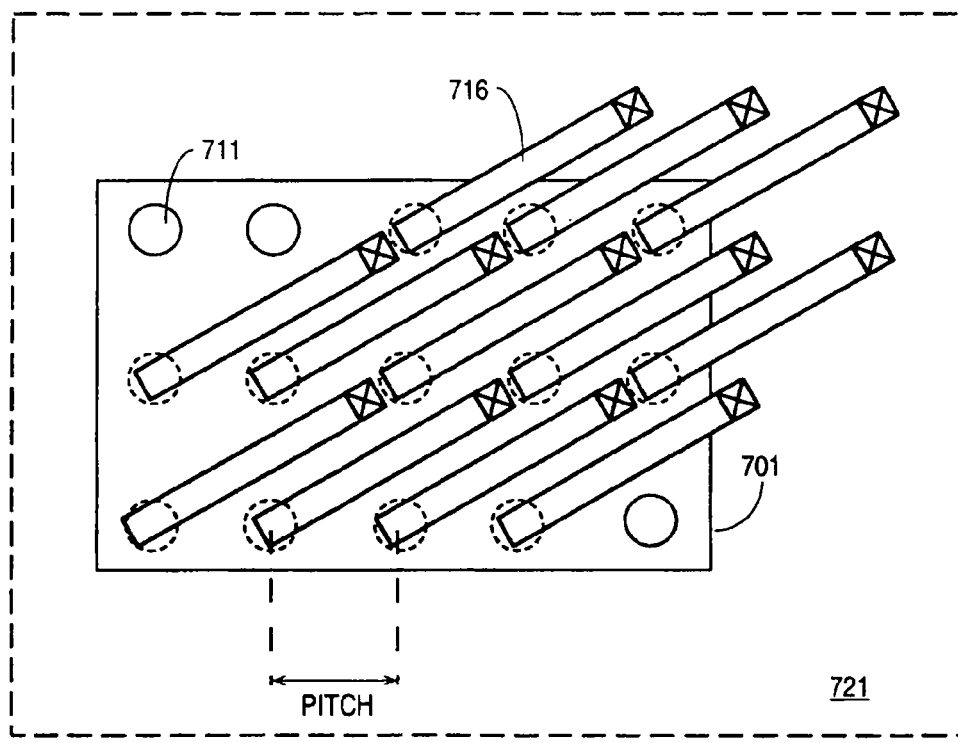
FIG. 20(b) shows a top view illustration of a second application for an embodiment of the interconnection element of the invention wherein a plurality of interconnection elements are affixed to an electronic component in a diagonal array and contact a plurality of terminals on a second electronic component.

FIG. 20(b) illustrates an application wherein a plurality of interconnection elements 716 such as those described hereinabove are arranged on a substrate such as electronic component 721 (shown in dashed lines) and affixed thereto in the manner described hereinabove, to accommodate the contacting of a densely packed array (3 across) of contact pads or terminals 711 on electronic component 701. As illustrated in FIG. 20(b), in one embodiment, interconnection elements 716 are arranged in an aligned relation relative to their contacting of contact pads or terminals 711 in the same row of electronic component 701.

FIG. 20(a) and FIG. 20(b) illustrate that the length ("l") and width ("w") of an individual interconnection element may be limited by the spacing of contact pads or terminals 710. To maintain the desired spring constant, deflection distance, and a material stress less than the maximum stress, interconnection elements 715 or 716 must be increased in the z-direction (coming out of page of FIG. 20(a) and FIG. 20(b)). The multiple leaf portion body of the interconnection element of the invention accommodates this requirement.

C. Exemplary Layouts of Spring Interconnect Structures

Figure 21A:
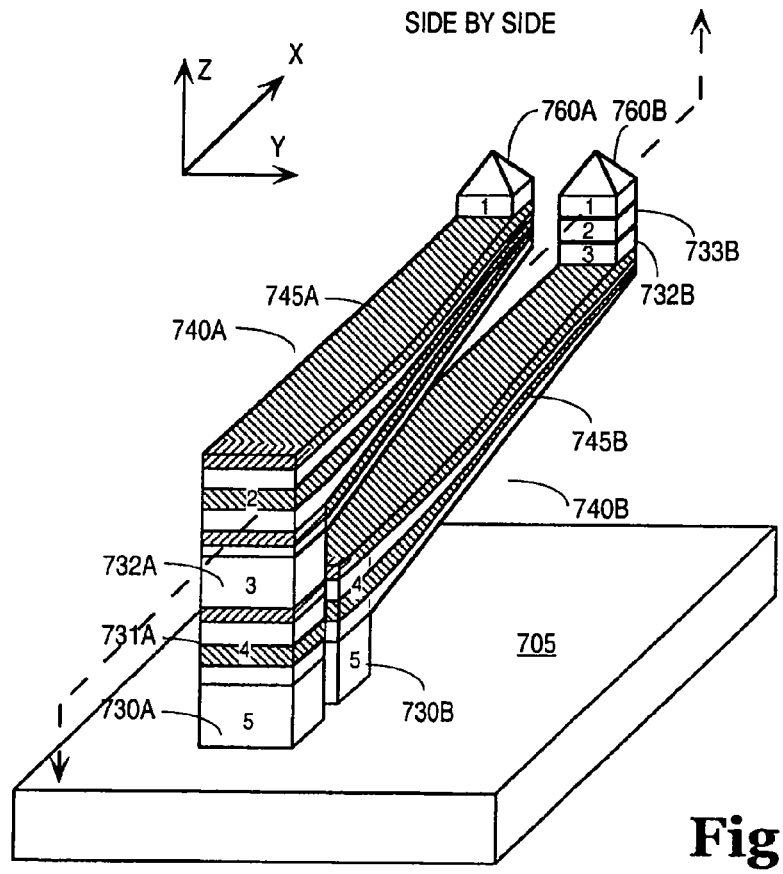
FIG. 21(a) shows a top perspective view of a layout of adjacent interconnection elements fabricated with close spacing tolerances in accordance with an embodiment of the invention.
Figure 21B:
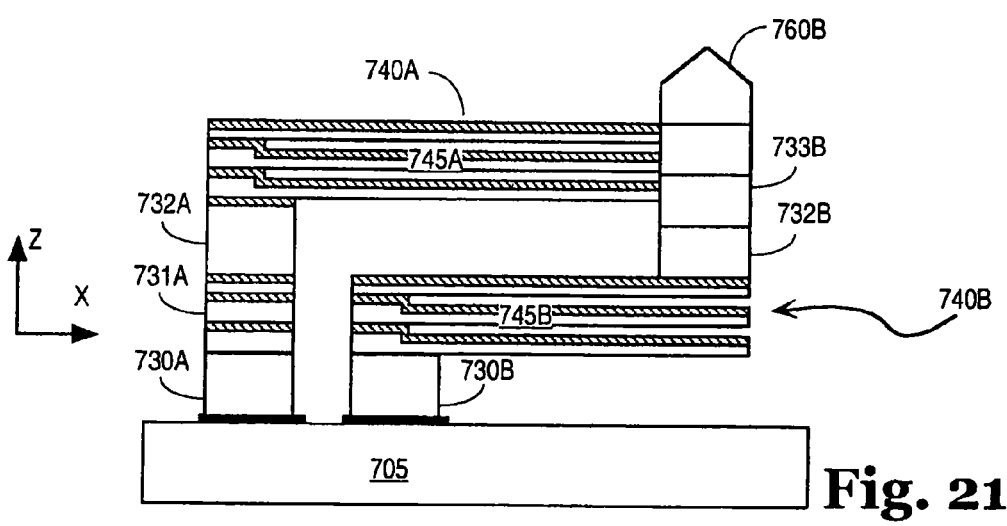
FIG. 21(b) shows a cross-sectional view of the layout of interconnection elements of FIG. 21(a) in accordance with an embodiment of the invention.

By using photolithographic techniques as described above, the interconnection elements according to the invention may be fabricated with an area array pitch corresponding to the reduced pitch of state-of-the-art electronic components. Accordingly, the interconnection elements according to the invention are well-suited to the fine-pitch, close-tolerance environment of micro-electronic components. FIGS. 21(a)-21(b) illustrate one layout where pitch between adjacent interconnection elements may be further minimized. FIGS. 21(a) and 21(b) show two different views of adjacent interconnection elements 740A and 740B. Adjacent interconnection elements 740A and 740B may be fabricated directly on an electronic component or on a sacrificial substrate and transferred to an electronic component similar to the process steps above with respect to FIGS. 7-17(e) and the accompanying text. In this embodiment, adjacent interconnection elements are stacked at slight angles to separate the tip structures. As interconnection elements are depressed, the body of the adjacent interconnection elements do not contact each other, at least in one embodiment.

Interconnection element 740A includes post 730A, body 745A and tip structure 760A. Interconnection element 740B includes post 730B, body 745B and tip structure 760B. As a further enhancement, interconnection element 740B includes spacers 732B and 733B to align interconnection element 740B at a similar height (in a z-direction) as interconnection element 740A. Interconnection element 740A also includes spacers 731A and 732A to separate, in this example, body 745A of interconnection element 740A from underlying interconnection element 740B. In the manner where interconnection elements 740A and 740B are formed simultaneously, spacer 733B of interconnection element 740A and body 745A of interconnection element 740B may be patterned and formed simultaneously. It is to be appreciated that, according to this method, spacer 733B will be formed through the same multiple pattern masking, seeding, deposition, and planarization steps as body 745A. Thus, spacer 733B will be a composite of seed material and conductive material.

Spacers 732A and 732B may be patterned in the same masking material layer (e.g., a masking material layer patterned after seeding an area over body 745A and an area corresponding to subsequently formed body 745B). Spacers 732A and 732B are optional and can be reduced in size to provide, in one aspect, clearance as the interconnection elements are deflected. To the extent they are present, spacers 732A and 732B may be formed of the same conductive material deposition. Spacer 731A is patterned and formed at the same time as body 745B of interconnection element 740B. According to this method, spacer 731A will be formed through the same multiple pattern masking, seeding, deposition, and planarization steps as body 745B. Thus, spacer 731A will be a composite of seed material and conductive material.

In this embodiment, using photolithographic techniques, the length of the rectangularly-shaped body 745A and 745B of adjacent interconnection elements 740A and 740B, respectively, may be varied. Adjacent interconnection elements 740A and 740B are fabricated along the same axis (e.g., x-axis) at their posts (post 730A and 730B) and along a second axis (e.g., y-axis) at their tip structures (tip structures 760A and 760B). As noted, body 745A of interconnection element 740A is patterned directly over post 730B of interconnection element 740B. Accordingly, in an x-direction, the posts (730A and 730B) are axially aligned. At the tip structure of each interconnection element (760A and 760B), interconnection elements 740A and 740B are axially aligned along a y-axis. Thus, FIGS. 21(a) and 21(b) show adjacent interconnection elements that have a greater pitch between their tip structures than their posts. Such a configuration is suitable, for example, to generate an electronic component with a plurality of interconnection elements for probing a second electronic component having its contact pads or terminals arranged along its periphery and having an ultra-fine pitch. It is to be appreciated that the actual pitch between posts and tip structures according to this embodiment can vary to accommodate the pitch of contact pads or terminals on an electronic component to be contacted.

Figure 21C:
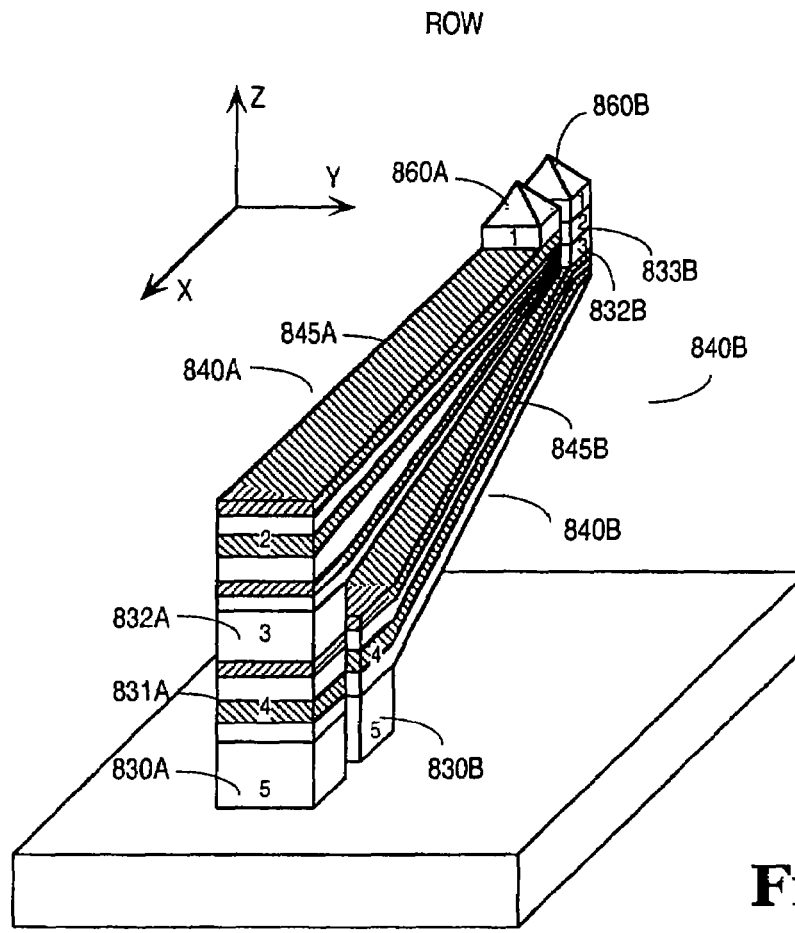
FIG. 21(c) shows a top perspective view of a layout of adjacent interconnection elements fabricated with close spacing tolerances in accordance with another embodiment of the invention.
Figure 21D:
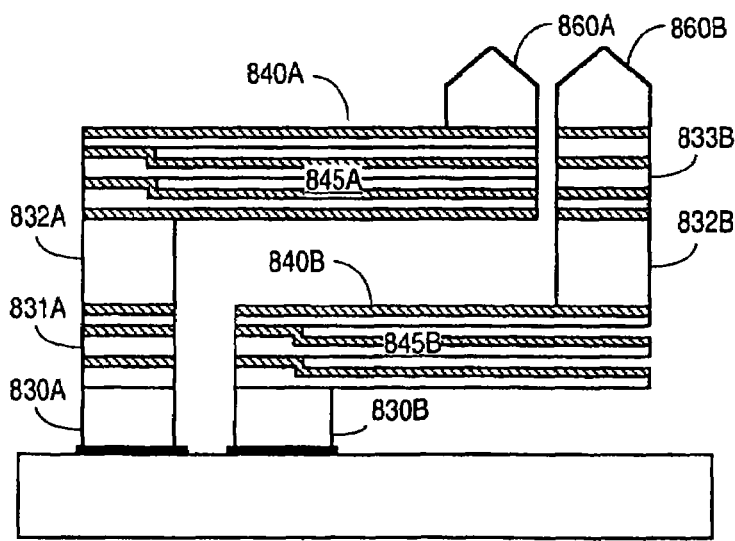
FIG. 21(d) shows a cross-sectional view of the layout of interconnection elements of FIG. 21(c) fabricated in accordance with an embodiment of the invention.

FIG. 21(c) and FIG. 21(d) describe a second orientation of adjacent interconnection elements according to an embodiment of the invention. Interconnection element 840A includes post 830A, body 845A, and tip structure 860A. Interconnection element 840A also includes spacers 831A and 832A formed over post 830A. Spacers 831A and 832A, in this example, separate body 845A from underlying interconnection element 840B. In one embodiment, the spacer is designed so the springs remain separate throughout a range of simultaneous displacement. Interconnection element 840B includes post 830B, body 845B, and tip structure 860B. Interconnection element 840B further includes spacers 832B and 833B that align tip structure 860B with tip structure 860A of interconnection element 840A along a z-axis (similar height). In FIGS. 21(c) and 21(d), interconnection elements 840A and 840B are axially aligned at both their posts and their tip structures.

Using photolithographic techniques, the rectangularly-shaped body of each of the adjacent interconnection elements in FIGS. 21(c) and 21(d) is fabricated to approximately the same length and the resulting interconnection element is offset by the distance between the posts along the same axis. Such a configuration is suitable, for example, to generate an electronic component with a plurality of interconnection elements for probing a second electronic component having its contact pads or terminals arranged in an ultra-fine pitch row along a center line thereof. Again, it is to be appreciated that the actual pitch between posts and tip structures according to this embodiment can vary to accommodate the pitch of contact pads or terminals of an electronic component to be contacted.

Figure 21E:
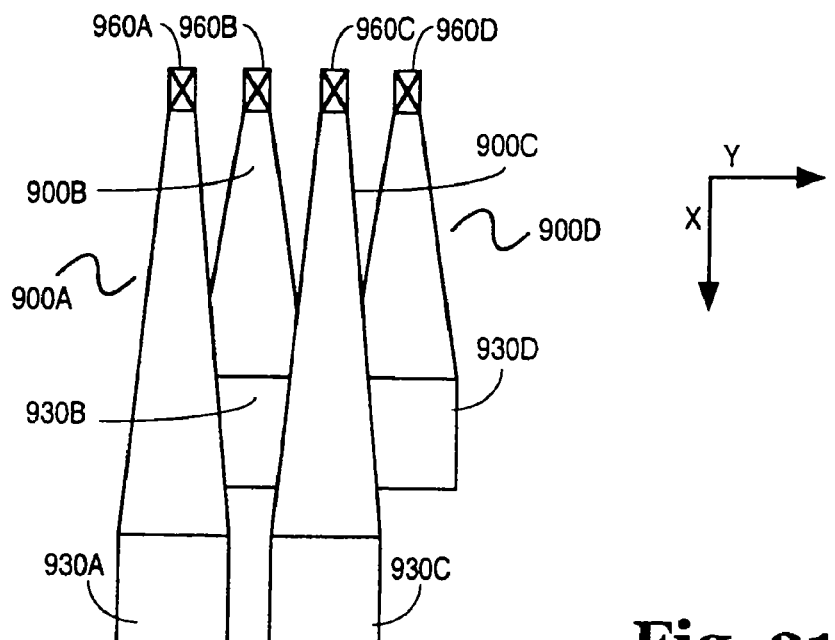
FIG. 21(e) shows a top view illustration of a plurality of interconnection elements affixed to an electronic component in an overlayed fashion so that their tips align in accordance with an embodiment of the invention.
Figure 21F:
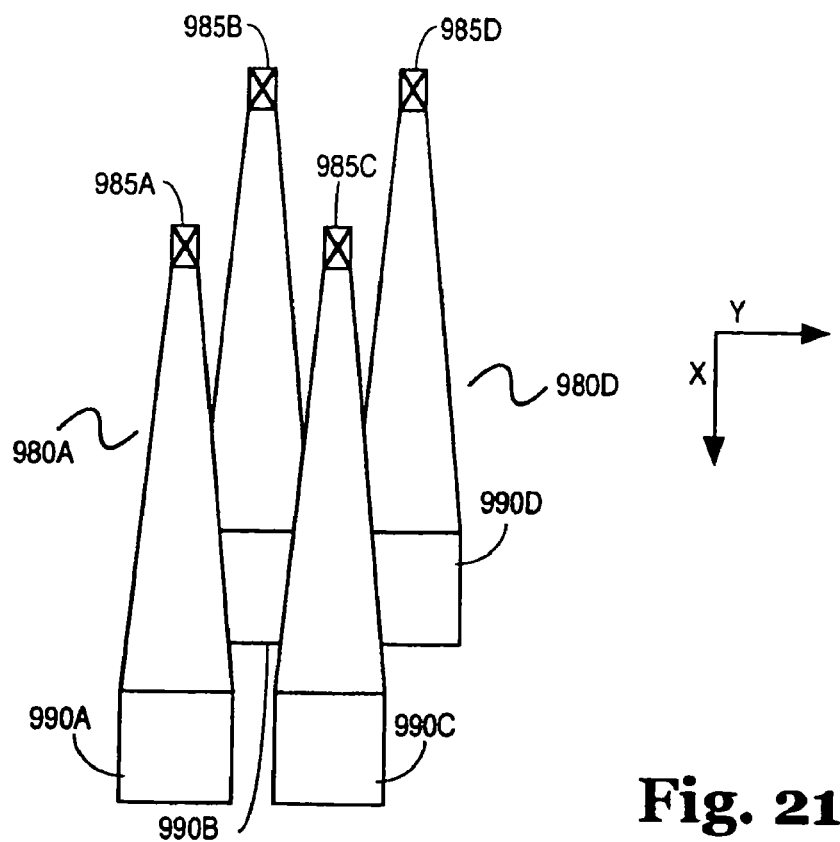
FIG. 21(f) shows a top view illustration of a plurality of interconnection elements affixed to an electronic component in an overlayed fashion so that their tips are staggered in accordance with an embodiment of the invention.

FIG. 21(e) and FIG. 21(f) illustrate still further arrangements using similar overlaying patterning techniques for forming interconnection elements as described with reference to FIGS. 21(a)-21(d). FIG. 21(e) shows a plurality of interconnection elements formed according to the techniques described hereinabove, arranged on an electronic component (not shown). Interconnection elements 900A, 900B, 900C, and 900D are arranged so that their corresponding tip structures 960A, 960B, 960C, and 960D, respectively, are aligned in a y-direction while posts 930A, 930B, 930C, and 930D are staggered in an x-direction. FIG. 21(f) shows a second configuration wherein a plurality of interconnection elements 980A, 980B, 980C, and 980D are arranged on an electronic component (not shown) so that their corresponding tip structures 985A, 985B, 985C, and 985D, respectively are staggered in an x-y direction as are their corresponding posts 990A, 990B, 990C, and 990D, respectively. In this example, respective posts are larger (have a greater xy profile) than the tip structures in this embodiment.

The methods of forming interconnection elements described above using lithographic techniques including multiple masking and planarization steps should not be interpreted as limiting the scope of the invention. It is to be appreciated, that there are other ways of forming interconnection elements to accommodate, for example, dense contact pad or terminal arrays of electronic component device geometries. The lithographic formation including planarization steps described above permit the consistent formation of interconnection elements, including cantilever spring interconnection elements, having similar size and mechanical (e.g., compliance) properties. It is to be appreciated, however, that there may be other ways of forming interconnection elements, including multiple leaf portion interconnection elements that are suitable for the applications contemplated by the invention.

D. Exemplary Body Portions of Spring Interconnect Structures

The above description of forming interconnection elements of the invention is related generally to the formation of cantilever spring interconnection elements having a generally rectangular body with multiple leaf portions. It is to be appreciated, that the invention is not limited to interconnection elements having generally rectangular bodies. FIGS. 22(a)-23(b) show various representative, useful configurations for leaf portions of the body of an interconnection element formed, for example, on sacrificial substrate 110. It is to be appreciated that there may be various other configurations suitable for particular applications for the interconnection elements of the invention. FIGS. 22(a)-23(b) are to be viewed as representative of these various configurations. Like reference numerals from the structure formed in FIGS. 7-17(e) are used to indicate like components and/or materials where appropriate. It is also to be appreciated that, certain properties of an interconnection element adopting leaf portions having one or more of these alternative configurations, will differ from the rectangular beam structure described above. For example, in calculating the maximum stress under load of the tapered structures illustrated in FIG. 22(a) through FIG. 22(g), the width of the leaf portion should be considered.

Figure 22A:
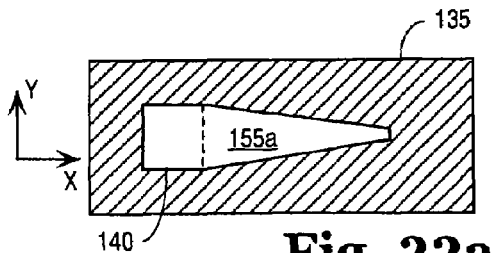
FIG. 22(a) shows a top view of a first exemplary layout of a leaf portion over a substrate in accordance with the invention.
Figure 22B:
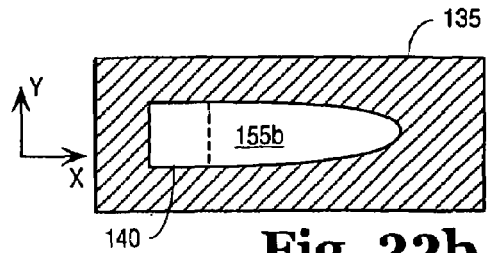
FIG. 22(b) shows a top view of a second exemplary layout of a leaf portion over a substrate in accordance with the invention.

FIG. 22(a)-22(g) show top planar views of various configurations of a leaf portion of an interconnection element formed on substrate 110 in an xy plane. FIG. 22(a) shows, for example, first body material 155a configured to have a taper in the y-direction ("y-taper") as the material laterally extends (in an x-direction) from an area over the surface of, for example, second tip material 140. This configuration more evenly distributes the stress on the interconnection element by reducing the size of the extremity of the leaf portion (e.g., the cantilever body) of the interconnection element. In FIG. 22(a), a laterally extending portion of first body material 155a is depicted with substantially linear edges. It is to be appreciated that the edges need not be substantially linear but may be curved such as, for example, in a concave manner. FIG. 22(b) shows laterally extending first body material 155b with substantially convex edges. The patterning of the masking material layer, such as first masking material layer 135, dictates the shape of the leaf portion.

Figure 22D:
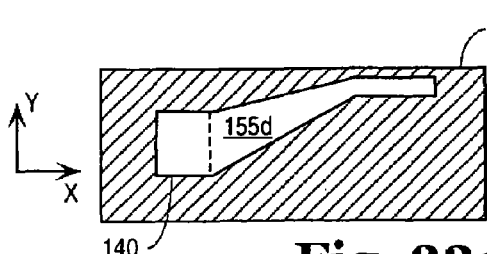
FIG. 22(d) shows a top view of a fourth exemplary layout of a leaf portion over a substrate in accordance with the invention.
Figure 22C:
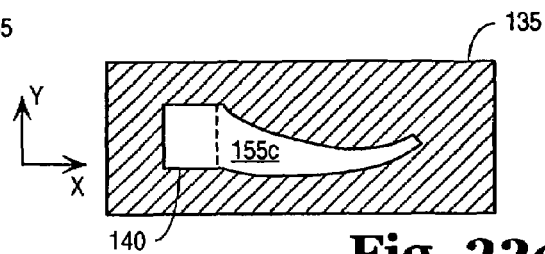
FIG. 22(c) shows a top view of a third exemplary layout of a leaf portion over a substrate in accordance with the invention.
Figure 22F:
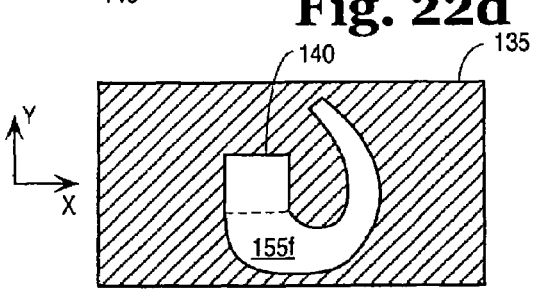
FIG. 22(f) shows a top view of a sixth exemplary layout of a leaf portion over a substrate in accordance with the invention.
Figure 22E:
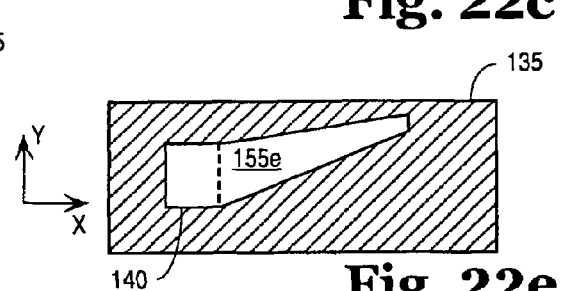
FIG. 22(e) shows a top view of a fifth exemplary layout of a leaf portion over a substrate in accordance with the invention.
Figure 22G:
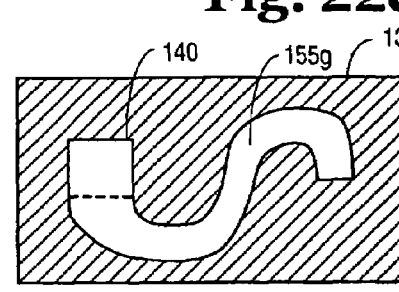
FIG. 22(g) shows a top view of a seventh exemplary layout of a leaf portion over the substrate in accordance with the invention.

FIG. 22(c) shows a third configuration of a leaf portion of an interconnection element in accordance with a first embodiment of the invention. In this configuration, first body material 155c extends laterally (in an x-direction) and transversely (in a y-direction) from, for example, second tip material 140 to form a curved leaf portion. FIGS. 22(d) and 22(e) show a fourth and a fifth configuration, respectively, where a leaf portion 155d and 155e, respectively, extend laterally and transversely. The laterally and transversely extending leaf portions may be desirous, for example, when fabricating interconnection elements to particularly minimize the pitch between adjacent interconnection elements. FIG. 22(f) shows a sixth configuration of a leaf portion wherein first body material 155f partially encircles second tip material 140. FIG. 22(g) shows a seventh configuration of a leaf portion having an "S" shape in an xy plane. Again, the patterning of the masking material layer will dictate the shape of leaf portion of first body material 155g.

Figure 23A:
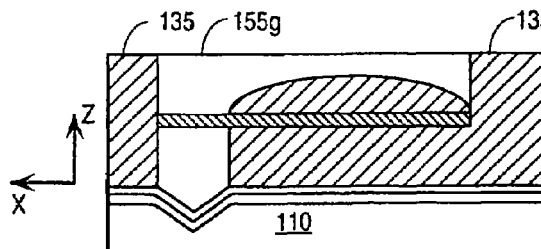
FIG. 23(a) shows a cross-sectional side view of a seventh exemplary layout of a leaf portion over a substrate in accordance with the invention.
Figure 23B:
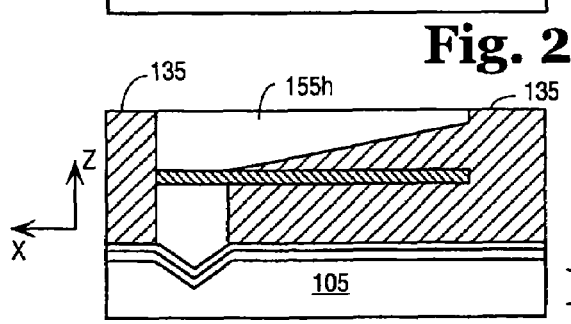
FIG. 23(b) shows a cross-sectional side view of an eighth exemplary layout of a leaf portion over a substrate in accordance with the invention.

FIG. 23(a) and FIG. 23(b) show eighth and ninth configurations, respectively, of a leaf portion of the interconnection element in accordance with an embodiment of the invention in an xz plane. FIG. 23(a) shows first body material 155g having a planar upper surface and a concave lower surface. FIG. 23(b) shows first body material 155h having a planar superior surface and a linearly increasing inferior surface toward the extremity to form a beveled leaf portion. First body materials 155g and 155h can be formed in this manner in a number of ways, including varying the light source to shape the underlying and adjacent photoresist that forms the masking material and electroplating in the presence of a resistive layer mask to distribute the electroplated material where desired.

The above description relates primarily to interconnection elements having a body of cantilever leaf portions of similar dimension. It is to be appreciated that other configurations for the leaf portions are contemplated. The following figures are representative of the various configurations contemplated by the invention. Each of the different configurations may be formed using the formation techniques described above with reference to FIGS. 7-17(e) with variations in one or more of the masking layer patterning, the body layer depositions, and the planarization steps.

FIG. 24(a) and FIG. 24(b) illustrate an embodiment of an interconnection element having a body of leaf portions of various dimensions. In FIG. 24(a), interconnection element 1800 includes post 1810, body 1805, and tip structure 1815. Body 1805 includes four leaf portions 1801, 1802, 1803, and 1804. In this embodiment, the length and the thickness of each leaf portion is varied. Thus, the length of leaf portion 1801, "$l_1$," is shorter than the length of second leaf portion 1802, "$l_2$," which is shorter than the length of leaf portion 1803, "$l_3$," which is shorter than the length of leaf portion 1804, "$l_4$." The thickness of first leaf portion 1801, "$t_1$," is similarly less than the thickness of second leaf portion 1802, "$t_2$," which has a material stress less than the maximum stress for a desired deflection distance, and is less than the thickness of third leaf portion 1803, "$t_3$," which is less than the thickness of fourth leaf portion 1804, "$t_4$." FIG. 24(b) shows interconnection element 1800 subjected to a force at tip structure 815 and illustrates the compliance of body 1805. An opposite configuration (i.e., shorter is thicker) is also contemplated for the situation where a similar spring constant is desired among the leaf portions.

Figure 25A:
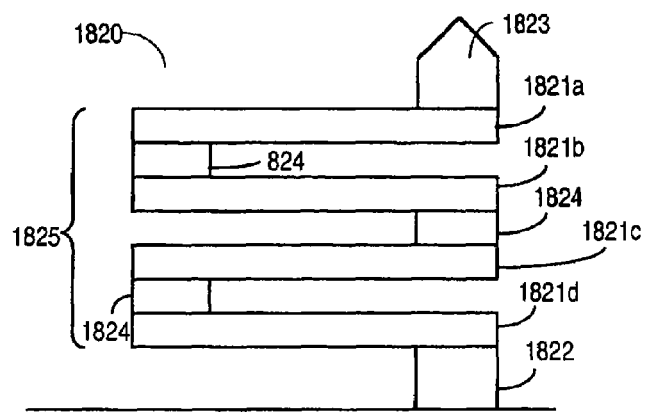
FIG. 25(a) shows an embodiment of an interconnection element of the invention having a plurality of leaf portions coupled to one another through non-aligned supports.
Figure 25B:
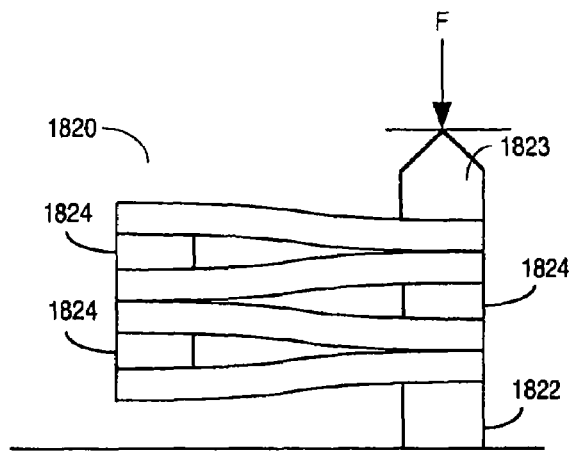
FIG. 25(b) shows the interconnection element of FIG. 25(a) subjected to a force at its contact region.

FIG. 25(a) and FIG. 25(b) show another alternative configuration for the interconnection element of the invention. In FIG. 25(a), interconnection element 1820 includes post 1822, tip structure 1823, and body 1825. Body 1825 includes four leaf portions 1821a, 1821b, 1821c, and 1821d of similar length each having a proximal and a distal end. Tip structure 1823 is coupled at the distal end of superiorly-located leaf portion 1821a. Post 1822 is coupled at the distal end of inferiorly-located leaf portion 1821d. Supports 1824 coupled the adjacent leaf portions staggers between either the proximal end or the distal end of adjacent leaf portions. FIG. 25(b) shows the interconnection element of FIG. 25(a) with a force applied at tip structure 1823. The deflection of interconnection element 1820 will generally not result in significant wiping of a contact pad or terminal.

Figure 26A:
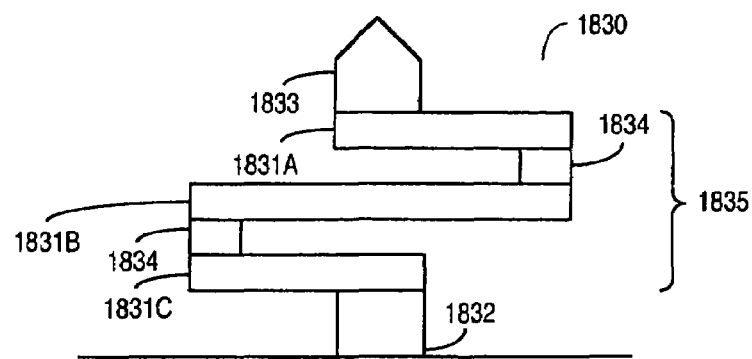
FIG. 26(a) shows an embodiment of an interconnection element of the invention having a plurality of variable length leaf portions.
Figure 26B:
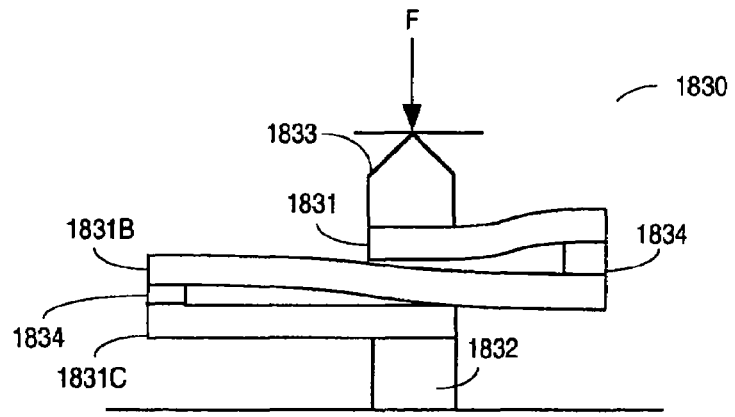
FIG. 26(b) shows the interconnection element of FIG. 26(a) subjected to a force at its contact region.

FIG. 26(a) and FIG. 26(b) show yet another configuration for the interconnection element of the invention. In FIG. 26(a), interconnection element 1830 includes post 1832, tip structure 1833, and body 1835. Body 1835 includes three leaf portions 1831a, 1831b, and 1831c separated by supports 1834. In this configuration, tip structure 1833 is aligned with post 1832. The individual length of leaf portion 1831b is greater than either leaf portion 1831a or leaf portion 1831b. FIG. 26(b) shows the interconnection element of FIG. 26(a) with a force applied at tip structure 1833. The deflection of interconnection element 1830 will generally not result in significant wiping of a contact pad or terminal.

Figure 27A:
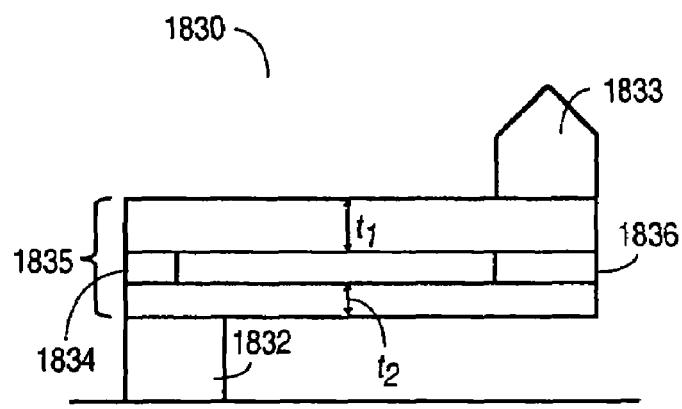
FIG. 27(a) shows an embodiment of an interconnection element of the invention having a plurality of leaf portions coupled to one another at their proximal and distal ends.
Figure 27B:
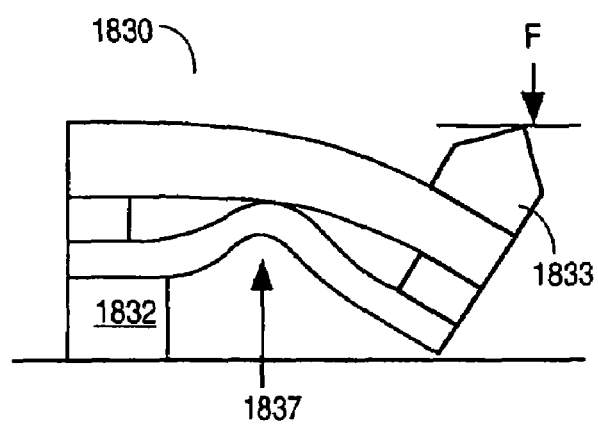
FIG. 27(b) shows the interconnection element of FIG. 27(a) subjected to a force at its contact region.

FIG. 27(a) and FIG. 27(b) show another embodiment of the interconnection element of the invention. FIG. 27(a) shows interconnection element 1830 including post 1832, tip structure 1833, and body 1835. Body 1835 includes, in this case, two leaf portions. Each leaf portion is coupled to the adjacent leaf portion by supports 1834 and 1836 at a proximal end and at a distal end, respectively. The thickness of the superiorly-located leaf portion is greater than the thickness of the inferiorly-located leaf portion ($t_1 > t_2$). FIG. 27(b) shows the structure of FIG. 27(a) after subjecting the interconnection element to a force at tip structure 1833. FIG. 27(b) shows that the inferiorly-located leaf portion of body 1835 buckles at point 1837 in response to the force applied at tip structure 1833. In this embodiment, the buckling is facilitated by the inferiorly-located leaf portion having a thickness less than the other leaf portion of body 1835. The buckling action may permit a reduction in the number of leaf portions necessary to achieve a desired deflection for a unit force. With this configuration, the wiping of the interconnection element against a contact pad or terminal in response to a force applied to the tip structure of interconnection element 1830 may be less than a cantilever configuration.

Figure 28A:
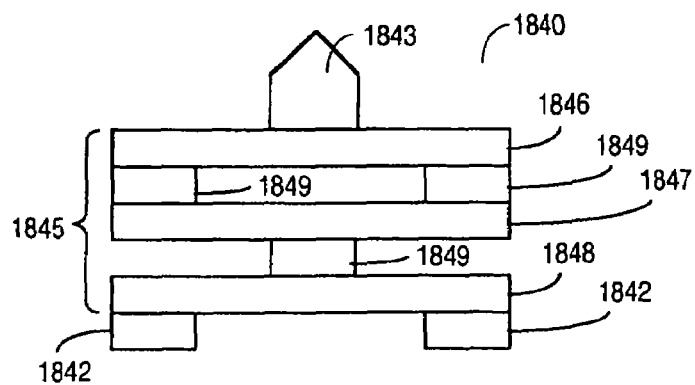
FIG. 28(a) shows an embodiment of an interconnection element of the invention having a plurality of leaf portions coupled to another by staggered supports and a contact region of a tip coupled to a surface of a superiorly-located leaf portion between its ends.
Figure 28B:
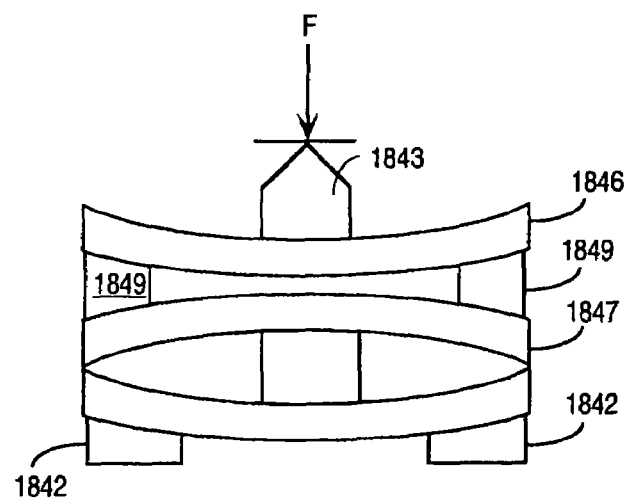
FIG. 28(b) shows the interconnection element of FIG. 28(a) subjected to a force at its contact region.
Figure 29A:
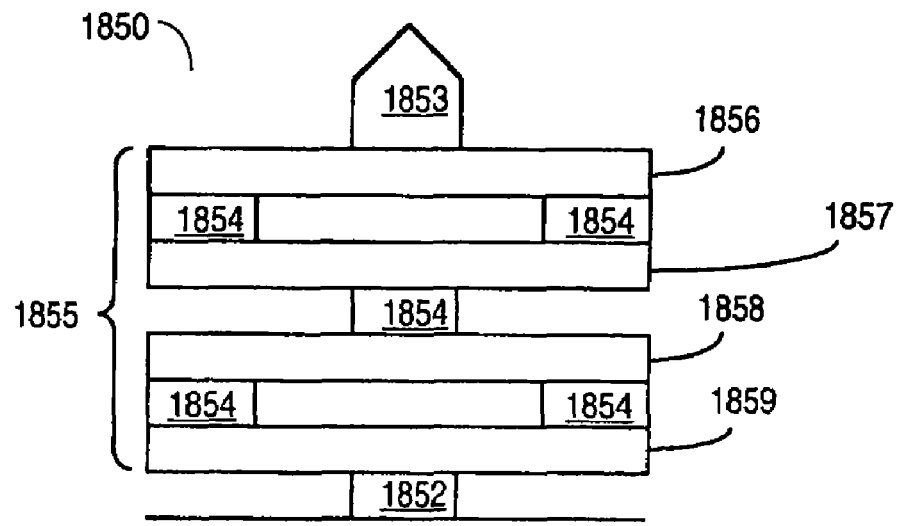
FIG. 29(a) shows a side view of an embodiment of an interconnection element of the invention having a plurality of cylindrical leaf portions coupled to one another by staggered supports.
Figure 29B:
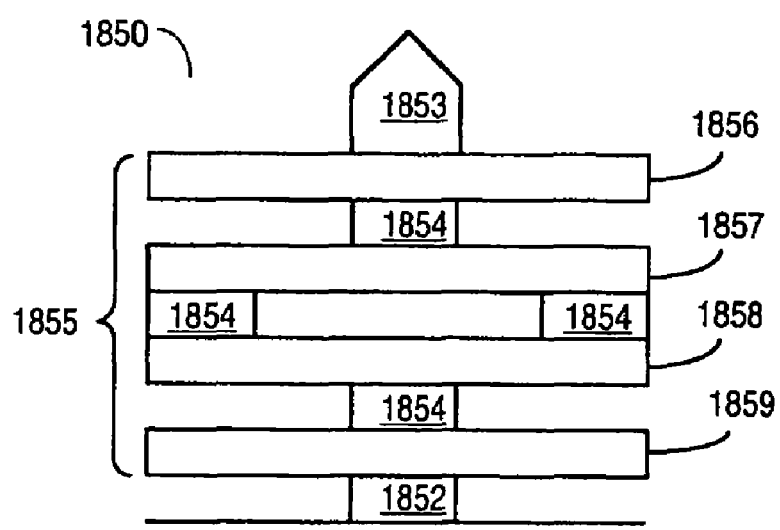
FIG. 29(b) shows a second side view of the interconnection element of FIG. 29(a).
Figure 29C:
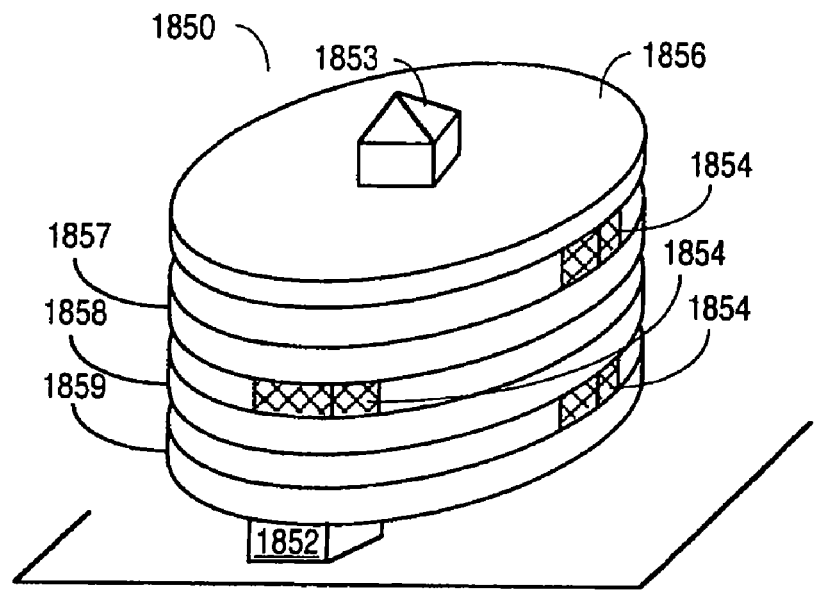
FIG. 29(c) shows a top perspective view of the interconnection element of FIG. 29(a).
Figure 29D:
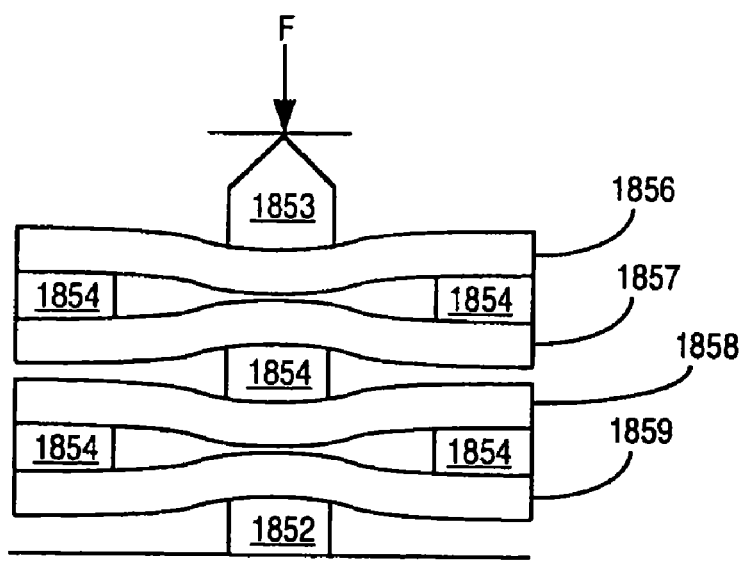
FIG. 29(d) shows the interconnection element of FIG. 29(a) subjected to a force at its contact region.

FIG. 28(*a*) and FIG. 28(*b*) show still another configuration for an interconnection element of the invention. In FIG. 28(*a*), interconnection element 1840 includes post 1842, tip structure 1843, and body 1835. Body 1835 includes, in this case, three leaf portions 1846, 1847 and 1848. The superior and inferior surfaces of the leaf portions may be a rectangular beam, including squares, with or without an opening therethrough. Adjacent leaf portions are separated by supports 1849. Supports 1849 are arranged in staggered fashion between adjacent leaf portions. FIG. 28(*b*) shows interconnection element 1840 with a force applied at tip structure 1843. FIG. 28(*b*) shows that the staggeredly-coupled leaf portions bow in opposite directions resulting in no wiping of the tip structure of the interconnection element against a contact pad or terminal.

FIGS. 29(*a*)-29(*d*) illustrate a further embodiment of an interconnection element according to the invention. FIG. 29(*a*) shows a planar side view, FIG. 29(*b*) a second planar side view, and FIG. 29(*c*) shows a perspective top view of interconnection element 1850 having post 1852, tip structure 1853, and body 1855. In this embodiment, body 1855 includes four leaf portions 1856, 1857, 1858, and 1859 that are each cylindrical leaf portions having, with the exception of leaf portion 1856, an opening therethrough. The cylindrically-shaped leaf portions are coupled to one another through staggered supports 1854. It is to be appreciated that the individual masking material layers may be modified to pattern cylindrical leaf portions as well as staggered supports or coupling. FIG. 29(*d*) shows interconnection element 1850 having a force applied at tip structure 1853. FIG. 29(*d*) schematically illustrates the deformation of the leaf portions in response to a force applied at tip structure 1853 of body 1855 resulting in no wiping against a contact pad or terminal. Unlike interconnection elements having a plurality of cantilever leaf portions, there generally is no "travel-to-contact" component whereby a displaced leaf portion travels a distance to contact an adjacent leaf portion. Instead, an interconnection element of a plurality of cylindrical leaf portions behaves like a coil spring in that the leaf portions will continuously deform until the leaf portions strike one another at a maximum deflection.

Figure 30:
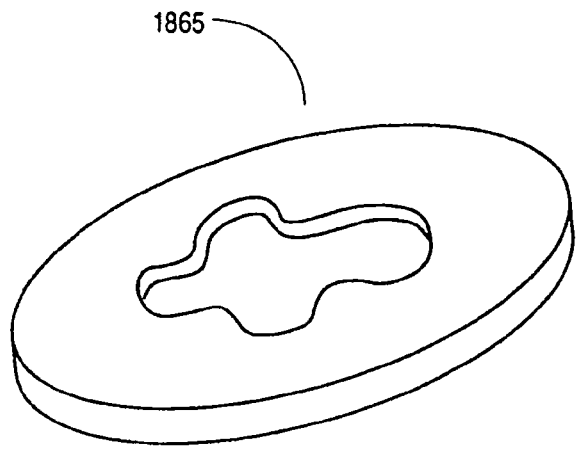
FIG. 30 shows a top perspective view of an embodiment of a leaf portion of an interconnection element of the invention having a cylindrical shape with a "clover leaf"-shaped opening.

It is to be appreciated that a cylindrical or other leaf portion may or may not have an opening therethrough. In the situation where an opening is desired, the opening may or may not be circular. FIG. 30 shows leaf portion 1855 with a "clover-leaf" opening therethrough.

In general, the behavior of interconnection elements having stacked cylindrical leaf portions is different than the behavior of interconnection elements having layered cantilever leaf portions described above. Each cylindrical leaf portion has a spring constant, k, and a deflection to reach maximum stress. The spring constant of the stacked cylindrical interconnection element is determined by the spring constant of an individual leaf portion ($k=k_{leaf}$) and the maximum deflection is determined by the deflection distance of the total number of individual leaf portions: $\sigma_{max}=n\cdot\delta_{leaf}$, where n is the number of leaf portions. This differs, for example, from a stacked rectangular leaf portion like that of FIG. 3 (e.g., cantilever) interconnection element where the spring constant is determined by the number of leaf portions ($k=n\cdot k_{leaf}$) and the maximum stress by the deflection distance of a leaf portion: $\sigma_{max}=\delta_{leaf}$.

Figure 31:
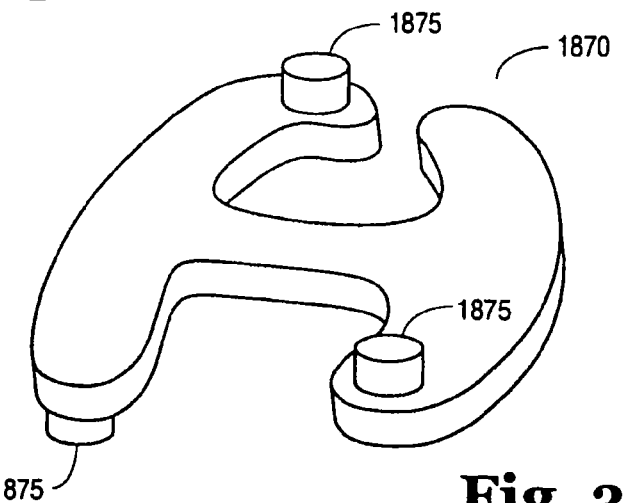
FIG. 31 shows a top perspective view of an embodiment of a leaf portion of an interconnection element of the invention having a "H"-shape.
Figure 32:
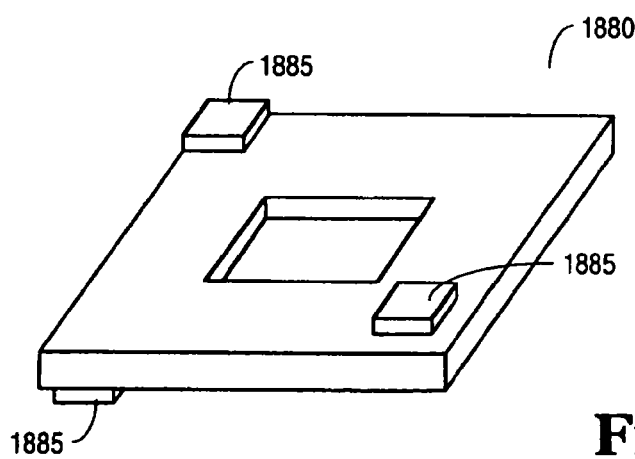
FIG. 32 shows a top perspective view of an embodiment of a leaf portion of an interconnection element of the invention having a rectangular shape with a rectangularly-shaped opening.

FIG. 31 illustrates still a further embodiment, where leaf portion 1870 of a body of interconnection element is "H"-shaped with supports 1875 patterned at diagonals from one another. Such a pattern will tend to stress the material by working the middle portion of the "H"-shape in a torsional manner, in response to a load or force applied to the interconnection element. The reduction in stress will permit a reduction in the number of leaf portions necessary for a desired deflection. FIG. 32 shows leaf portion 1880 having a rectangular configuration with an opening therethrough and support portions 1885 at diagonals. It is to be appreciated that there are many other configurations in addition to the ones described above. Accordingly, the examples of interconnection elements and leaf portions described should be regarded in an exemplary rather than a restrictive sense.

E. Alternative Applications of Spring Interconnect Structures

Figure 33A:
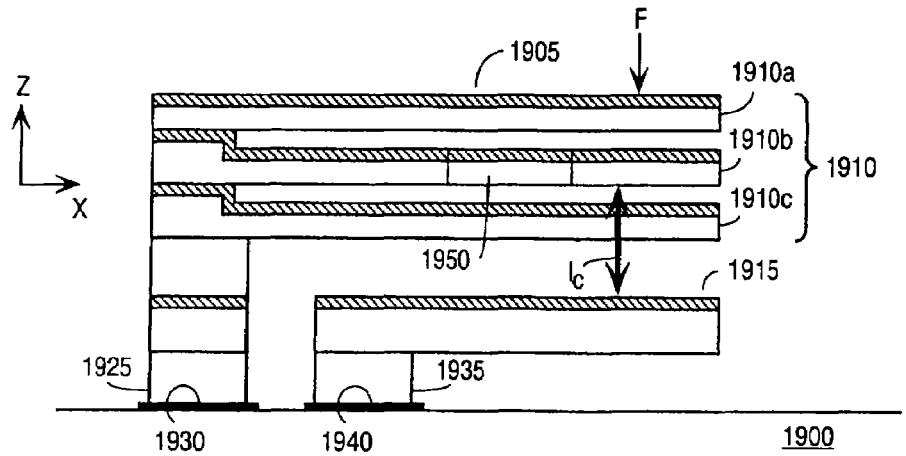
FIG. 33(a) shows a cross-sectional side view of a layout of adjacent interconnection elements collectively forming an apparatus suitable as a micro-switch.
Figure 33B:
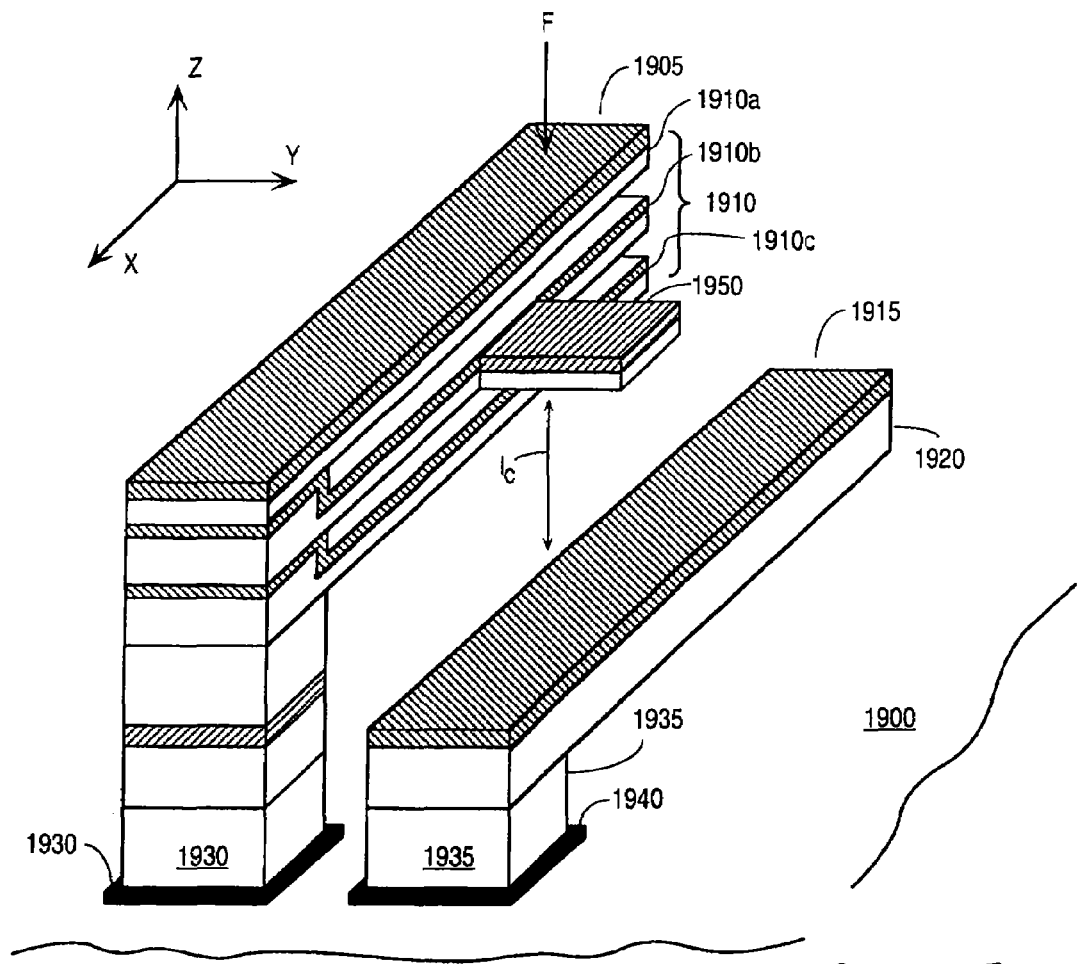
FIG. 33(b) shows a top perspective view of the layout of FIG. 33(a).
Figure 33C:
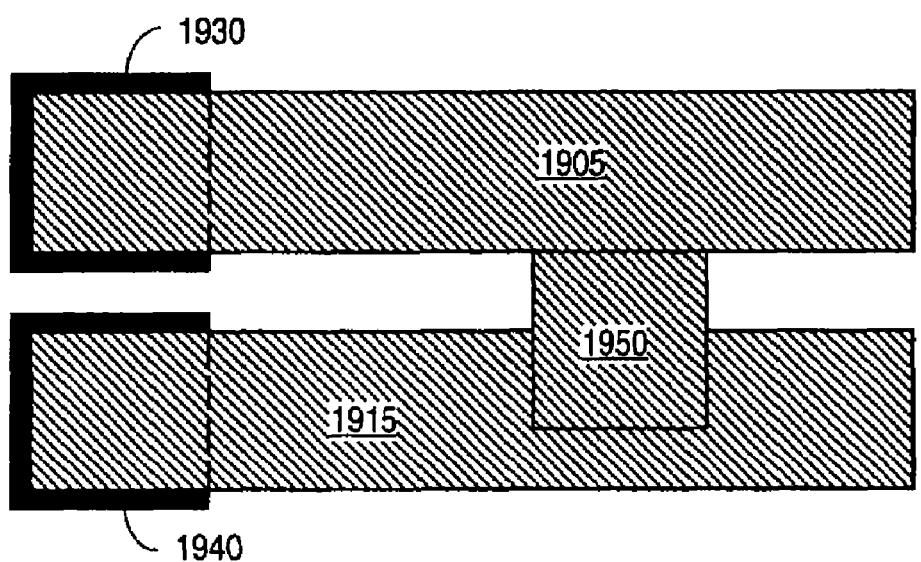
FIG. 33(c) shows a planar top view of the layout of FIG. 33(a).

In addition to the uses of the interconnection element of the invention as an interconnection element between two electronic components, FIGS. 33(*a*)-33(*c*) show an embodiment where adjacent interconnection elements form a switch, e.g., a micro-switch, or a detector. FIG. 33(*a*) shows a side view of adjacent interconnection elements 1905 and 1915. FIG. 33(*b*) is a top perspective view of interconnection elements 1905 and 1915. FIG. 33(*c*) is a top view of interconnection elements 1905 and 1915.

Interconnection element 1905 includes post 1925 coupled to contact pad or terminal 1930 on electronic component 1900. Interconnection element 1905 also includes spring 1910 of a plurality (e.g., three) of leaf portions coupled to post 1925. The inferior leaf portion includes laterally extending tab portion 1950.

Interconnection element 1915 includes post 1930 coupled to contact pad or terminal 1940 on electronic component 1900. Interconnection element 1915 also includes body 1920 of, in this example, a single beam, coupled to post 1930.

Interconnection element 1905 and interconnection element 1915 may be formed according to techniques described above, for example, with regard to the formation of interconnection elements according to FIGS. 21(*a*)-21(*d*) and the accompanying text. Modifications regarding masking material openings and body (e.g., conductive) material deposition are accommodated to account for the alignment of the interconnection elements on electronic component 1900, for tab portion 1950 of interconnection element 1905, and for the differences in body portions of the respective interconnection elements. Such modifications will be understood by those of ordinary skill in the art based on the teachings discussed above and are therefore not presented herein.

Interconnection element 1905 and interconnection element 1915 have been illustrated and described without a tip structure. The embodiment described with reference to FIGS. 33(*a*)-33(*c*), as with the other embodiments of interconnection elements described herein, does not require a tip structure to function. The tip structure in other embodiments defined herein offers one contact point for the interconnection element. It is to be appreciated that this contact point need not be established by the interconnection element, but can be established by an external source such as an electronic component or other substrate or structure contacting the interconnection element. For example, a contact point may be in the form of a traditional pad, a post, a pointed post, or other structure.

Referring to FIGS. 33(*a*)-33(*c*), tab portion 1950 laterally extends from body 1910. Tab portion 1950 is separated from a superior surface of body 1920 of interconnection element 1915 by a distance, lc.

When a force, F, is applied to the superior surface of body 1910, body 1910 is deflected toward the surface of electronic component 1900. Initially body portion 1910*a* is deflected.

Body portion 1910a contacts body portion 1910b and deflects body portion 1910b toward electronic component 1900. Further deflection causes body portion 1910b to contact body portion 1910c and deflect body portion 1910c toward electronic component 1900.

Tab portion 1950 extends from body portion 1910c and is adapted to contact the superior surface of body 1920 upon sufficient deflection of body portion 1910c. The contacting of tab portion 1950 with a superior surface of body 1920 acts, in one sense, as a switch to, for example, close a circuit between the interconnection elements. Alternatively, the electrical interconnection between adjacent bodies 1910 and 1920 may be used to detect a capacitance between two electrodes. The capacitance can be correlated to a distance.

In one case, body 1920 may be fairly rigid and the deflection of tab portion 1950 onto body 1920 does not cause body 1920 to significantly deflect toward the surface of substrate 1900. This is shown in the embodiment illustrated in FIGS. 33(a)-33(c) wherein body 1920 of interconnection element 1915 is more robust, particularly in the z-direction, than the leaf portions of body 1910 of interconnection element 1905. The deflection of body 1910 toward the surface of substrate 1900 may be limited by, for example, a travel stop. Alternatively, body 1920 of interconnection element 1915 may deflect toward the surface of substrate 1900 in response to a force such as a force applied by tab portion 1950 of interconnection element 1905. In such case, body 1920 of interconnection element 1915 may be comprised of a plurality of leaf portions. Finally, body 1920 may itself include a tab portion to, upon deflection, contact another interconnection element or a terminal, for example, to close a circuit. In this manner, a device such as a tiered-relay may be formed.

In the above embodiment, mechanical and electrical contact was established between two adjacent interconnection elements. It is to be appreciated that mechanical and electrical contact may also be established in one interconnection element so that the interconnection itself acts as a switch. One way this may be accomplished is forming an interconnection element similar to the interconnection elements described above with reference to FIGS. 7-17e and the accompanying text and electrically isolating one or more leaf portions of the interconnection elements. The application of a force to the body of the interconnection element will cause the isolated leaf portion(s) to contact other leaf portions and electrical contact.

Figure 34:
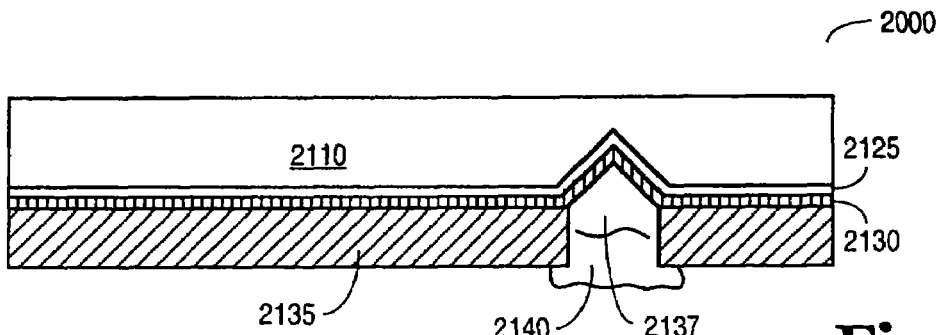
FIG. 34 shows a second method of fabricating an interconnection element on a substrate and shows a substrate having a tip structure formed through a masking material layer.

F. Alternative Fabrication Techniques of a Multi-Leaf or Multi-Tier Spring Interconnection Element FIGS. 34-52 illustrate a second fabrication technique of forming a multiple leaf portion spring interconnection structure. As the starting point for this embodiment, a structure similar to the structure shown in FIG. 10 is presented. FIG. 34 shows structure 2110 that is, for example, a sacrificial substrate such as a semiconductor substrate. Substrate 2110 has a pyramidally-shaped depression formed therein as an outline for a portion of a tip structure to be formed. Overlying the surface of substrate 2110 is release layer 2125 of, for example, a metal such as aluminum deposited to a thickness of approximately 5,000 angstroms using conventional deposition techniques. Overlying release layer 2125 on the surface of substrate 2110 is seed layer 2130. Seed layer 2130 is, for example, copper, palladium, or titanium-tungsten that establishes an appropriate potential for an electrolytic process. Overlying seed layer 2130 is first masking material layer 2135. First masking material layer 2135 is, for example, a photopolymer (e.g., a negative photoresist) introduced onto the surface of substrate 2110 to a thickness of the desired height of a tip structure of an interconnection element taking into consideration the possibility of planarizing a portion of first masking material 2135 with tip structure material. Approximately 1-4 mils (25-100 μm) is a useful height range. First masking material layer 2135 is patterned to have an opening over the pyramidally-shaped depression in substrate 2110. Alternatively, first conductive material layer mask 2150 may be introduced as a plurality of traces, each trace corresponding to an area over substrate 2110 as well as the tip structure formed in substrate 2110 where a body of an interconnection element is to be formed to serve, in one manner, as an electroform whereupon the body can be fabricated.

FIG. 34 also shows tip structure material introduced onto substrate 2110. Similar to the tip structure material described above with reference to FIG. 9 and FIG. 10 and the accompanying text, the tip structure material includes first tip material 2137 of, for example, palladium, gold, rhodium and their alloys, including, but not limited to, alloys of nickel and cobalt introduced to a thickness of about 1 to 5 μm or more—even tens of microns or more. Suitable introduction techniques include, but are not limited to, electroplating, chemical vapor deposition, sputter deposition, and electroless plating. The tip structure also includes second tip material 2140 of, for example, an alloy of nickel and cobalt introduced to a height approximating the height of first masking material layer 2135.

Figure 35:
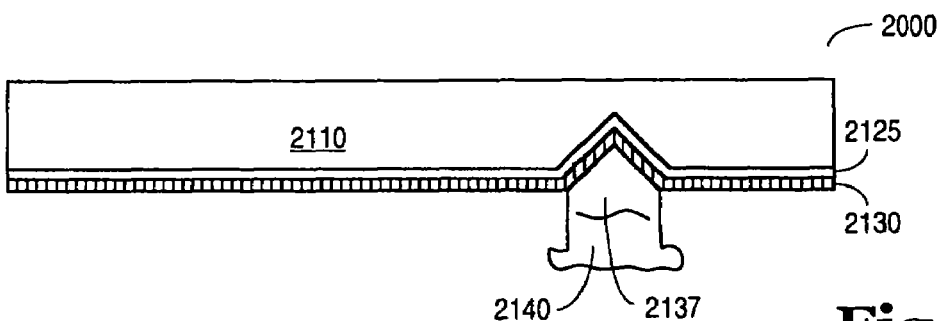
FIG. 35 shows the structure of FIG. 34 after removing the masking material layer that defines the pattern for the tip structure.

FIG. 35 shows structure 2000 after the removal of first masking material layer 2135. In embodiment, wherein first masking material layer is a photoresist, first masking material layer 2135 may be removed by an etch, reactive ion etching, laser ablation, or wet etching.

Figure 36:
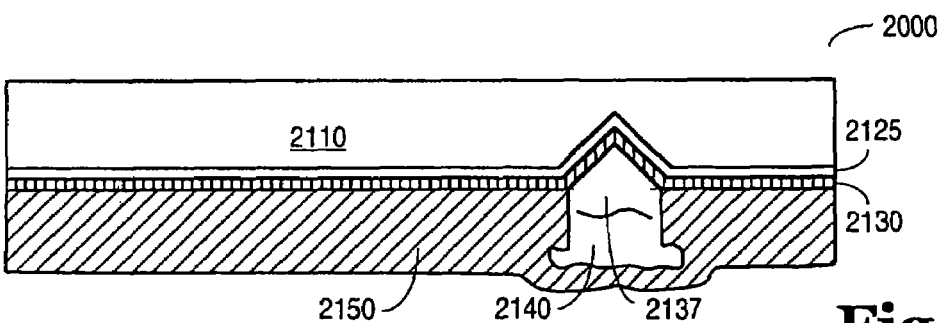
FIG. 36 shows the structure of FIG. 34 after introducing a first conductive material mask layer over the substrate.

FIG. 36 shows structure 2000 after the introduction of first conductive material layer mask 2150. First conductive material layer mask 2150 is, for example, a metal such as copper introduced by an electrolytic process. First conductive material layer mask 2150 is conformally introduced over the surface of substrate 2110. First conductive material layer mask 2150 may be introduced by way of a blanket deposition over substrate 2110. Alternatively, first conductive material layer mask 2150 may be introduced as multiple, non-contiguous regions or traces, each region corresponding to an area over substrate 2110 as well as the tip structure formed in substrate 2110 where a body of an interconnection element is to be formed to serve, in one manner, as an electroform whereupon the body can be fabricated.

Figure 37:
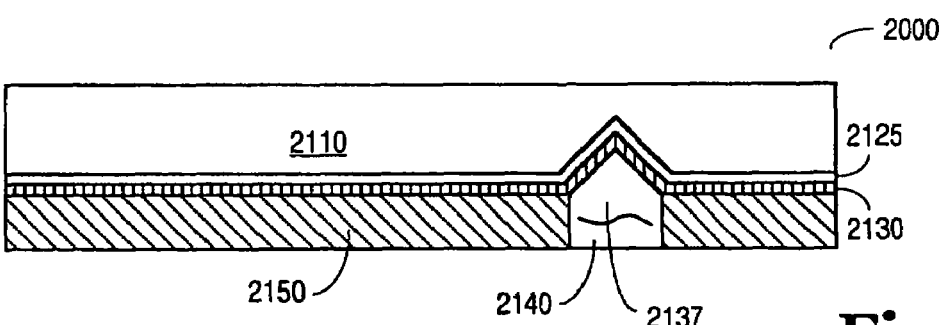
FIG. 37 shows the structure of FIG. 34 after planarizing the first conductive material mask layer and the tip structure.

FIG. 37 shows structure 2000 after a planarization procedure such as a chemical-mechanical polish to planarize first conductive material layer mask 2150 and the tip structure. A planarization procedure establishes, in one aspect, the height of the tip structure.

Figure 38:
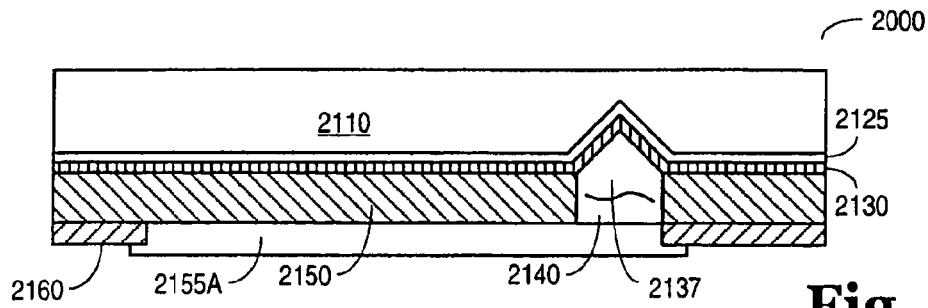
FIG. 38 shows the structure of FIG. 34 after patterning a second masking material layer and introducing a first body material.

FIG. 38 shows structure 2000 after the introduction of second masking material layer 2160 serving as a pattern for a body portion, such as a leaf portion, of an interconnection element. Second masking material layer 2160 is, for example, a photopolymer such as a negative photoresist. FIG. 38 also shows the introduction of first body material 2155a over surface of substrate 2110. In one embodiment, first body material 2155a is a conductive material introduced by an electroplating process such as an electroplate alloy of nickel-cobalt. First body material 2155a is introduced to a thickness approximating the thickness of second masking material layer 2160. It is to be appreciated that the amount deposited and the thickness of first body material 2155a will depend, in part, on the desired thickness of the particular leaf portion of the body of the interconnection element being formed.

Figure 39:
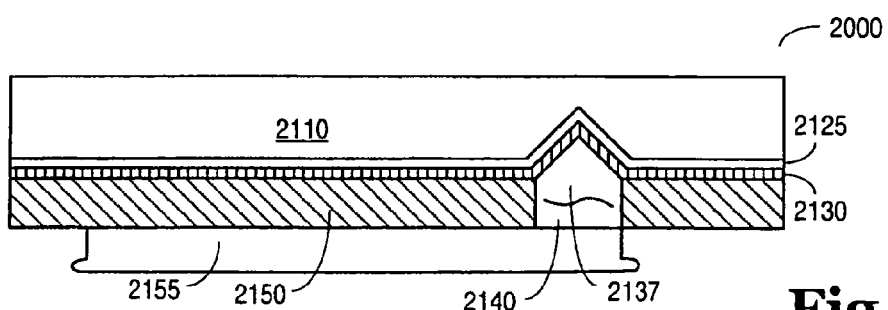
FIG. 39 shows the structure of FIG. 34 after removing the second masking material layer.

FIG. 39 shows structure 2000 after the removal of second masking material layer 2160. In the embodiment where second masking material layer 2160 is a photoresist, the material may be removed by etch, laser ablation, or wet etching.

Figure 40:
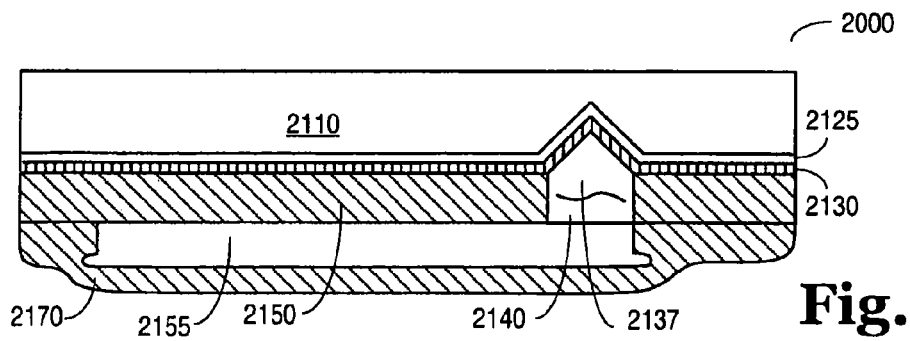
FIG. 40 shows the structure of FIG. 34 after introducing a second conductive material layer mask over the structure.

After the removal of second masking material layer 2160, FIG. 40 shows the introduction over the surface of substrate 2110 of second conductive material layer mask 2170. In one embodiment, second conductive material layer mask 2170 is a material similar to first conductive material layer mask 2150, such as copper introduced through an electrolytic process.

Figure 41:
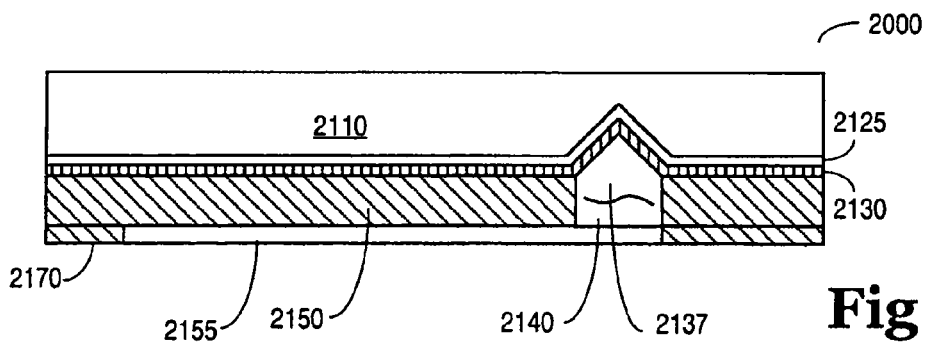
FIG. 41 shows the structure of FIG. 34 after planarizing the second conductive material layer mask and the first body material.

As shown in FIG. 41, after the introduction of second conductive material layer 2170 over substrate 2110, first body material 2155 and second conductive material layer mask 2170 are planarized by way of, for example, a mechanical polish or a chemical-mechanical polish to form a leaf portion of an interconnection element on substrate 2110. In one aspect, planarization of first body material 2155a and second conductive material layer mask 2170 establish the final thickness of the leaf portion of the body (i.e., control the final thickness of first body material 2155s).

Figure 42:
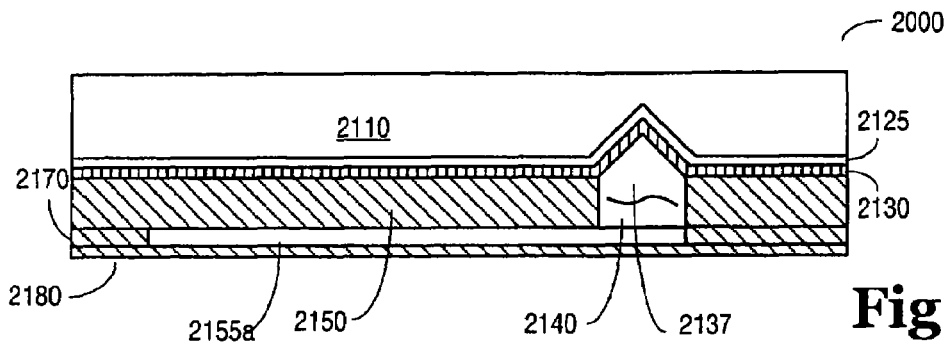
FIG. 42 shows the structure of FIG. 34 after introducing a third conductive material layer mask over the structure.

FIG. 42 shows structure 2000 after the introduction of third conductive material layer mask 2180. In one embodiment, third conductive material layer mask 2180 is similar to first conductive material layer mask 2150 and second conductive material layer mask 2170 and is, for example, electroplated copper. In this embodiment, third conductive material layer mask 2180 is introduced to a thickness on the order of 0.1 to 5 μm. Third conductive material layer mask 2180 defines, in one aspect, a gap or opening between adjacent leaf portions of the interconnection element body.

Figure 43:
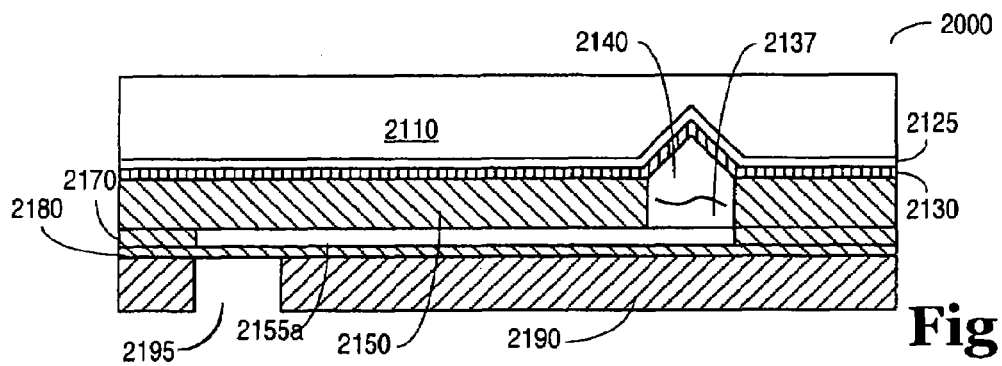
FIG. 43 shows the structure of FIG. 34 after patterning a third masking material layer over the structure.

FIG. 43 shows structure 2000 after the patterning of third masking material layer 2190 over the surface of substrate 2110 and to have an opening to third conductive material layer mask 2180 at a point desired to be utilized as a support area between adjacent leaf portion of the interconnect element. In FIG. 43, third masking material layer 2190 is patterned at opening 2195 to expose an area portion of third conductive material layer mask 2180 at a proximal end of the structure relative to leaf portion of material 2155a.

Figure 44:
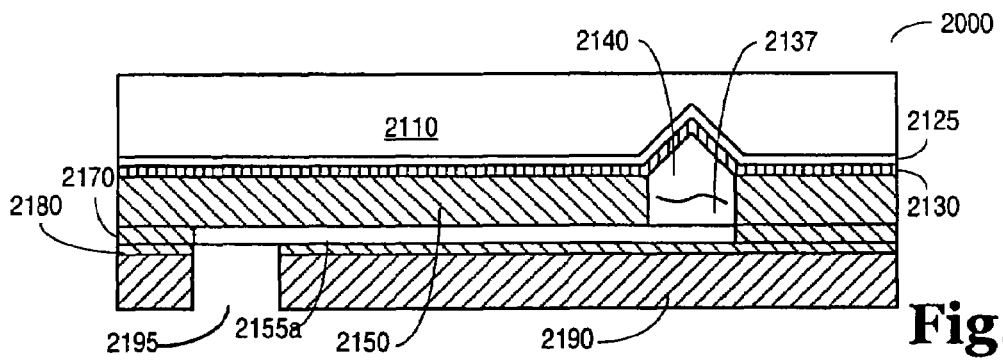
FIG. 44 shows the structure of FIG. 34 after exposing the first body material through the patterning of second masking material layer.

FIG. 44 shows structure 2000 after the removal of the exposed portion of third conductive material layer mask 2180. In the example where third conductive material layer mask 2180 is copper, a wet chemical etching procedure may be used to remove the exposed copper.

Figure 45:
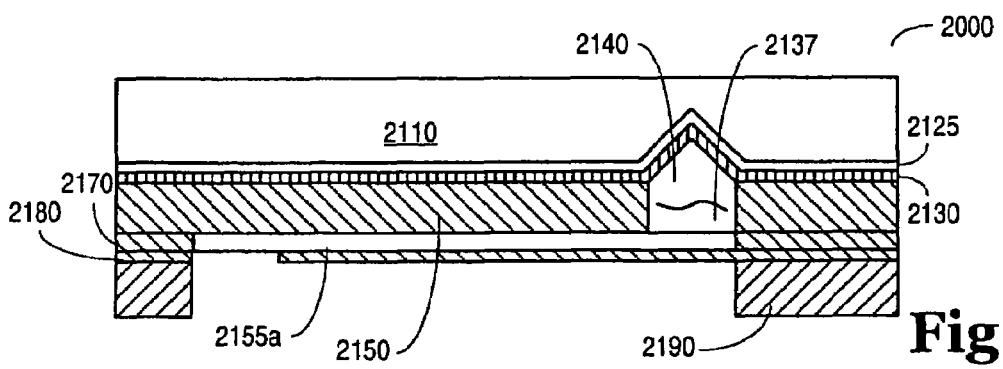
FIG. 45 shows the structure of FIG. 34 after patterning a second masking material layer to define an opening for a second body material.
Figure 46:
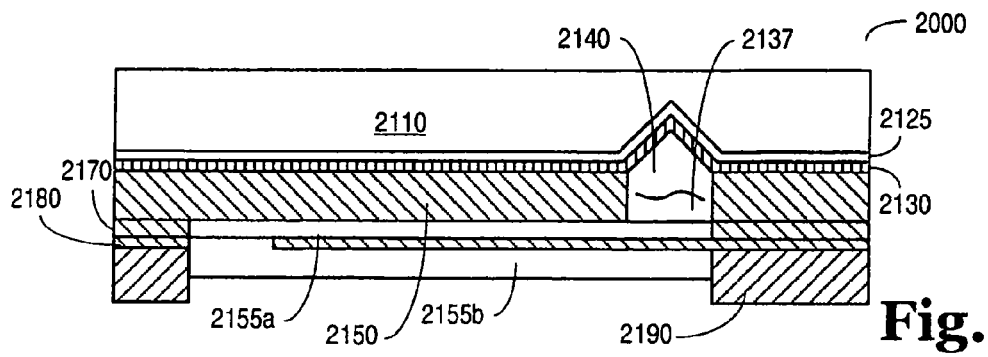
FIG. 46 shows the structure of FIG. 34 after introducing a second body material.

After the removal of the exposed portion of third conductive material layer mask 2180, FIG. 45 shows structure 2000 after patterning third masking material layer 2190 a second time to have an opening corresponding with an opening for a desired second leaf portion of the body of an interconnect element. FIG. 46 shows the structure introduction of second body portion material 2155b over the surface of substrate 2110 in the patterned opening of third masking material layer 2190. In one example, second body material 2155b is similar to first body material 2155a (e.g., Ni—Co) and is introduced by an electrolytic process. As illustrated in FIG. 46, the leaf portion formed by first body material 2155a and second body material 2155b are separated by third conductive material layer mask 2180 with the exception of a support portion.

Figure 47:
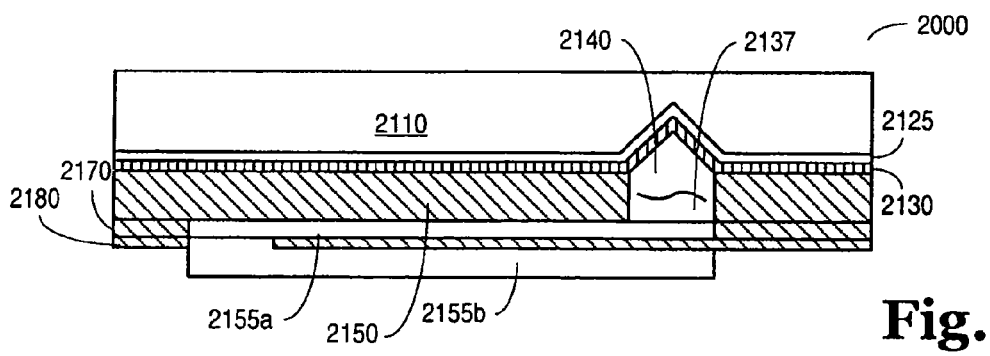
FIG. 47 shows the structure of FIG. 34 after removing the second masking material layer.

FIG. 47 shows structure 2000 after the removal of third masking material layer 2190. In the embodiment of third masking material layer 2190 is a photoresist, suitable removal methods are discussed above.

Figure 48:
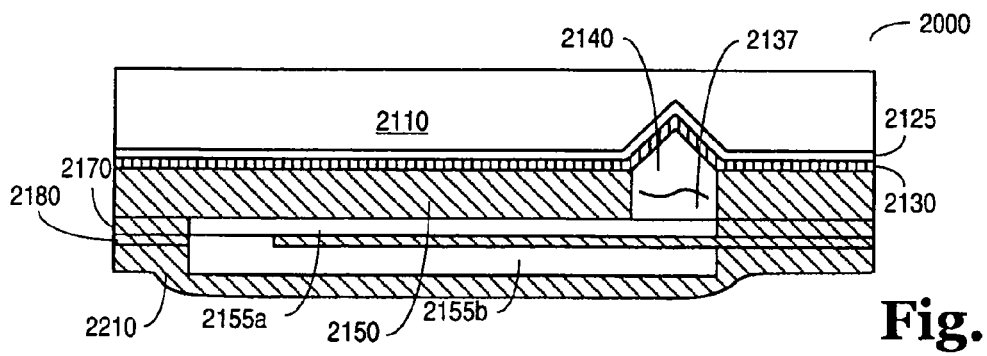
FIG. 48 shows the structure of FIG. 34 after introducing a fourth conductive material layer mask over the structure.

FIG. 48 shows structure 2000 after the introduction of fourth conductive material layer mask 2210. In one embodiment, fourth conductive material layer mask 2210 is similar to the previously introduced conductive material layer mask (e.g., copper) and is introduced by an electrolytic process.

Figure 49:
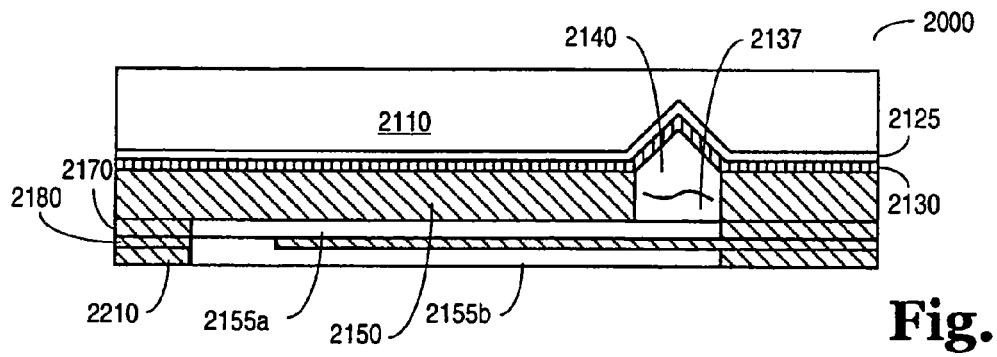
FIG. 49 shows the structure of FIG. 34 after planarizing the fourth conductive material layer mask and the second body material.

FIG. 49 shows structure 2000 after the planarization of fourth conductive material layer mask 2210 and second body material 2155b. The planarization step defines, in one aspect, the thickness of second body material 2155b.

Figure 50:
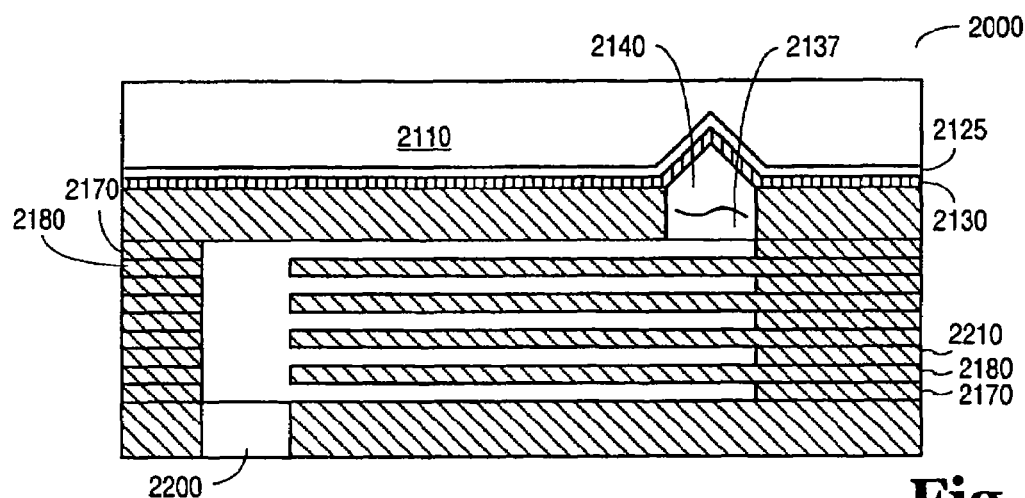
FIG. 50 shows the structure of FIG. 34 after forming a plurality of body material layers and a post structure.
Figure 51:
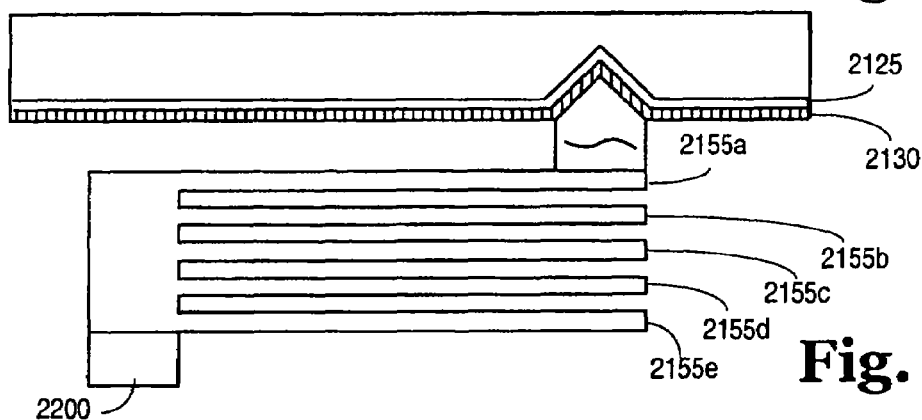
FIG. 51 shows the structure of FIG. 34 after removing a plurality of conductive material layer masks.
Figure 52:
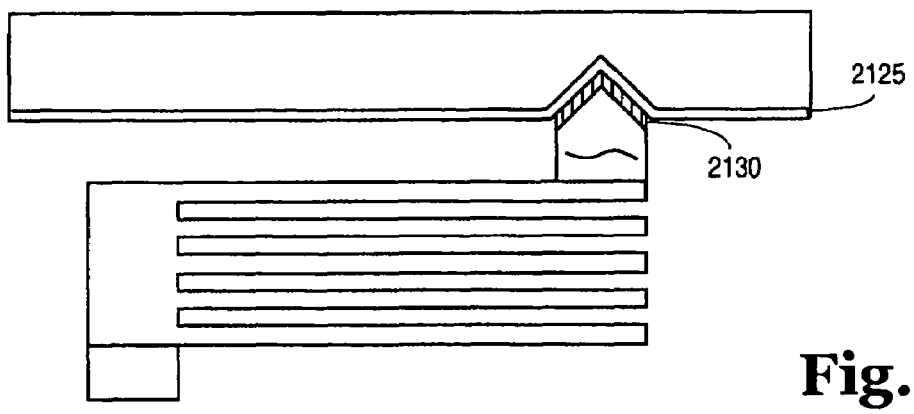
FIG. 52 shows the structure of FIG. 34 after removing a seed layer to expose an underlying release layer of the substrate.

FIG. 50 shows structure 2000 after the repetition of the above operations to form three additional leaf portions and post 2200 utilizing alternative operations of pattern mask, conductive material layer mask, and planarization. FIG. 51 shows structures to leave a free-standing interconnection element. In the embodiment where the various conductive layer mask are formed of copper, a wet chemical etch process, selected for copper may be utilized. FIG. 51 shows structure 2000 including interconnect element having a tip structure coupled to a body portion of five leaf portions of first body material 2155a, second body material 2155b, third body material 2155c, fourth body material 2155d, and fifth body material 2155e. Coupled at a proximal end of leaf portion defined by fifth body material 2155e, is post 2200. Following the removal of the conductive material layer masks, seed layer 2130 may be removed such as by an etching step as known in the art to expose release layer 2125. FIG. 52 shows the structure after the removal of the exposed release layer 2125. At this point, the free-standing interconnection element may be transferred to, for example, an electronic component similar to the transfer described with respect to FIG. 17e and the accompanying text.

In the above embodiment, an interconnection element is formed on a sacrificial substrate and then transferred to an electronic component. It is to be appreciated, that the techniques described in this embodiment of forming an interconnection element on a sacrificial substrate is again representative of one technique of forming the interconnection element of the invention. A second technique wherein the interconnection element is formed directly on an electronic component is also contemplated. Reference is made to patent application Ser. No. 09/205,022, filed Dec. 2, 1998, entitled "Lithographic Contact Elements," and patent application Ser. No. 09/205,023, filed Dec. 2, 1998, entitled "Lithographic Contact Elements," claimed by the assignee of the invention described herein which describe such a technique and are incorporated herein by reference.

Still another embodiment of fabricating the interconnection element of the invention may be accomplished utilizing a process described by Adam L. Cohen, in an article entitled "*3-D Micromachining by Electrochemical Fabrication*," in the publication "Micromachine Devices," Vol. 4, No. 3, March 1999 at pages 6-7. The article describes a selective electroplating process utilizing through-mask plating. Specifically, a conformable insulator is patterned directly on an anode and pressed against a substrate to establish the electroplating mask. After electroplating, the mask is separated from the substrate. In the instant invention, one use of the process described by the referenced article is to substitute the conformable insulated mask for the masking material layers and pattern the primary interconnection element components.

Various embodiments of the interconnection elements disclosed above are particularly suitable for making electrical connection with, for example, an electronic component having "fine-pitch" contact pads or terminals, for example, spacing of at least less than 5 mils (130 μm), such as 2.5 mils (65 μm). Applications to larger scale devices, including devices with contact pitches of about 50-100 mil (1.3-2.6 mm) and even larger are feasible as well.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An interconnection element comprising:
   a post coupled at a first end to a surface of a substrate, the post extending away from the substrate to a second end of the post;
   a beam structure comprising:
   a body coupled to the second end of the post, and
   a plurality of leaf portions extending from the body to distal ends of the leaf portions, each of the leaf portions being generally parallel to the surface of the substrate, there being a space between all adjacent leaf portions from the body to the distal ends of the adjacent leaf portions such that the distal ends of the adjacent leaf portions are separated by the space; and
   a contact tip coupled to a free end of the beam structure opposite the body of the beam structure.

2. The interconnection element of claim 1, wherein the beam structure is generally parallel with a surface of the substrate to which the first end of the post is coupled.

3. The interconnection element of claim 2, wherein the surface of the substrate comprises a terminal, and the first end of the post is coupled to the terminal.

4. The interconnection element of claim 2, wherein each of the leaf portions is generally parallel to the surface of the substrate.

5. The interconnection element of claim 1, wherein the distal end of each of the leaf portions is free to move toward the substrate.

6. The interconnection element of claim 5, wherein:
   a first leaf portion of the plurality of leaf portions comprises a first resilient element with a first contact region; and
   a second leaf portion of the plurality of leaf portions comprises a second resilient element with a second contact region, wherein upon sufficient displacement of the first contact region toward the second resilient element in response to a force applied to the contact tip, the first contact region contacts the second contact region,
   wherein the interconnection element is of a size suitable for connecting the substrate to an electronic device.

7. The interconnection element of claim 5, wherein:
   the leaf portions are disposed in a stack, and
   the contact tip is disposed adjacent the distal end of a top leaf portion in the stack.

8. The interconnection element of claim 7, wherein, in response to a force applied to the contact tip, the distal end of each of the leaf portions except a bottom leaf portion in the stack is movable toward the substrate to physically contact an adjacent one of the leaf portions.

9. The interconnection element of claim 7, wherein in response to a force applied to the contact tip, the distal end of each of the leaf portions in the stack except a bottom leaf portion in the stack is movable toward the substrate to physically contact an immediately-below leaf portion in the stack.

10. The interconnection element of claim 7, wherein for each leaf portion in the stack except the top leaf portion, a thickness of the leaf portion in a direction perpendicular to the stack is less than a thickness of an immediately-above leaf portion in the stack.

11. The interconnection element of claim 7, wherein for each leaf portion in the stack except the top leaf portion, a length of the leaf portion from the body to the distal end of the leaf portion is less than a length of an immediately-above leaf portion in the stack.

12. The interconnection element of claim 11, wherein for each leaf portion in the stack except the top leaf portion, a thickness of the leaf portion is less than a thickness of an immediately-above leaf portion in the stack.

13. The interconnection element of claim 1, wherein each of the leaf portions comprises a cantilevered beam extending from the body to the distal end of the beam.

14. The interconnection element of claim 13, wherein each of the distal ends of the leaf portions is independently free to move toward and away from the substrate.

15. The interconnection element of claim 13, wherein the cantilevered beams are generally parallel one with another.

16. The interconnection element of claim 13, wherein each of the cantilevered beams has a different thickness in a direction that is generally parallel to a length of the post from the first end to the second end of the post.

17. The interconnection element of claim 13, wherein each of the cantilevered beams is a different length from the body to the distal end of the leaf portion.

18. The interconnection element of claim 17, wherein each of the cantilevered beams has a different thickness in a direction that is generally parallel to a length of the post from the first end to the second end of the post.

* * * * *